US 11,836,565 B2

(12) United States Patent
Lotya et al.

(10) Patent No.: US 11,836,565 B2
(45) Date of Patent: *Dec. 5, 2023

(54) SMARTCARDS WITH MULTIPLE COUPLING FRAMES

(71) Applicant: AmaTech Group Limited, Spiddal (IE)

(72) Inventors: Mustafa Lotya, Celbridge (IE); David Finn, Tourmakeady (IE); Darren Molloy, Headford (IE)

(73) Assignee: AmaTech Group Limited, Spiddal (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/579,124

(22) Filed: Jan. 19, 2022

(65) Prior Publication Data

US 2022/0138522 A1 May 5, 2022

Related U.S. Application Data

(63) Continuation of application No. 17/006,795, filed on Aug. 29, 2020, now Pat. No. 11,354,560, which is a
(Continued)

(51) Int. Cl.
*G06K 19/06* (2006.01)
*G06K 19/077* (2006.01)
(Continued)

(52) U.S. Cl.
CPC . *G06K 19/07794* (2013.01); *G06K 19/07769* (2013.01); *G06K 19/07783* (2013.01);
(Continued)

(58) Field of Classification Search
CPC ............ G06K 19/02; G06K 19/06196; G06K 19/07743; G06K 19/07749;
(Continued)

(56) References Cited

U.S. PATENT DOCUMENTS 5,084,699 A 1/1992 DeMichele
D341,092 S 11/1993 Wild
(Continued)

FOREIGN PATENT DOCUMENTS

DE 19632115 12/1997
EP 0782214 7/1997
(Continued)

OTHER PUBLICATIONS

European Patent Office, Extended European Search Report, Application No. EP20188351.9 dated Oct. 9, 2020 (8 pages).
(Continued)

*Primary Examiner* — Thien M Le
(74) *Attorney, Agent, or Firm* — McAndrews, Held & Malloy, Ltd.

(57) ABSTRACT

RFID devices comprising (i) a transponder chip module (TCM) having an RFIC chip (IC) and a module antenna (MA), and (ii) a coupling frame (CF) having an electrical discontinuity comprising a slit (S) or non-conductive stripe (NCS). The coupling frame may be disposed closely adjacent the transponder chip module so that the slit overlaps the module antenna. The RFID device may be a payment object such as a jewelry item having a metal component modified with a slit (S) to function as a coupling frame. The coupling frame may be moved (such as rotated) to position the slit to selectively overlap the module antennas (MA) of one or more transponder chip modules (TCM-1, TCM-2) disposed in the payment object, thereby selectively enhancing (including enabling) contactless communication between a given transponder chip module in the payment object and another RFID device such as an external contactless reader. The coupling frame may be tubular. A card body construction for a metal smart card is disclosed.

20 Claims, 38 Drawing Sheets

Related U.S. Application Data continuation-in-part of application No. 16/826,322, filed on Mar. 23, 2020, now Pat. No. 11,037,044, which is a continuation of application No. 16/199,271, filed on Nov. 26, 2018, now Pat. No. 10,599,972, which is a continuation-in-part of application No. 15/969,816, filed on May 3, 2018, now Pat. No. 10,518,518, which is a continuation-in-part of application No. 15/939,281, filed on Mar. 29, 2018, now Pat. No. 10,733,494, said application No. 16/199,271 is a continuation-in-part of application No. 15/939,282, filed on Mar. 29, 2018, now Pat. No. 10,552,722, and a continuation-in-part of application No. 15/818,785, filed on Nov. 21, 2017, now abandoned, and a continuation-in-part of application No. 15/662,305, filed on Jul. 28, 2017, now Pat. No. 10,193,211, said application No. 15/939,282 is a continuation-in-part of application No. 15/358,138, filed on Nov. 22, 2016, now Pat. No. 9,960,476, said application No. 15/939,281 is a continuation-in-part of application No. 15/358,138, filed on Nov. 22, 2016, now Pat. No. 9,960,476, which is a continuation-in-part of application No. 15/197,795, filed on Jun. 30, 2016, now Pat. No. 9,812,782, said application No. 15/662,305 is a continuation-in-part of application No. 15/072,356, filed on Mar. 17, 2016, now Pat. No. 9,836,684, said application No. 15/358,138 is a continuation-in-part of application No. 15/072,356, filed on Mar. 17, 2016, now Pat. No. 9,836,684, which is a continuation-in-part of application No. 14/862,119, filed on Sep. 22, 2015, now Pat. No. 9,697,459, and a continuation-in-part of application No. 14/619,177, filed on Feb. 11, 2015, now abandoned, and a continuation-in-part of application No. 14/551,376, filed on Nov. 24, 2014, now Pat. No. 9,390,364, said application No. 15/197,795 is a continuation-in-part of application No. 14/551,376, filed on Nov. 24, 2014, now Pat. No. 9,390,364, said application No. 15/072,356 is a continuation-in-part of application No. 14/492,113, filed on Sep. 22, 2014, now Pat. No. 9,798,968, and a continuation-in-part of application No. 14/465,815, filed on Aug. 21, 2014, now Pat. No. 9,475,086, said application No. 14/492,113 is a continuation-in-part of application No. 14/465,815, filed on Aug. 21, 2014, now Pat. No. 9,475,086, which is a continuation-in-part of application No. 14/281,876, filed on May 19, 2014, now Pat. No. 9,272,370, said application No. 14/492,113 is a continuation-in-part of application No. 14/173,815, filed on Feb. 6, 2014, now Pat. No. 9,195,932, which is a continuation of application No. 14/020,884, filed on Sep. 8, 2013, now Pat. No. 9,033,250, said application No. 14/492,113 is a continuation-in-part of application No. 13/744,686, filed on Jan. 18, 2013, now abandoned, said application No. 14/465,815 is a continuation-in-part of application No. 13/744,686, filed on Jan. 18, 2013, now abandoned.

(60) Provisional application No. 62/478,589, filed on Mar. 29, 2017, provisional application No. 62/371,768, filed on Aug. 7, 2016, provisional application No. 62/300,906, filed on Feb. 28, 2016, provisional application No. 62/289,189, filed on Jan. 30, 2016, provisional application No. 62/281,209, filed on Jan. 21, 2016, provisional application No. 62/258,531, filed on Nov. 22, 2015, provisional application No. 62/204,466, filed on Aug. 13, 2015, provisional application No. 62/201,578, filed on Aug. 6, 2015, provisional application No. 62/175,308, filed on Jun. 14, 2015, provisional application No. 62/163,962, filed on May 19, 2015, provisional application No. 62/150,307, filed on Apr. 21, 2015, provisional application No. 62/136,644, filed on Mar. 23, 2015, provisional application No. 62/102,103, filed on Jan. 12, 2015, provisional application No. 62/088,598, filed on Dec. 7, 2014, provisional application No. 62/080,332, filed on Nov. 16, 2014, provisional application No. 62/061,689, filed on Oct. 8, 2014, provisional application No. 62/044,394, filed on Sep. 1, 2014, provisional application No. 62/039,562, filed on Aug. 20, 2014, provisional application No. 62/035,430, filed on Aug. 10, 2014, provisional application No. 61/978,187, filed on Apr. 10, 2014, provisional application No. 61/971,636, filed on Mar. 28, 2014, provisional application No. 61/955,325, filed on Mar. 19, 2014.

(51) Int. Cl.
  *H01Q 1/22* (2006.01)
  *H01Q 21/29* (2006.01)
  *H01Q 7/00* (2006.01)
  *H05K 1/16* (2006.01)
  *H01F 27/28* (2006.01)
  *H05K 3/10* (2006.01)
  *H01F 38/14* (2006.01)

(52) U.S. Cl.
  CPC ......... *H01Q 1/2216* (2013.01); *H01Q 1/2225* (2013.01); *H01Q 1/2283* (2013.01); *H01Q 7/00* (2013.01); *H01Q 21/29* (2013.01); *H05K 1/165* (2013.01); *H01F 27/2804* (2013.01); *H01F 38/14* (2013.01); *H05K 3/103* (2013.01); *H05K 2201/10098* (2013.01); *Y10T 29/49018* (2015.01); *Y10T 29/49162* (2015.01)

(58) Field of Classification Search
  CPC ......... G06K 19/0775; G06K 19/07754; G06K 19/07769; G06K 19/07773; G06K 19/07783
  See application file for complete search history.

(56) References Cited

U.S. PATENT DOCUMENTS

| | | |
|---|---|---|
| 5,281,855 A | 1/1994 | Hadden |
| 5,581,065 A | 12/1996 | Nishikawa |
| D378,064 S | 2/1997 | Wild |
| D404,319 S | 1/1999 | Deleskiewicz |
| 5,955,723 A | 9/1999 | Reiner |
| 5,982,624 A | 11/1999 | Onoda |
| 6,018,299 A | 1/2000 | Eberhardt |
| D423,374 S | 4/2000 | Deleskiewicz |
| 6,107,920 A | 8/2000 | Eberhardt |
| 6,147,605 A | 11/2000 | Vega |
| 6,164,551 A | 12/2000 | Altwasser |
| 6,233,818 B1 | 5/2001 | Finn |
| 6,265,977 B1 | 7/2001 | Vega |
| 6,369,334 B1 | 4/2002 | Lauffer |
| 6,378,774 B1 | 4/2002 | Emori |
| 6,452,563 B1 | 9/2002 | Porte |
| 6,491,782 B1 | 12/2002 | Jaynes |
| 6,581,839 B1 | 6/2003 | Lasch |
| 6,611,199 B1 | 8/2003 | Geiszler |
| 6,634,564 B2 | 10/2003 | Kuramochi |
| 6,698,089 B2 | 3/2004 | Finn |
| 6,749,123 B2 | 6/2004 | Lasch |

(56) References Cited

U.S. PATENT DOCUMENTS

| | | |
|---|---|---|
| 6,764,014 B2 | 7/2004 | Lasch |
| 6,986,465 B2 | 1/2006 | Kiekhaefer |
| 7,183,987 B2 | 2/2007 | Akiho |
| 7,306,158 B2 | 12/2007 | Berardi |
| 7,377,443 B2 | 5/2008 | Lasch |
| 7,440,771 B2 | 10/2008 | Purk |
| 7,494,057 B2 | 2/2009 | Lasch |
| 7,530,491 B2 | 5/2009 | Lasch |
| 7,544,266 B2 | 6/2009 | Herring |
| 7,588,184 B2 | 9/2009 | Gandel |
| 7,607,583 B2 | 10/2009 | Berardi |
| 7,701,350 B2 | 4/2010 | Sakama |
| 7,721,956 B2 | 5/2010 | Williams |
| 7,757,957 B2 | 7/2010 | Cranston |
| 7,819,310 B2 | 10/2010 | Lasch |
| 7,823,777 B2 | 11/2010 | Varga |
| 7,837,116 B2 | 11/2010 | Morrill Webb |
| 7,934,646 B2 | 5/2011 | Yang |
| 8,033,457 B2 | 10/2011 | Varga |
| 8,066,190 B2 | 11/2011 | Faenza, Jr. |
| 8,079,514 B2 | 12/2011 | Lasch |
| 8,100,337 B2 | 1/2012 | Artigue |
| 8,130,166 B2 | 3/2012 | Ayala |
| 8,141,787 B2 | 3/2012 | Savry |
| 8,186,582 B2 | 5/2012 | Varga |
| 8,186,598 B2 | 5/2012 | Faenza, Jr. |
| 8,191,788 B2 | 6/2012 | Morrill-Webb |
| 8,261,997 B2 | 9/2012 | Gebhart |
| 8,360,312 B2 | 1/2013 | Varga |
| 8,366,009 B2 | 2/2013 | Finn |
| 8,378,911 B2 | 2/2013 | Eray |
| 8,393,547 B2 | 3/2013 | Kiekhaefer |
| 8,474,726 B2 | 7/2013 | Finn |
| 8,523,062 B2 | 9/2013 | Varga |
| D693,264 S | 11/2013 | Rabassa |
| 8,608,080 B2 | 12/2013 | Finn |
| 8,608,082 B2 | 12/2013 | Le Garrec |
| 8,672,232 B2 | 3/2014 | Herslow |
| 8,789,762 B2 | 7/2014 | Finn |
| 8,905,316 B2 * | 12/2014 | Dokai ............... G06K 19/07749 235/492 |
| 8,991,712 B2 | 3/2015 | Finn |
| 9,000,619 B2 | 4/2015 | Kato |
| D729,074 S | 5/2015 | Boulangeot |
| 8,976,075 B2 | 5/2015 | Kato |
| 9,033,250 B2 | 5/2015 | Finn |
| 9,112,272 B2 | 8/2015 | Finn |
| 9,165,240 B2 | 10/2015 | Finn |
| 9,195,932 B2 | 11/2015 | Finn |
| 9,203,157 B2 | 12/2015 | Kato |
| 9,272,370 B2 | 3/2016 | Finn |
| 9,390,364 B2 | 7/2016 | Finn |
| 9,449,269 B2 | 9/2016 | Finn |
| 9,475,086 B2 | 10/2016 | Finn |
| 9,489,613 B2 | 11/2016 | Finn |
| 9,564,678 B2 | 2/2017 | Kato |
| 9,622,359 B2 | 4/2017 | Finn |
| 9,633,304 B2 | 4/2017 | Finn |
| 9,634,391 B2 | 4/2017 | Finn |
| 9,697,459 B2 | 7/2017 | Finn |
| 9,721,200 B2 | 8/2017 | Herslow |
| 9,760,816 B1 | 9/2017 | Williams |
| 9,798,968 B2 | 10/2017 | Finn |
| 9,812,782 B2 | 11/2017 | Finn |
| 9,836,684 B2 | 12/2017 | Finn |
| 9,852,369 B2 | 12/2017 | Ali |
| 9,960,476 B2 | 5/2018 | Finn |
| 10,147,999 B2 | 12/2018 | Wang |
| 2003/0057288 A1 | 3/2003 | Salzgeber |
| 2005/0194453 A1 | 9/2005 | Conner |
| 2006/0192674 A1 | 8/2006 | Roberta |
| 2006/0243811 A1 | 11/2006 | Koyama |
| 2007/0164414 A1 | 7/2007 | Dokai |
| 2009/0152362 A1 | 6/2009 | Ayala |
| 2009/0159657 A1 | 6/2009 | Chen |
| 2009/0169776 A1 | 7/2009 | Herslow |
| 2009/0315320 A1 | 12/2009 | Finn |
| 2010/0078329 A1 | 4/2010 | Mirsky |
| 2010/0176205 A1 | 7/2010 | Patrice |
| 2011/0023289 A1 | 2/2011 | Finn |
| 2011/0090058 A1 | 4/2011 | Ikemoto |
| 2011/0163167 A1 | 7/2011 | Artigue |
| 2011/0181486 A1 | 7/2011 | Kato |
| 2011/0186641 A1 | 8/2011 | Kato |
| 2011/0189620 A1 | 8/2011 | Herslow |
| 2012/0018522 A1 | 1/2012 | Le Garrec |
| 2012/0038445 A1 | 2/2012 | Finn |
| 2012/0074233 A1 | 5/2012 | Finn |
| 2012/0112971 A1 | 5/2012 | Takiyama |
| 2013/0126622 A1 | 5/2013 | Finn |
| 2013/0146670 A1 | 6/2013 | Grieshofer |
| 2013/0146671 A1 | 6/2013 | Grieshofer |
| 2013/0168454 A1 | 7/2013 | Oh |
| 2013/0271265 A1 | 10/2013 | Finn |
| 2013/0307746 A1 * | 11/2013 | Nakano ............... G06K 7/10178 343/866 |
| 2013/0320095 A1 | 12/2013 | Blum |
| 2013/0332353 A1 | 12/2013 | Aidasani |
| 2014/0014732 A1 | 1/2014 | Finn |
| 2014/0021261 A1 | 1/2014 | Mosteller |
| 2014/0070009 A1 | 3/2014 | Zambrano |
| 2014/0091149 A1 | 4/2014 | Finn |
| 2014/0102136 A1 | 4/2014 | Warren |
| 2014/0104133 A1 | 4/2014 | Finn |
| 2014/0138443 A1 | 5/2014 | Blum |
| 2014/0144993 A1 | 5/2014 | Seo |
| 2014/0152511 A1 | 6/2014 | Merlin |
| 2014/0166762 A1 | 6/2014 | Herslow |
| 2014/0198006 A1 * | 7/2014 | Nakano .................... H01Q 7/06 343/788 |
| 2014/0203981 A1 * | 7/2014 | Nakano ............ G06K 19/07794 343/749 |
| 2014/0260424 A1 | 9/2014 | Warren |
| 2014/0263655 A1 | 9/2014 | Forster |
| 2014/0284386 A1 | 9/2014 | Finn |
| 2014/0292477 A1 | 10/2014 | Ahmadloo |
| 2014/0334087 A1 * | 11/2014 | Nakano .................... H01Q 7/00 361/679.26 |
| 2014/0361086 A1 | 12/2014 | Finn |
| 2015/0021402 A1 | 1/2015 | Finn |
| 2015/0021403 A1 | 1/2015 | Finn |
| 2015/0076922 A1 * | 3/2015 | Kato ....................... H02J 50/90 307/104 |
| 2015/0129665 A1 | 5/2015 | Finn |
| 2015/0136858 A1 | 5/2015 | Finn |
| 2015/0180229 A1 | 5/2015 | Herslow |
| 2015/0235122 A1 | 8/2015 | Finn |
| 2015/0269471 A1 * | 9/2015 | Finn ................... B23K 26/0622 29/601 |
| 2015/0269472 A1 * | 9/2015 | Finn ........................ H01Q 7/00 343/870 |
| 2015/0269474 A1 | 9/2015 | Finn |
| 2015/0278675 A1 * | 10/2015 | Finn ................. G06K 19/07783 29/601 |
| 2016/0269477 A1 | 9/2016 | L'Heureux et al. |
| 2016/0365644 A1 | 12/2016 | Finn |
| 2017/0017871 A1 | 1/2017 | Finn |
| 2017/0077589 A1 | 3/2017 | Finn |
| 2018/0123221 A1 | 5/2018 | Finn |
| 2018/0339503 A1 | 11/2018 | Finn |
| 2018/0341846 A1 | 11/2018 | Finn |
| 2018/0341847 A1 | 11/2018 | Finn |
| 2019/0236434 A1 | 8/2019 | Lowe |
| 2019/0384261 A1 | 12/2019 | Nam |

FOREIGN PATENT DOCUMENTS

| | | |
|---|---|---|
| EP | 1031939 | 8/2000 |
| EP | 1158601 | 11/2001 |
| EP | 0952452 | 10/2003 |
| EP | 0919950 | 4/2007 |
| EP | 2063489 | 5/2009 |
| EP | 2264645 | 12/2010 |

(56) References Cited

FOREIGN PATENT DOCUMENTS

| | | |
|---|---|---|
| EP | 1854222 | 6/2012 |
| EP | 2525304 | 11/2012 |
| EP | 2541471 | 2/2013 |
| EP | 2372840 | 9/2013 |
| FR | 2765010 | 6/1997 |
| JP | 11025244 | 1/1999 |
| JP | 11238103 | 11/2002 |
| JP | 2002344225 | 11/2002 |
| JP | 2005204038 | 7/2005 |
| WO | 1997026621 | 7/1997 |
| WO | 2008081224 | 7/2008 |
| WO | 2013034426 | 3/2013 |
| WO | 2013110625 | 8/2013 |
| WO | 2014016332 | 1/2014 |
| WO | 2014113765 | 7/2014 |
| WO | 2017090891 | 6/2017 |
| WO | 2017198842 | 11/2017 |
| WO | 2017007468 | 12/2017 |

OTHER PUBLICATIONS

Ackland et al, Use of Slits of Defined Width in Metal Layers Within ID-1 Cards, as Reactive Couplers for Nearfield Passive RFID at 13.56 MHz; Ackland, Lotya, Finn, and Stamenov; 2016 IEEE International Conference on RFID (RFID); 978-1-4673-8807-8/16/ $31.00, 2016 IEEE (4 pages).

* cited by examiner

Dual Interface (DI) Smart Card, and Readers

TCM with secondary coupling frame (SCF)

Hybrid Metal Credit Card

Hybrid Metal Credit Card overlapping ends

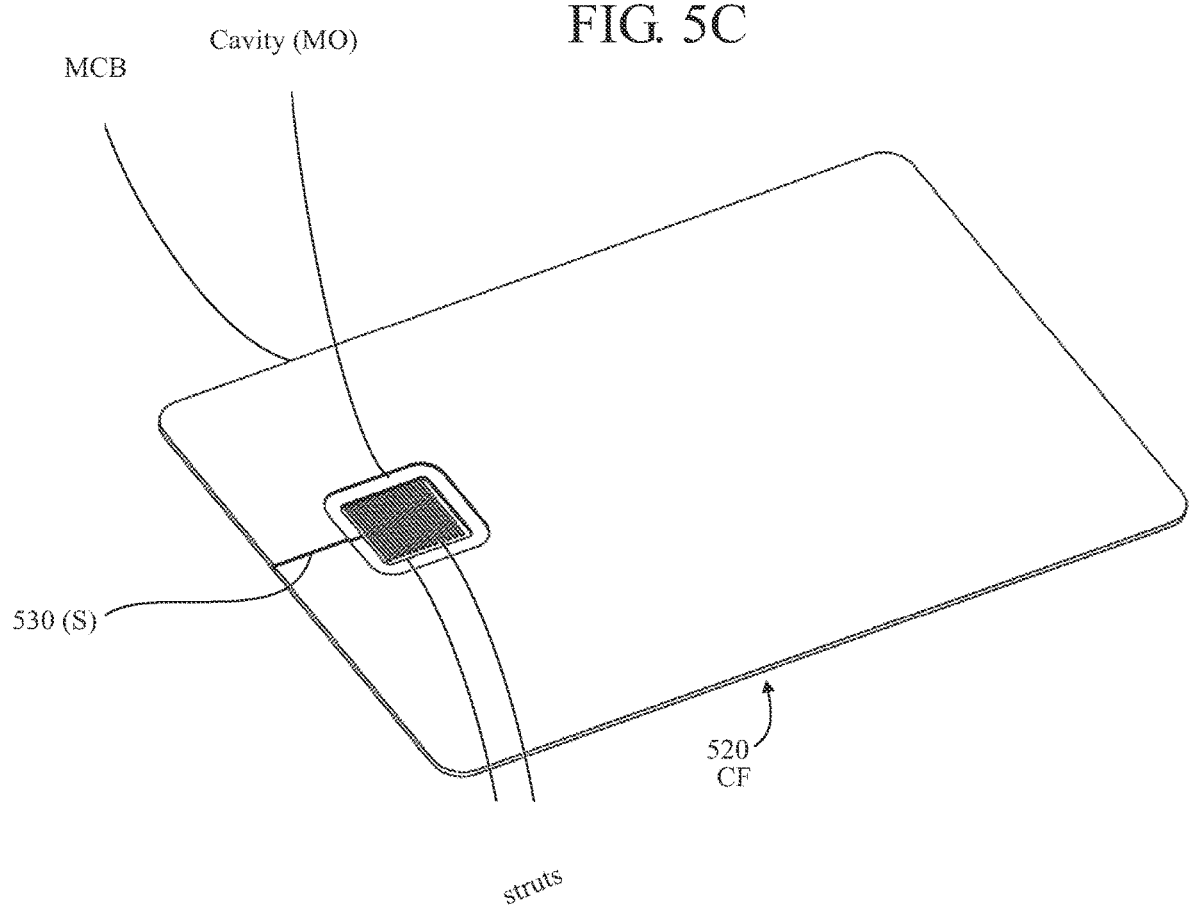

Stacked Coupling Frames card body construction normal watch case

Rear Case with CF watch case Layer-1 watch case Layer-2 concealed slits

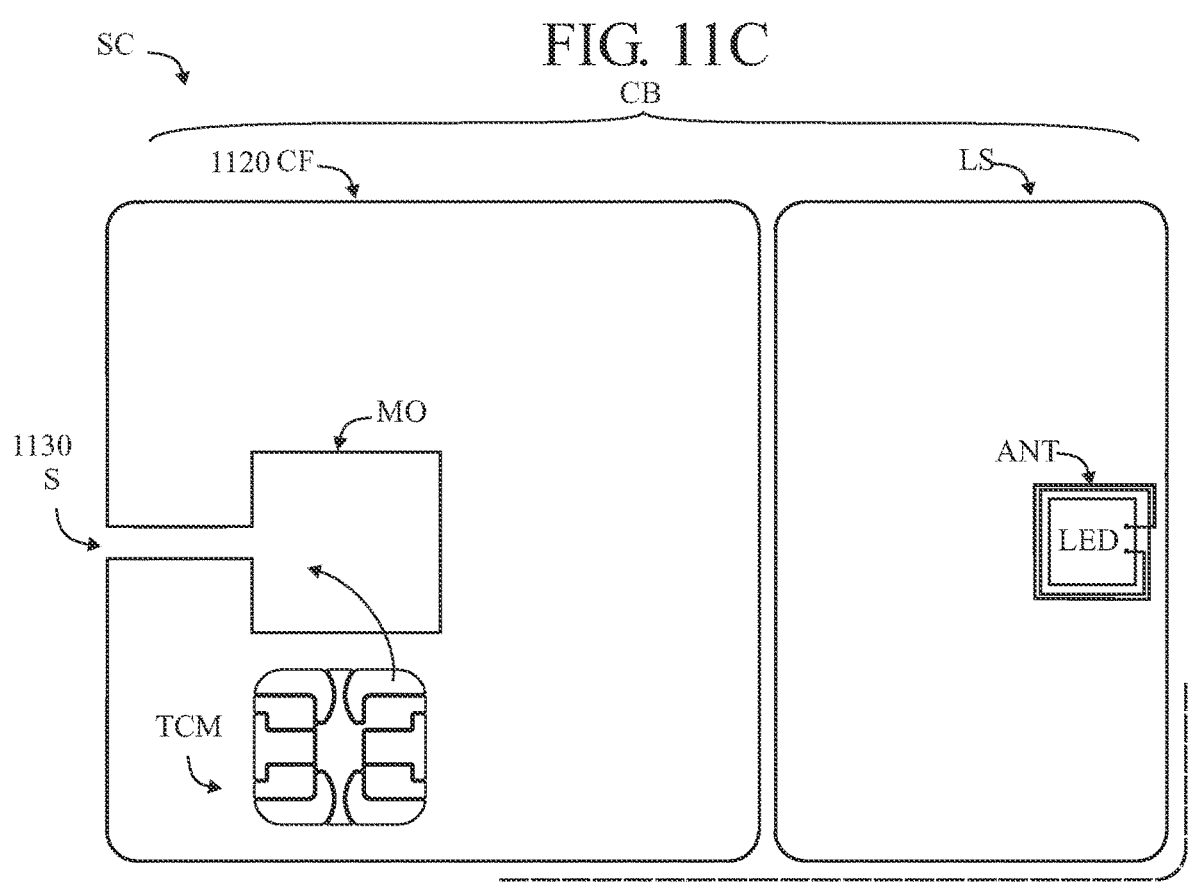

Transponder Chip Module
with elongated form factor

Transponder Chip Module
with elongated form factor cuff with inner and outer portions
modified to act as coupling frames Payment Object in the form of a charm with T-shaped slit exploded view of a CF disposed over a TCM
with slit S overlapping module antenna MA plan view of a CF disposed over a TCM
aligned to enhance communication plan view of a CF disposed over a TCM
with CF displaced to block communication plan view of a CF disposed over a TCM
aligned to enhance communication plan view of a CF disposed over a TCM
with CF flipped over to block communication Elongated form factor for module antenna and CF tubular coupling frame
TCM disposed within CF one CF, one TCM, enabled one CF, one TCM, disabled Payment Object with selection feature Payment Object with selection feature one CF, two TCM's
TCM-1 enabled, TCM-2 disabled one CF, two TCM's
TCM-1 disabled, TCM-2 enabled Antenna having outer turns / principal windings (PW) of one sense, and inner turns (IT) / counter-windings (CWG) of an opposite sense.

SMARTCARDS WITH MULTIPLE COUPLING FRAMES

CROSS REFERENCE TO RELATED APPLICATIONS

This application claims priority and is a continuation of Ser. No. 17/006,795 filed 29 Aug. 2020; Ser. No. 17/006,795 is a continuation-in-part of Ser. No. 16/826,322 filed 23 Mar. 2020; Ser. No. 16/826,322 is a continuation of Ser. No. 16/199,271 filed 26 Nov. 2018; Ser. No. 16/199,271 is a continuation-in-part of U.S. Pat. No. 15,969,816 filed 3 May 2018; Ser. No. 15/969,816 is a continuation-in-part of Ser. No. 15/939,281 filed 29 Mar. 2018; Ser. No. 15/939,281 is a continuation-in-part of Ser. No. 15/358,138 filed 22 Nov. 2016; Ser. No. 15/358,138 is a continuation-in-part of Ser. No. 15/072,356 filed 17 Mar. 2016; Ser. No. 16/199,271 is a continuation-in-part of Ser. No. 15/939,282 filed 29 Mar. 2018; Ser. No. 15/939,282 is a non-provisional of 62/478,589 filed 29 Mar. 2017; Ser. No. 15/939,282 is a continuation-in-part of Ser. No. 15/358,138 filed 22 Nov. 2016; Ser. No. 15/358,138 is a nonprovisional of 62/371,768 filed 7 Aug. 2016; Ser. No. 15/358,138 is a continuation-in part of Ser. No. 15/197,795 filed 30 Jun. 2016; Ser. No. 15/197,795 is a continuation-in part of Ser. No. 14/551,376 filed 24 Nov. 2014; Ser. No. 15/358,138 is a continuation-in-part of Ser. No. 15/072,356 filed 17 Mar. 2016; Ser. No. 15/358,138 is a nonprovisional of 62/258,531 filed 22 Nov. 2015; Ser. No. 16/199,271 is a continuation-in part of Ser. No. 15/818,785 filed 21 Nov. 2017; Ser. No. 16/199,271 is a continuation-in-part of Ser. No. 15/662,305 filed 28 Jul. 2017; Ser. No. 15/662,305 is a continuation-in-part of Ser. No. 15/072,356 filed 17 Mar. 2016; Ser. No. 16/199,271 is a continuation-in-part of Ser. No. 15/969,816 filed 3 May 2018; Ser. No. 15/969,816 is a continuation-in-part of Ser. No. 15/939,281 filed 29 Mar. 2018; Ser. No. 15/939,281 is continuation-in-part of Ser. No. 15/358,138 filed 22 Nov. 2016; Ser. No. 15/358,138 is a continuation-in-part of Ser. No. 15/072,356 filed 17 Mar. 2016; Ser. No. 15/072,356 is a nonprovisional of U.S. 62/300,906 filed 28 Feb. 2016; Ser. No. 15/072,356 is a nonprovisional of U.S. 62/289,189 filed 30 Jan. 2016; Ser. No. 15/072,356 is a nonprovisional of U.S. 62/281,209 filed 21 Jan. 2016; Ser. No. 15/072,356 is a continuation-in-part of Ser. No. 14/862,119 filed 22 Sep. 2015; Ser. No. 14/862,119 is a nonprovisional of 62/204,466 filed 13 Aug. 2015; Ser. No. 14/862,119 is a nonprovisional of 62/201,578 filed 6 Aug. 2015; Ser. No. 14/862,119 is a nonprovisional of 62/175,308 filed 14 Jun. 2015; Ser. No. 14/862,119 is a nonprovisional of 62/163,962 filed 19 May 2015; Ser. No. 14/862,119 is a nonprovisional of 62/150,307 filed 21 Apr. 2015; Ser. No. 14/862,119 is a nonprovisional of 62/136,644 filed 23 Mar. 2015; Ser. No. 15/072,356 is a continuation-in-part of Ser. No. 14/619,177 filed 11 Feb. 2015; Ser. No. 14/619,177 is a nonprovisional of 62/102,103 filed 12 Jan. 2015; Ser. No. 14/619,177 is a nonprovisional of 62/088,598 filed 7 Dec. 2014; Ser. No. 15/072,356 is a continuation-in-part of Ser. No. 14/551,376 filed 24 Nov. 2014; Ser. No. 14/551,376 is a nonprovisional of 62/080,332 filed 16 Nov. 2014; Ser. No. 14/551,376 is a nonprovisional of 62/061,689 filed 8 Oct. 2014; Ser. No. 14/551,376 is a nonprovisional of 62/044,394 filed 1 Sep. 2014; Ser. No. 15/072,356 is a continuation-in-part of Ser. No. 14/492,113 filed 22 Sep. 2014; Ser. No. 14/492,113 is a continuation-in-part of Ser. No. 14/465,815 filed 21 Aug. 2014; Ser. No. 14/492,113 is a continuation-in-part of Ser. No. 14/173,815 filed 6 Feb. 2014; Ser. No. 14/492,113 is a continuation-in-part of Ser. No. 13/744,686 filed 18 Jan. 2013; Ser. No. 15/072,356 is a continuation-in-part of Ser. No. 14/465,815 filed 21 Aug. 2014; Ser. No. 14/465,815 is a nonprovisional of 62/039,562 filed 20 Aug. 2014; Ser. No. 14/465,815 is a nonprovisional of 62/035,430 filed 10 Aug. 2014; Ser. No. 14/465,815 is a nonprovisional of 61/978,187 filed 10 Apr. 2014; Ser. No. 14/465,815 is a nonprovisional of 61/971,636 filed 28 Mar. 2014; Ser. No. 14/465,815 is a nonprovisional of 61/955,325 filed 19 Mar. 2014; Ser. No. 14/465,815 is a continuation-in-part of Ser. No. 14/281,876 filed 19 May 2014; Ser. No. 14/465,815 is a continuation-in-part of Ser. No. 14/173,815 filed 6 Feb. 2014; Ser. No. 14/173,815 a continuation of Ser. No. 14/020,884 filed 8 Sep. 2013; Ser. No. 14/465,815 is a continuation-in-part of Ser. No. 13/744,686 filed 18 Jan. 2013.

TECHNICAL FIELD

The disclosure relates broadly to RFID devices including "secure documents" or "smartcards" or "payment objects" (or "payment devices") such as electronic passports, electronic ID cards, bank cards, RFID enabled SIM cards (or payment cards, electronic tickets, chip cards and the like) and wearable devices (activity tracking bands, watches, smart jewelry, bangles, cuffs, bracelets, talisman charms, lockets and the like) having RFID (radio frequency identification) chips or chip modules (CM) capable of operating in a "contactless" mode (ISO 14443 or NFC/ISO 15693), including dual interface (DI) smartcards and secure documents (or payment objects) which can also operate in "contact" mode (ISO 7816-2) and, more particularly, to antenna modules (AM), transponder chip modules (TCMs), Coupling Frames (CFs), or Transponder Chip Modules (TCMs), including transponder chip modules with integrated Coupling Frame (CF), suitable for implanting, embedding, insertion or placement in secure documents, smartcards, metal housings, tokens, tags or for mechanical and electrical connection to a loop(s) of wire or spiral of wire such as a charm bracelet in payment applications.

The techniques disclosed herein may also be applicable to RFID devices including "non-secure smartcards and tags" such as contactless cards in the form of keycards, medic-alert tags, access control cards, security badges, key-fobs, wearable devices, mobile phones, tokens, small form factor tags, data carriers and the like operating in close proximity with a contactless reader.

This disclosure may also relate to the design and use of laser or chemically etched planar antennas in transponder chip modules (TCMs) or antenna chip modules (AM). The disclosure may also be applicable to a wire wound or wire embedded antennas in the modules.

BACKGROUND

A smartcard is an example of an RFID device that has a transponder chip module (TCM) or an antenna module (AM) disposed in a card body (CB) or inlay substrate.

The antenna module (AM) or antenna chip module, which may be referred to as a transponder chip module (TCM) may generally comprise:

- a module tape (MT) or chip carrier tape (CCT), more generally, simply a support "substrate";
- an RFID chip (CM, IC) which may be a bare, unpackaged silicon die or a chip module (a die with leadframe, interposer, carrier or the like), typically disposed on a "face-down side" or "bond side" or "chip side" (or surface) of the module tape (MT);

the RFID chip may have an antenna integrated therein, but generally a module antenna (MA) is typically required to effect contactless communication between the RFID chip and another RFID device such as an external contactless reader;

a module antenna (MA) or antenna structure (AS), typically disposed on the same face-down side of the module tape (MT) as the RFID chip (IC), and connected therewith, for implementing a contactless interface, such as ISO 14443 and NFC/ISO 15693 with a contactless reader or other RFID device.

When operating in a contactless mode, a passive antenna module (AM) or transponder chip module (TCM) may be powered by RF from an external RFID reader, and may also communicate by RF with the external RFID reader.

A dual-interface antenna module (AM) or transponder chip module (TCM) may also have a contact pad array (CPA), typically comprising 6 or 8 contact pads (CP, or "ISO pads") disposed on a "face-up side" or "contact side" (or surface) of the module tape (MT), for interfacing with a contact reader in a contact mode (ISO 7816). A connection bridge (CBR) may be disposed on the face-up side of the tape for effecting a connection between two components such as the module antenna and the RFID chip on the other face-down side of the module tape.

A conventional antenna module (AM) or transponder chip module (TCM) may be generally rectangular, having four sides, and measuring approximately 8.2 mm×10.8 mm for a 6-contact module and 11.8 mm×13.0 mm for an 8-contact module. As disclosed herein, a generally rectangular transponder chip module (TCM) may have a larger or smaller form factor than a conventional transponder chip module (TCM). Alternatively, the transponder chip module (TCM) may be round, elliptical, or other non-rectangular shape.

A module antenna (MA) may be disposed on the module tape (MT) for implementing a contactless interface, such as ISO 14443 and NFC/ISO 15693. Contact pads (CP) may be disposed on the module tape (MT) for implementing a contact interface, such as ISO 7816. The module antenna (MA) may be wire-wound, or etched, for example:

The module antenna (MA) may comprise several turns of wire, such as 50 μm diameter insulated wire. Reference may be made to U.S. Pat. No. 6,378,774 (2002, Toppan), for example FIGS. 12A, B thereof.

The module antenna (MA) may be a chemically-etched planar antenna (PA) structure. Reference may be made to U.S. Pat. No. 8,100,337 (2012, SPS), for example FIG. 3 thereof.

The module antenna (MA) may comprise a laser-etched planar antenna (PA) structure (LES). Reference may be made US 20140284386.

A planar antenna (PA) structure, or simply "planar antenna (PA)", whether chemically-etched (CES) or laser-etched (LES) is a type of antenna structure (AS) and may comprise a long conductive trace or track having two ends, in the form of a planar, rectangular spiral, disposed in an outer area of a module tape (MT), surrounding the RFID chip on the face-down side of the module tape. This will result in a number of traces or tracks (actually, one long spiraling trace or track), separated by spaces (actually, one long spiraling space). The track (or trace) width may be approximately 100 μm. The planar antenna may be fabricated on other than the module tape, such as on a separate substrate, and joined to the module tape.

A module antenna (MA) connected to an RFID chip (CM), typically on a substrate or module tape (MT), may be referred to as a "transponder chip module", or simply as a "transponder", or as a "module". Reference may be made to US 20150136858, US 20140361086 and US 20150021403, all of which are incorporated in their entirely by reference herein, for examples of transponder chip modules (and coupling frames).

Metal Jewelry and the Like as "Payment Objects"

In the main, hereinafter, transponder chip modules (TCM) and the RFID devices such as payment objects incorporating the transponder chip modules may be passive devices, not having a battery and harvesting power from an external contactless reader (ISO 14443).

Metal jewelry would not normally be considered for payment objects operating at a frequency of 13.56 MHz, as the metal would attenuate the electromagnetic field being picked-up by the passive transponder device.

Transponders can be attached to metal surfaces, if the effects of the metal can be shielded which is usually achieved using magnetic materials, such as ferrite, and spacing the transponder at a distance off the surface of the metal. See, for example, U.S. Pat. No. 8,366,009. See also US 20090159657 (2009 Jun. 25; Chen et al.) which discloses a contactless integrated circuit card system. A shielding member could be a conductor in form of a sheet, plate, or foil, and could also be a soft magnetic member.

Some Patent References

US 20140292477 discloses a system and method is provided for the identification and authentication of precious metals and small jewelry. The system can include an embedded RFID tag, RFID tag reader and reader based unit (wired or wireless), and a basic tag information system for tag capture, look-up and display. The RFID tag can be embedded in absorbing dielectric medium inside epoxy in a tiny cavity placed in the metal or jewelry. A thin layer of epoxy placed over the tag can ensure that the tag will not be damaged from rubbing against skin, abrasion or chemicals while still allowing the desired electromagnetic properties (antenna and the circuitry performance). The RFID tag information can be transferred to a computer through the reader, and can be matched with preprogrammed information in a database.

US 20140260424 discloses an apparatus for conveniently and unobtrusively carrying a radio frequency identification (RFID) tag. A RFID tag is disposed within a channel defined by a jewelry piece and covered with a decorative element or cap. The RFID tag is a passive-, battery-assisted passive-, or active-type RFID tag.

US 20140102136 discloses an apparatus for conveniently and unobtrusively carrying a radio frequency identification (RFID) tag. A jewelry piece is operatively connected to a housing using a screw post and threaded slot. A radio frequency identification tag and buffer ring are disposed within the housing and enclosed by a cap.

US 20130332353 discloses systems and methods comprising RFID data acquisition technology which may be embedded in a fob or tag for use in completing financial transactions. This fob may a self-contained device which includes a transponder and which may be contained on any portable form factor and may comprise flexible circuitry. For instance, the fob may be housed in a wearable transaction instrument, such as a bracelet, ring, wrist band, retractable id, necklace, jewelry charm, lanyard, key ring fob, watch, band, pin, and/or the like. The fob is configured to be used in concert with an RFID reader device.

US 20060192674 discloses Jewelry/personal articles in the form of sets of items which may be sold in pairs or groups, each article of the group being provided with the RFID circuitry unique to that pair or group and an electrical display which will illuminate when two or more of the items of the group are in proximity to each other, but not requiring one to be in physical contact with another. In one embodiment the personal article comprises a heart necklace and a circular pendant, each provided with an electrical display such as a lamp and a normally open battery powered electrical circuit interconnected with the electrical display and uniquely coded RFID containing a tag and reader. Operation of the electrical display is initiated by bringing the two articles within proximity of each other and the uniquely coded RFID circuitry of the one item recognizes the matched uniquely coded RFID circuitry of another item of the same pair or group.

SUMMARY

It is a general object of the invention to provide techniques for incorporating a transponder chip module (TCM), particularly a passive transponder chip module, in a payment object such as smart jewelry and other wearables, particularly wearables having metal components for housing the transponder chip module.

It is a further object of the invention to provide improved transponder chip modules (TCM) and improved techniques for manufacturing transponder chip modules (TCM).

It is a further object of the invention to provide improved coupling of smartcards (as an example of secure documents, RFID devices and the like, including dual-interface smartcards and metal or metallized smartcards) with a contactless reader.

As used herein, a transponder chip module (TCM) may generally comprise an RFID chip and a module antenna disposed on one (face-down) side of a module tape, and contact pads on an opposite (face-up) side of the module tape. In the main, hereinafter, discussions may be directed to passive transponder chip modules operating primarily or exclusively in a contactless mode (e.g., ISO 14443, 15693). However, the techniques disclosed herein may be applicable to dual-interface transponder chip modules capable of operating in both contactless and contact modes (e.g., ISO 7816).

According to the invention, generally, RFID devices comprising (i) a transponder chip module (TCM) having an RFIC chip (IC) and a module antenna (MA), and (ii) a coupling frame (CF) having a slit (S). The coupling frame may be disposed closely adjacent the transponder chip module so that the slit overlaps the module antenna. The RFID device may be a payment object such as a jewelry item having a metal component modified with a slit (S) to function as a coupling frame. The coupling frame may be moved (such as rotated) to selectively position the slit to selectively overlap the module antennas (MA) of one or more transponder chip modules disposed in the payment object, thereby selectively enabling contactless communication between a given transponder chip module in the payment object and another RFID device such as an external contactless reader.

Coupling frames (CF) in combination with transponder chip modules (TCMs) may provide for capacitive coupling with a contactless reader or point of sale terminal, or another RFID device. Coupling frames (CF) in combination with transponder chip modules (TCMs) may enhance (including enable) contactless communication between.

As used herein, a "coupling frame" (CF) may comprise a metal layer, metal frame, metal plate or any electrically-conductive medium or surface with an electrical discontinuity such as in the form of a slit (S) or a non-conductive stripe extending from an outer edge thereof to an inner position thereof, the coupling frame capable of being oriented so that the slit (S) overlaps (crosses-over) the module antenna (MA), such as on at least one side thereof. The slit may be straight, and may have a width and a length. In some embodiments, the slit may extend to an opening (MO) for accepting the transponder chip module. In other embodiments, there may only be a slit, and no opening for the transponder chip module. The coupling frame (CF) may also comprise a conductive path or a track of wire formed around the transponder chip module (TCM), such as by embedding wire. The coupling frame may be planar or three dimensional (such as a curved surface). The coupling frame for capacitive coupling with a reader may couple with either a passive or an active transponder chip module.

The overlap of the slit with the module antenna may be less than 100%. In addition, the width and length of the slit can significantly affect the resonance frequency of the system and may be used as a tuning mechanism. As the width of slit changes, there is a resulting change in the overlap of the slit with the antenna.

In use, the coupling frame may be disposed in close proximity to a transponder chip module, such as atop the module, so that the slit (or other discontinuity) overlaps at least a portion of the module antenna of the transponder chip module, so that the coupling frame enhances (including enables) coupling between the transponder chip module and another RFID device such as a contactless reader. When the slit is not overlapping the antenna, communication with the transponder chip module may be suppressed (or inhibited, including disabled). The coupling frame may be incorporated into an RFID device such as a smart card, it may constitute substantially the entire body of a metal smart card, it may be incorporated into the transponder chip module, and it may comprise a component of a payment object.

In order to satisfy communication requirements for a given smartcard application, in terms of maximum communication read/write range for example, the chip (IC) must have a minimum power level delivered to it. The module antenna (MA) inductance, resistance and capacitance all affect the power level delivered to the chip (IC); at the maximum communication distance from the reader antenna, the module antenna (MA) is delivering the minimum chip (IC) power level. The better the performance of a given module antenna (MA) with a given chip (IC), the greater the maximum communication distance of the transponder chip module (TCM) with respect to the reader antenna.

According to some embodiments (examples) of the invention, an RFID device may comprise:

a transponder chip module (TCM) comprising an RFID chip (IC) and a module antenna (MA), and may be characterized by: a coupling frame (CF) comprising a conductive surface and having an electrical discontinuity comprising a slit (S) or non-conductive stripe extending through the surface from an outer edge thereof to an inner position thereof, wherein the coupling frame is disposed so that the slit overlaps a portion of the module antenna.

At least one of the coupling frame and the module antenna may be moveable with respect to the other so that communication with the transponder chip module may selectively be enhanced or suppressed (including enabled or disabled, respectively). In a first position, the slit of the coupling frame overlaps the module antenna; and in a second position, the silt of the coupling frame does not overlap the module antenna. The coupling frame can rotate, toggled, slid, or flipped with respect to the transponder chip module.

The RFID device may comprise two transponder chip modules (TCM-1, TCM-2); and the coupling frame may be moveable with respect to the two transponder chip modules so that communication with a selected one of the transponder chip modules may selectively be enhanced or suppressed.

The RFID device may comprise two coupling frames, each having a slit; wherein: a first of the two coupling frames is positioned so that its slit overlaps the module antenna of the transponder chip module; a second of the two coupling frames is movable so that (i) in a first position, the slits of the two coupling frames are aligned with one another and (ii) in a second position, the slits of the two coupling frames are aligned away from one another.

The coupling frame may comprise a component of a payment object.

The RFID device may comprise means for shorting the slit to suppress communication with the transponder chip module. The means for shorting may comprise a switch (SW), or a second coupling frame (CF-2).

The slit (S) of the coupling frame (CF) may cover at least a substantial portion of an entire central area of the module antenna, including at least 50%, at least 60%, at least 90%, and at least 100% thereof.

The transponder chip module may have the form factor of a SIM card; and the RFID device is adapted to receive one or more SIM card transponder chip modules.

According to some embodiments (examples) of the invention, a method of selectively enabling or disabling communication with a transponder chip module (TCM) in an RFID device may comprise: providing a coupling frame (CF) having a slit (S); and moving at least one of the transponder chip module and the coupling frame so that (i) the slit overlaps the module antenna to enable communication; and (ii) the slit does not overlap the module antenna to disable communication. The RFID device may comprise a second transponder chip module; and moving the coupling frame may enable one or the other of the two transponder chip modules.

The RFID device may be a plastic smartcard, metal smartcard, hybrid smartcard, payment object, wearable device, or smart jewelry.

According to some embodiments (examples) of the invention, a card body construction for a smart card (SC) may comprise: at least one metal layer having an opening for receiving a transponder chip module and a and a slit extending from the opening to an outer edge of the layer, so that the layer may function as a coupling frame. A first metal layer may have an opening for receiving the transponder chip module; a second metal layer may have an opening for receiving a mold mass of the transponder chip module so that the slit overlaps a module antenna of the transponder chip module; and a third metal layer may have a slit overlapping the module antenna of the transponder chip module. The third metal layer may not have an opening for receiving the transponder chip module.

Some features which may be discussed herein may include:
  the coupling frame has a slit extending from an outer edge to an inner position thereof, and overlaps at lease a portion, such as the traces on one side of the module antenna, extending into the trace-free interior area ("no man's land") of the module antenna. The slit may be straight, L-shaped, T-shaped and the like. The width and length of the slit may be established with respect to the dimensions of the no-man's land, and the slit may overlap some turns on other sides of the antenna.
  the coupling frame may be moved relative to the transponder chip module, more particularly with respect to the module antenna thereof, to selectively enable/disable communications with the transponder chip module. Movement may include rotating, flipping, toggling, sliding, and the like.
  a second coupling frame having a slit can interact with a first coupling frame having a slit so that the coupling frame(s) are effective only when their slits are aligned with one another.
  a second coupling frame having a slit can interact with a first coupling frame having two slits associated with two transponder chip modules to selectively enable one or the other of the transponder chip modules when the slits of the two coupling frames are aligned.
  an "integrated" coupling frame may be disposed onto the module tape so as to maintain close tolerances with the module antenna and may cooperate with another non-integrated coupling frame.
  transponder chip modules may have a form factor such as mini-SIM or micro-SIM to be inserted into payment objects.
  the slit in the coupling frame may generally be defined by two ends of the coupling frame which may be overlapped with and insulated from one another.

Some additional features may include:
  An LED may be connected to the coupling frame of a transponder chip module, and may be powered when in the interrogation field of an external contactless reader, such as to indicate a transaction taking place.
  Magnetic material may be disposed in the center area of a laser etched antenna structure as a flexible substrate for insertion in a wearable device.
  A module antenna (MA) which is U-shaped along a side thereof may be oriented to that the turns of the antenna do not cross over the slit (S) in a coupling frame (CF), but rather are routed around the slit.
  RFID devices incorporating some of the features disclosed herein may be incorporated into payment objects, wearables, smart watches, jewelry, and the like, in particular bracelets, cosmetic boxes, cufflinks, etc, using the metal case for coupling with the module antenna of the transponder chip module.
  Regarding wearable devices having RFID functionality, such as disclosed herein, particularly watches worn on a user's wrist and having a metal casing, the wearer's body may act as a capacitive coupling element, enabling, for example, interaction with an RFID reader by touching (with the user's finger) the reader with their finger or palm.

The improvements disclosed herein may enhance the power delivery to an RFID chip connected to a planar antenna with a confined surface area forming a transponder chip module, to improve on the read/write range with a contactless point of sale terminal.

This disclosure also relates to passive RFID devices operating on the combined principle of capacitive and inductive coupling to effectuate data communication and harvest energy with and from a contactless reader and to drive active elements, in particular for integration into payment and identification objects.

This disclosure relates to smart jewelry in the form of a bangle, charm bracelet or cuff in which a passive transponder chip module with its own integrated coupling frame can be inserted, implanted, embedded or latched into a metal charm, whereby the metal charm may act as an additional coupling frame with or without a physical or electrical connection to the coupling frame on the transponder chip module.

This disclosure also relates to metal cards produced through additive manufacturing including sintering, said metal cards modified to function as coupling frames. Metals such as gold, sterling silver, titanium and brass, and insulating materials such as polyamide, ABS, resin, ceramics and rubber may be 3D printed in combination. Payment objects and smart jewelry may also be 3D printed, made from a variety of metals with a slit or slot printed with an insulating material.

This disclosure further relates to three-dimensional (3D) coupling frames permitting a transponder chip module to communicate with a contactless reader in substantially any orientation. The 3D coupling frame may be a loop(s) of wire or a metal band(s) which overlaps or is connected to a coupling frame on a transponder chip module allowing the electromagnetic field to be picked-up in substantially any position in proximity with a reader.

This disclosure also relates to overlapping coupling frames in the form of metal layers (such as made of sterling silver) with a transponder chip module embedded between the layers to function as a payment object, such as a piece of jewelry. The overlapping coupling frames may be riveted or laser welded, enclosing the transponder chip module entirely.

A metal charm acting as a coupling frame, which capacitively couples with an internal passive transponder chip module, optionally with a coupling frame integrated therein, may be in the form of a miniaturized credit card, bank note, treasure box, coin, or any charm symbolizing prosperity, wealth, luck or money. The transponder chip module with integrated coupling frame may be interchangeable, capable of being removed from the charm. The charm may be in the form of a locket or latch to accept the insertion of a transponder chip module having a SIM like form factor (such as micro-SIM). To enhance the coupling with a reader, the charm may be physically attached and electrically connected to a chain or bracelet.

In their various embodiments, the invention(s) described herein may relate to industrial and commercial industries, such as RFID applications, payment smartcards, electronic passports, identity cards, access control cards, payment objects, wearable devices, smart jewelry and the like.

Other objects, features and advantages of the invention(s) disclosed herein, and their various embodiments, may become apparent in light of the descriptions of some exemplary embodiments that follows.

BRIEF DESCRIPTION OF THE DRAWINGS

Reference will be made in detail to embodiments of the disclosure, non-limiting examples of which may be illustrated in the accompanying drawing figures (FIGS.). Some figures may be in the form of diagrams. Some elements in the figures may be exaggerated, others may be omitted, for illustrative clarity.

Any text (legends, notes, reference numerals and the like) appearing on the drawings are incorporated by reference herein.

Some elements may be referred to with letters ("AM", "BA", "CB", "CCM", "CM", "MA", "MT", "PA", "TCM", etc.) rather than or in addition to numerals. Some similar (including substantially identical) elements in various embodiments may be similarly numbered, with a given numeral such as "310", followed by different letters such as "A", "B", "C", etc. (resulting in "310A", "310B", "310C"), and variations thereof, and may be collectively (all of them at once) or individually (one at a time) referred to simply by the numeral ("310").

The figures presented herein may show different embodiments of RFID devices, such as smart cards or payment objects such as wearable devices. Some of the drawings may omit components such as the transponder chip module or module antenna, for illustrative clarity. Some of the figures may show only components of an RFID device, such as coupling frames.

Figure 1:
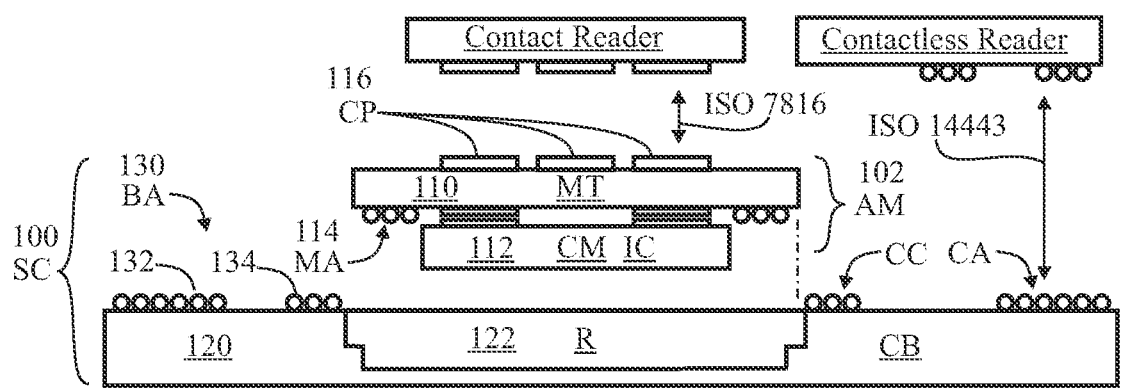

FIG. 1 is a diagram (cross-sectional view) of a dual-interface smart card (SC) and readers.

Figure 2A:
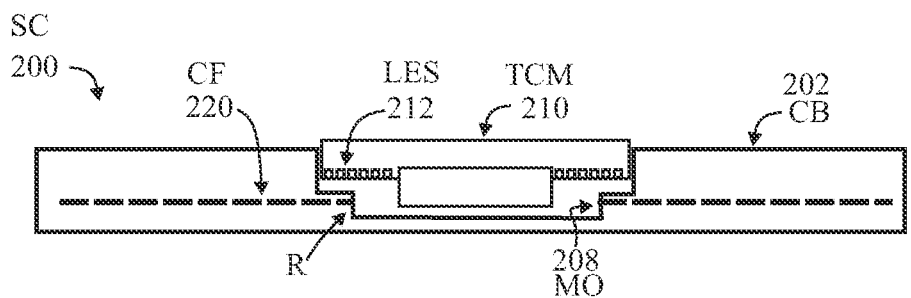

FIG. 2A is a diagram (cross-sectional view) illustrating a coupling frame in a card body of a smart card.

Figure 2B:
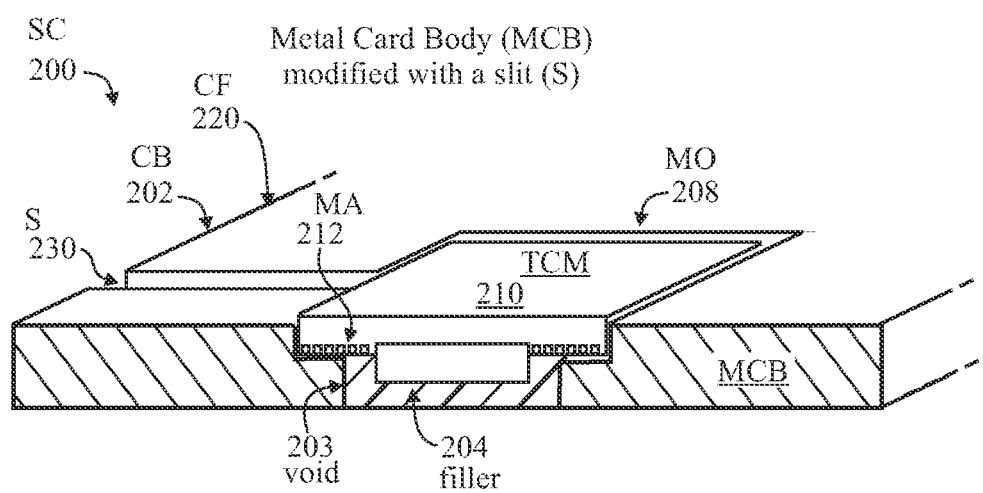

FIG. 2B is a diagram (partial perspective view) illustrating smart card having a metal card body modified to function as a coupling frame.

Figure 2C:
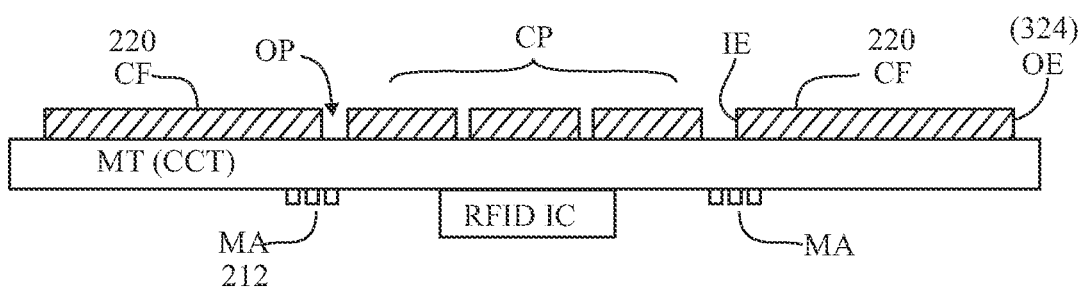

FIG. 2C is a diagram (cross-sectional view) illustrating a coupling frame integrated into a capacitive coupling enhanced (CCE) transponder chip module (TCM).

Figure 2D:
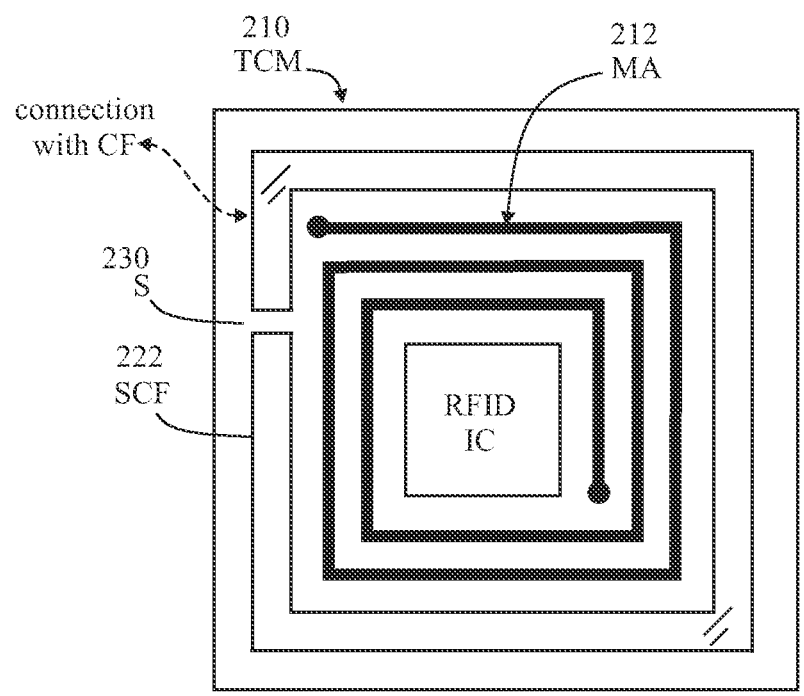

FIG. 2D is a diagram showing a transponder chip module (TCM) having a secondary coupling frame (SCF) and connecting with an external coupling frame (CF, not shown).

Figure 3A:
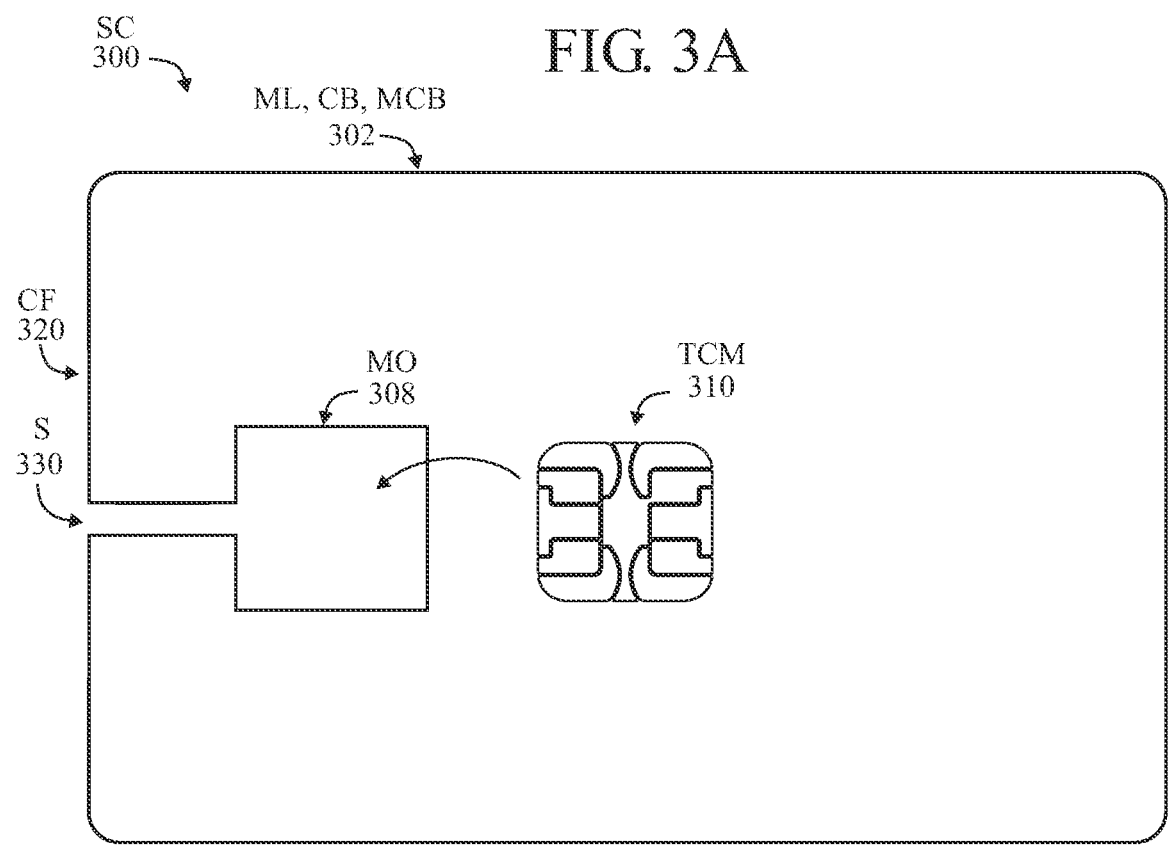

FIG. 3A is a diagrammatic view of a front surface of a smart card (SC) which may be a metal card or composite metal card having a slit(S) to function as a coupling frame (CF).

Figure 3B:
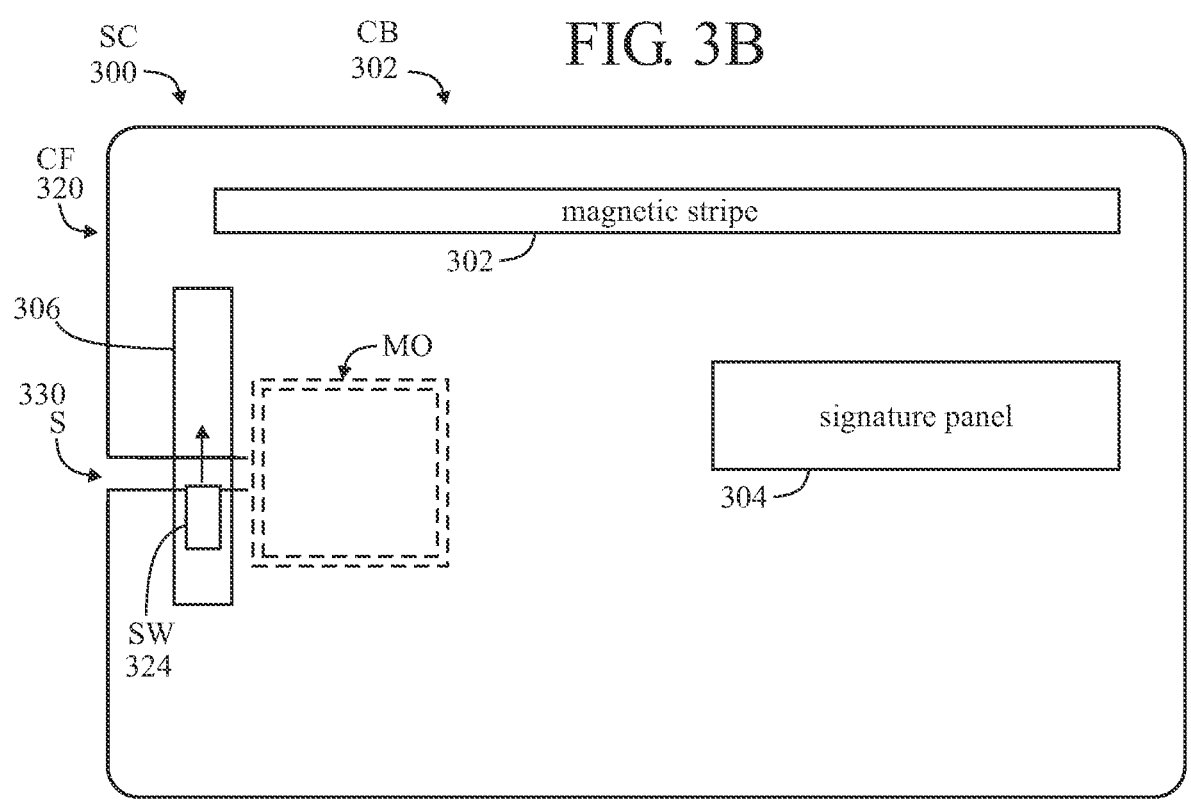

FIG. 3B is a plan view of the back side of the smart card shown in FIG. 3A, showing incorporating a switch to short out the slit (S) in the card body (CB).

Figure 3C:
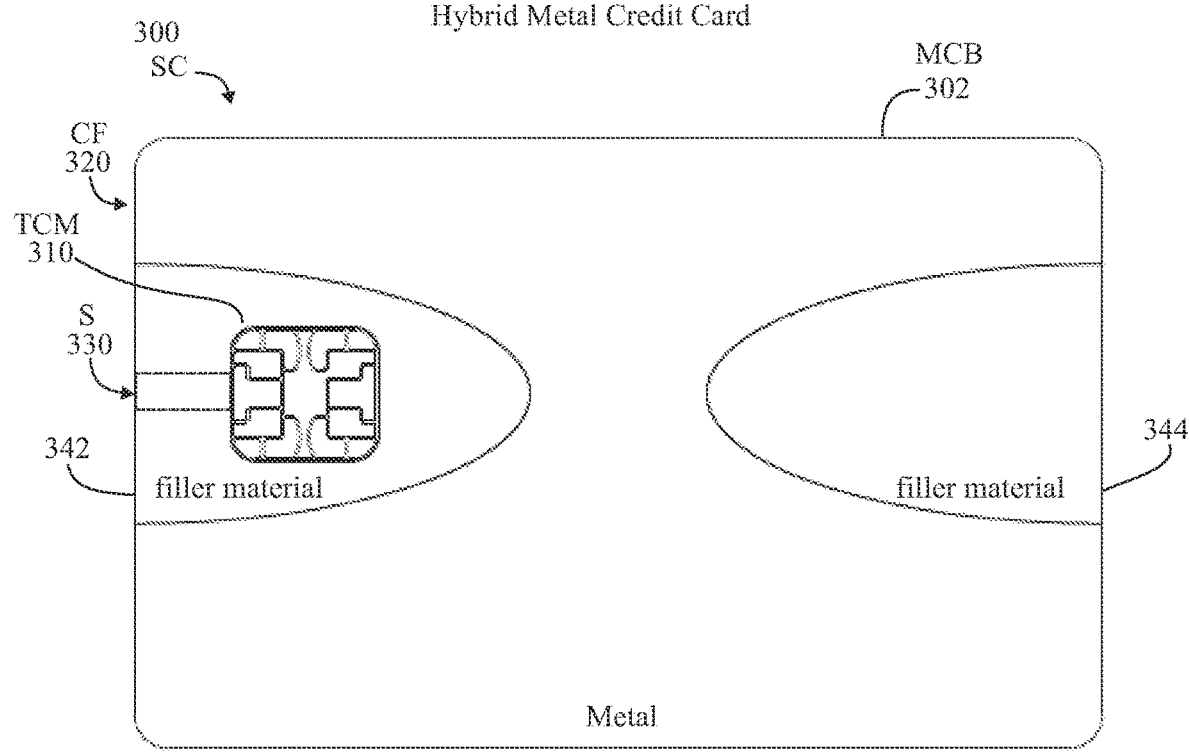

FIG. 3C is a plan view of a hybrid metal smart card, which may be a credit card.

Figure 3D:
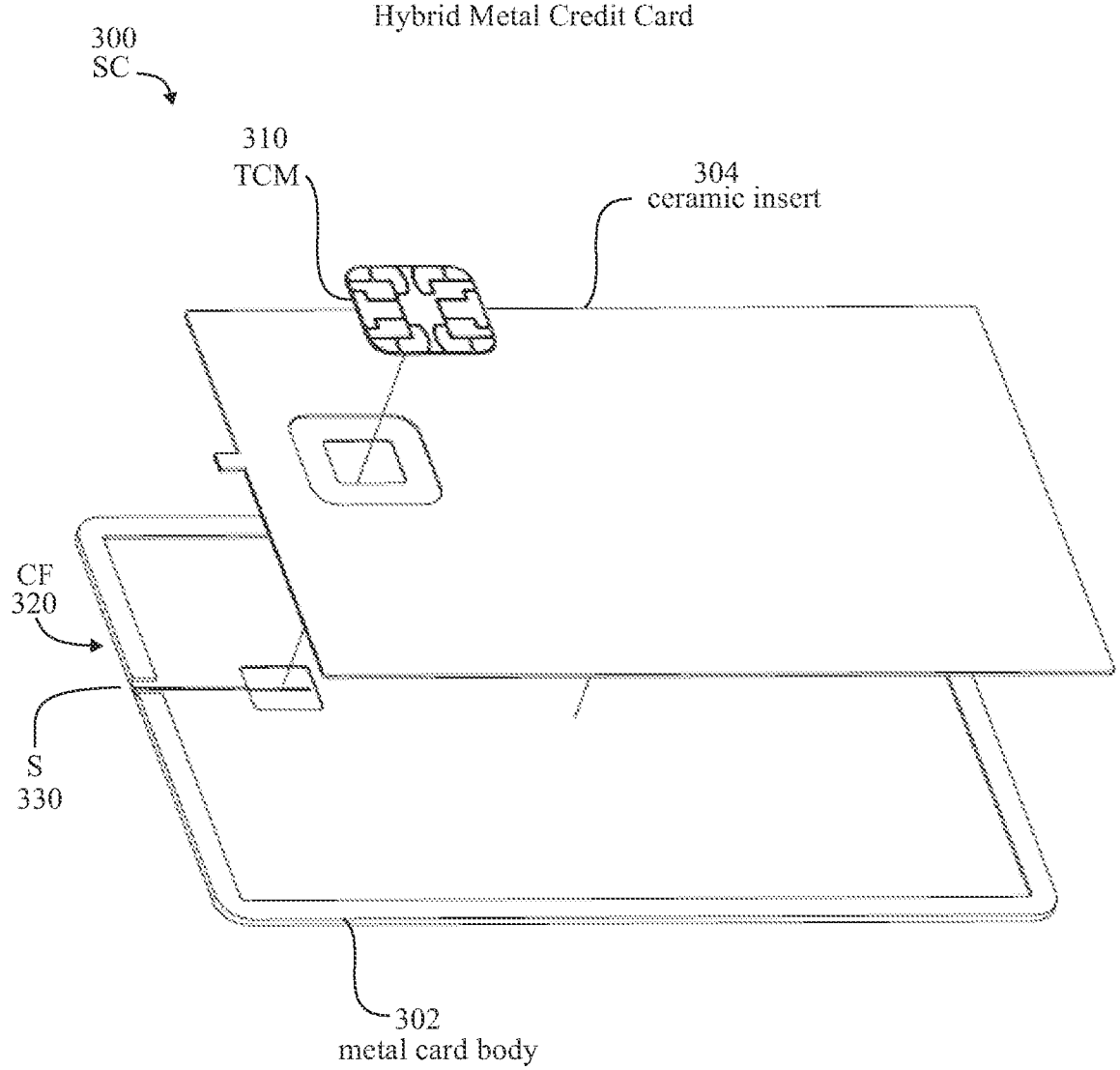

FIG. 3D is a perspective view (exploded) of a hybrid ceramic and metal smart card.

Figure 4:
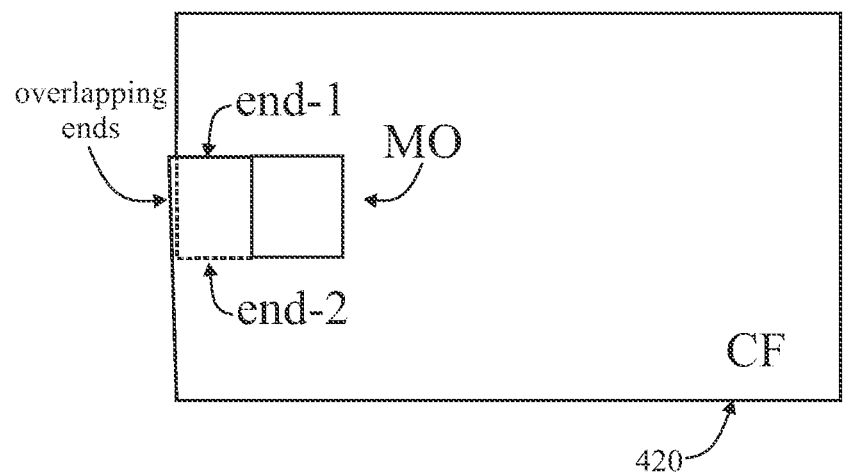

FIG. 4 is a diagram (plan view) of a coupling frame (CF) for an RFID device such as a smart card, having overlapping ends at the position of the slit.

Figure 5A:
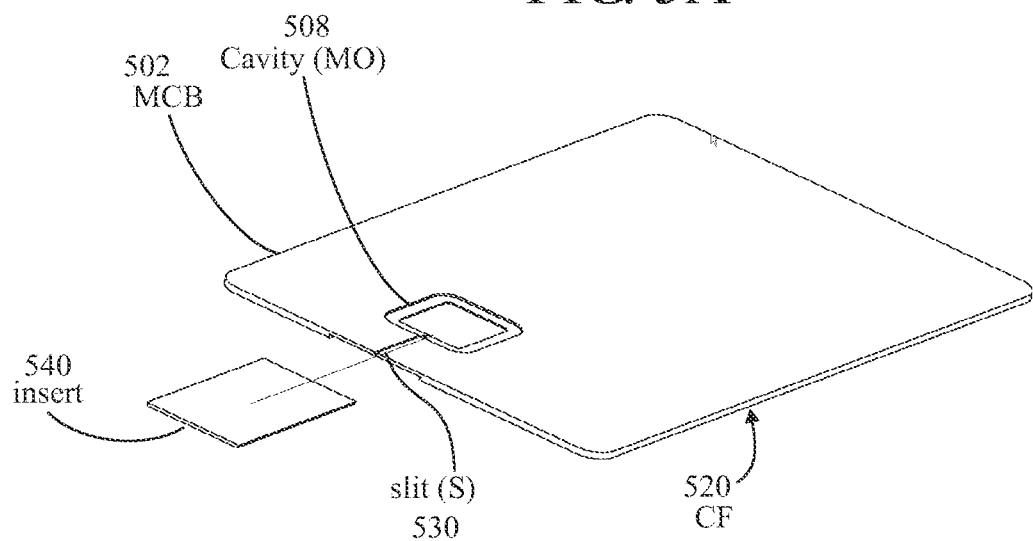
Figure 5B:
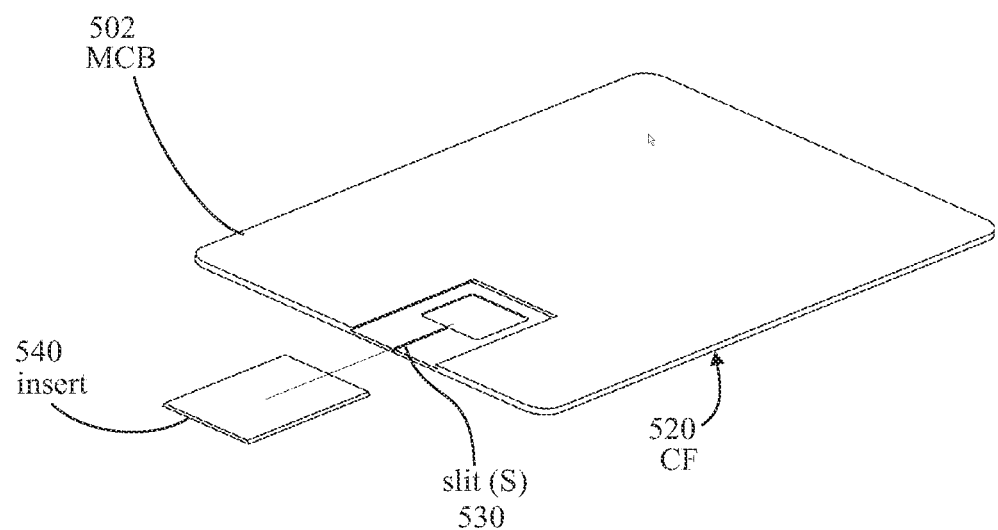

FIGS. 5A,B are two perspective views (front and back) of a metal card body MCB having a cavity (MO) for a transponder chip module (TCM, not shown), and a slit S extending from the cavity to an outer edge of the metal card body.

FIG. 5C is a perspective view showing a metal card body (MCB) having a cavity (MO), but rather than the cavity being entirely open at the bottom, portions of the card body which may be referred to as struts may be left in place, spanning the cavity, to reinforce the card body.

Figure 6:
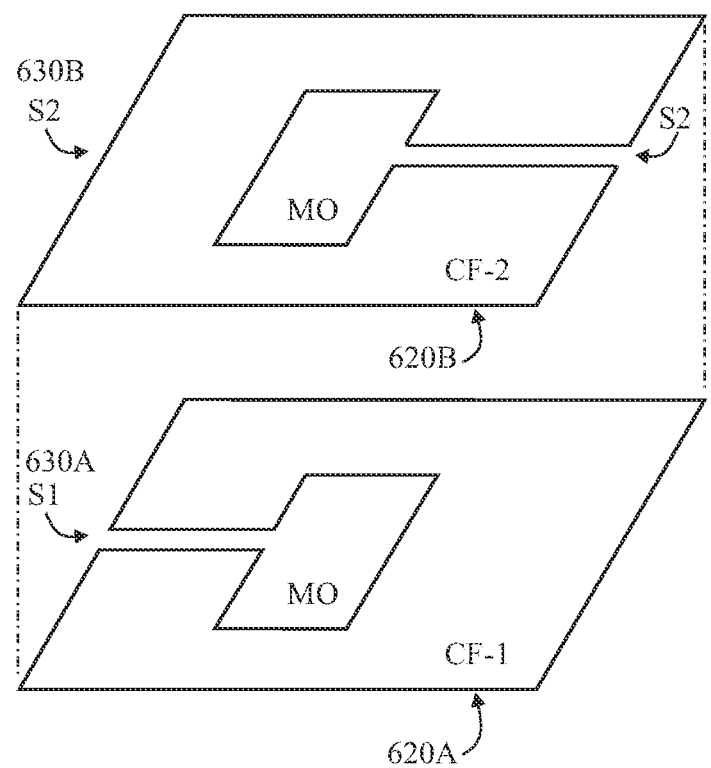

FIG. 6 is a diagram (in perspective view, exploded) of two coupling frames (CF-1, CF-2) stacked one atop the other.

Figure 7A:
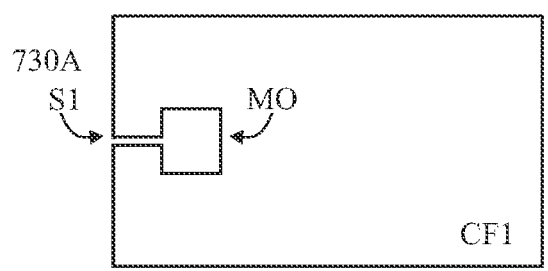
Figure 7B:
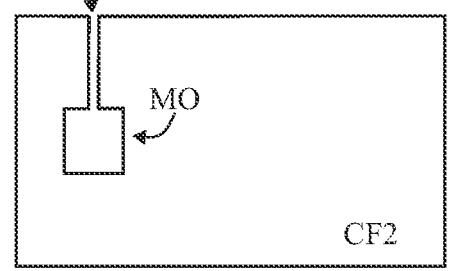
Figure 7C:
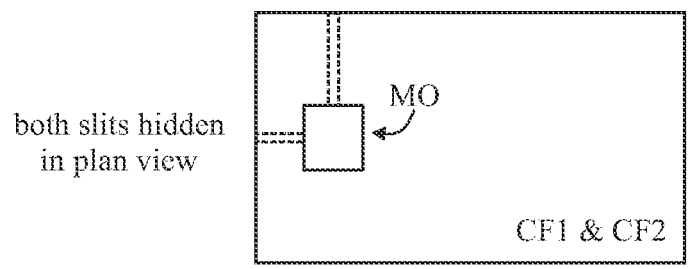

FIGS. 7A, 7B, 7C are diagrams (in plan view) showing two coupling frames (CF-1, CF-2) being joined together and overlapped.

Figure 8A:
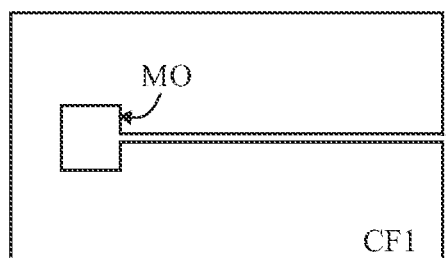
Figure 8B:
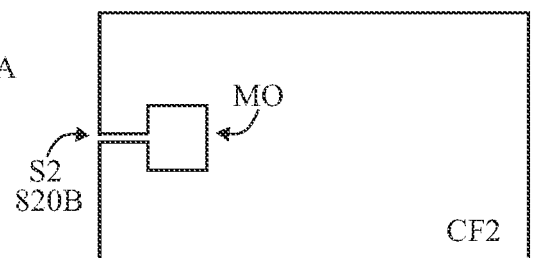
Figure 8C:
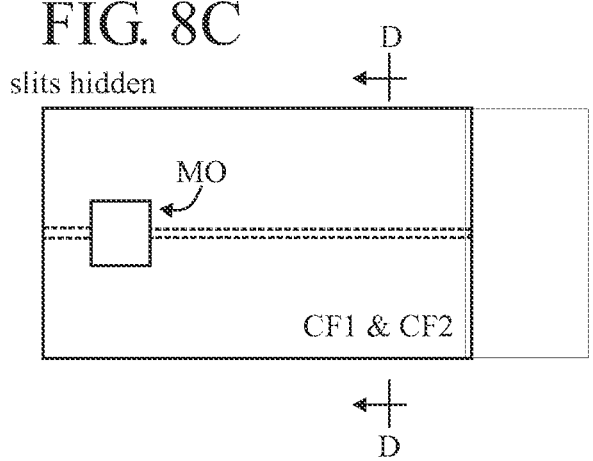
Figure 8D:
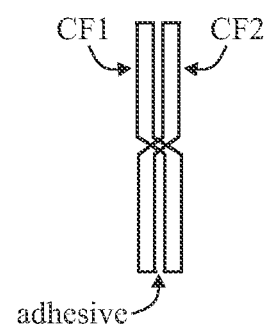

FIGS. 8A, 8B, 8C are diagrams (plan views) of two coupling frames (CF-1, CF-2) being interlocked with one another. FIG. 8D is a cross-sectional view of the resulting interlocked coupling frames, such as taken on a line D-D through FIG. 8C.

Figure 9:
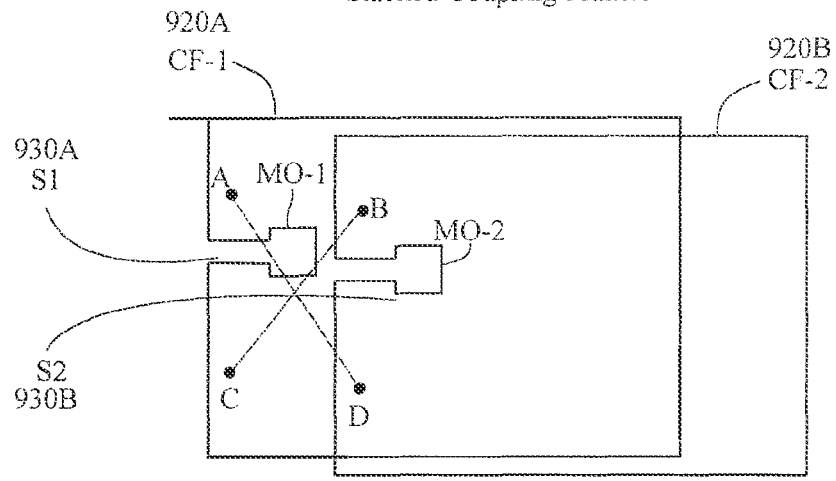

FIG. 9 is a diagram (plan view, exploded) showing two coupling frames (CF-1, CF-2) each having two ends, and illustrates alternative ways of connecting the ends of one coupling frame to the ends of the other coupling frame.

Figure 9A:
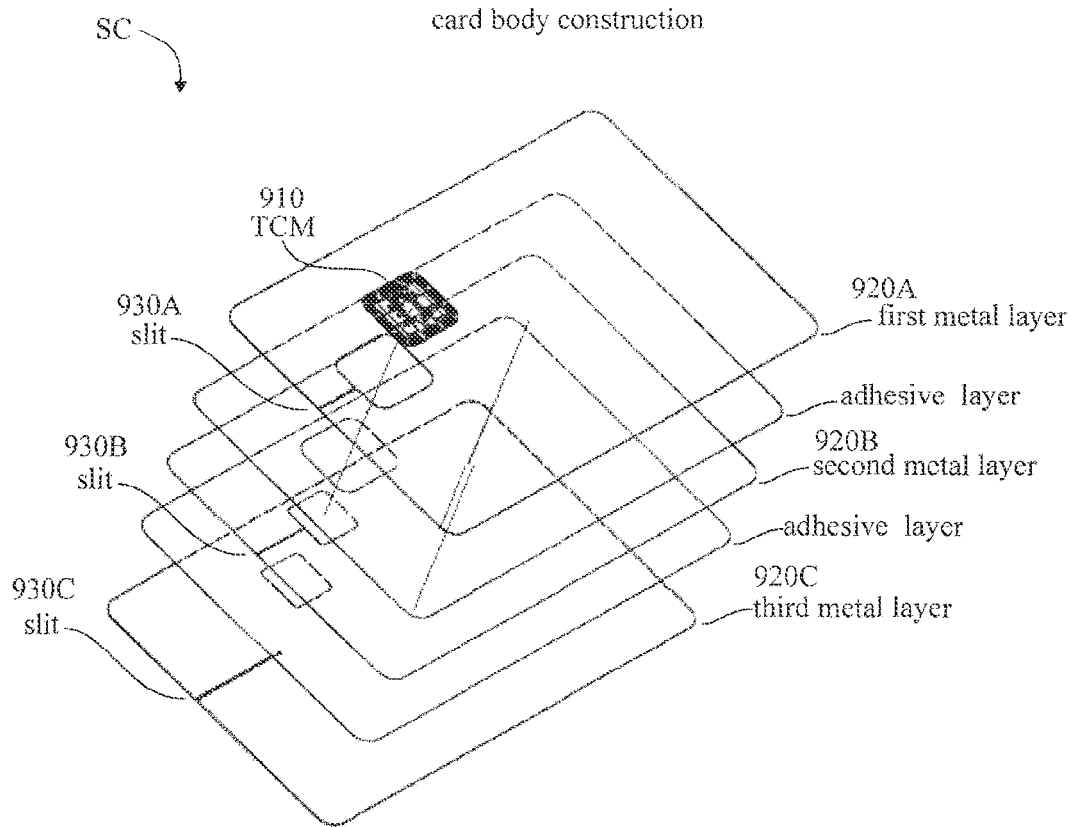

FIG. 9A is a perspective view (exploded) of a construction of a card body of a smart card.

Figure 10A:
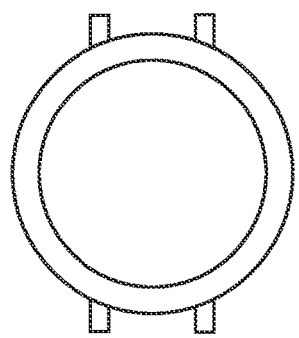
Figure 10E:
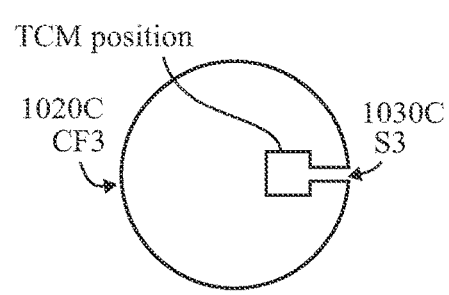

FIG. 10A is a diagram (plan/cross-sectional view) of a conventional watch case.

Figure 10B:
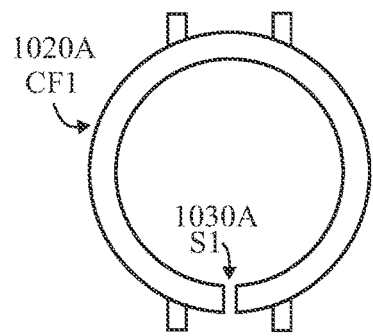
Figure 10C:
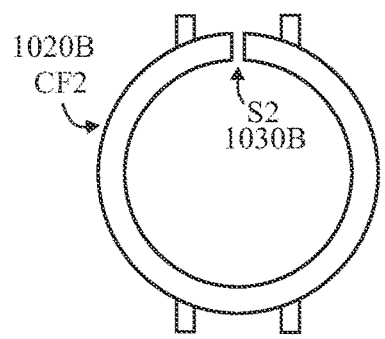

FIGS. 10B, 10C,D, 10E are diagrams (plan/cross-sectional views) of watch case components made of metal (or other conductive material) having slits (S1, S2) to function as coupling frames.

Figure 11A:
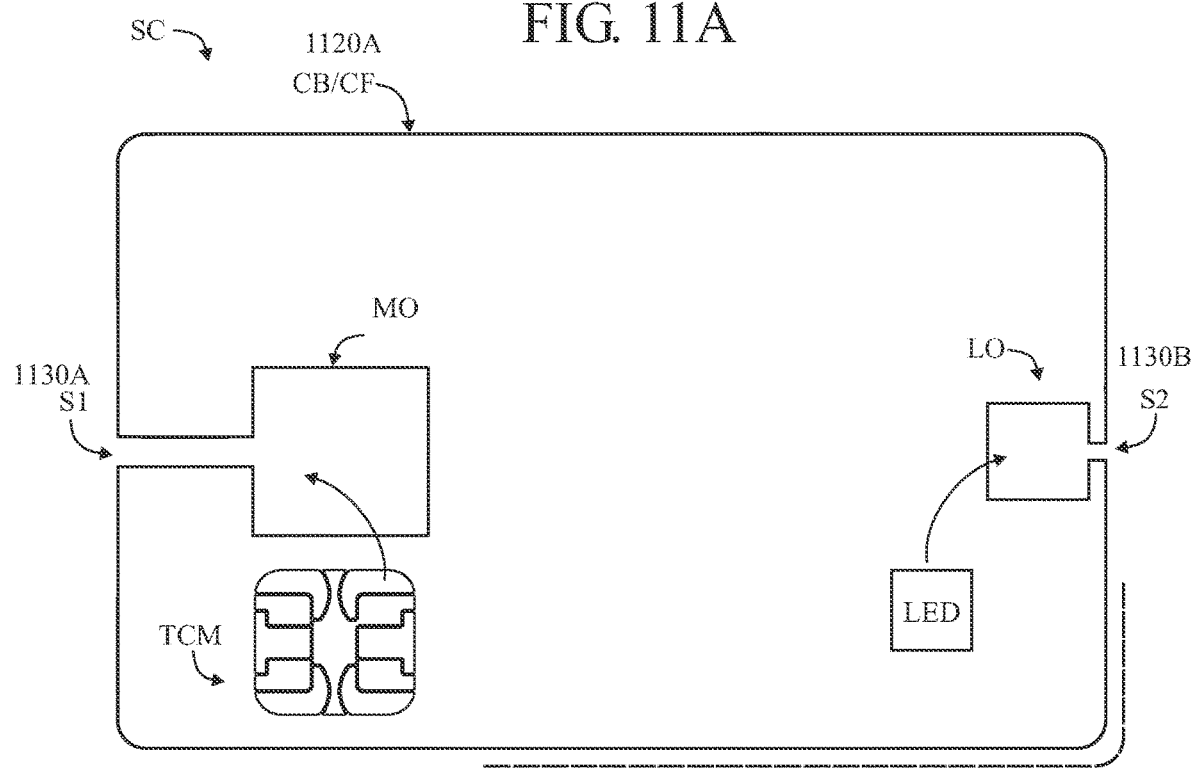

FIGS. 11A, B, C are diagrams (plan views) of smart cards (exemplary of payment objects) having a transponder chip module with a coupling frame for capacitively coupling with an external reader, and an LED (or LED module) in the same coupling frame (FIG. 11A), or in a separate coupling frame (FIG. 11B), or connected with an antenna (FIG. 11C).

Figure 12:
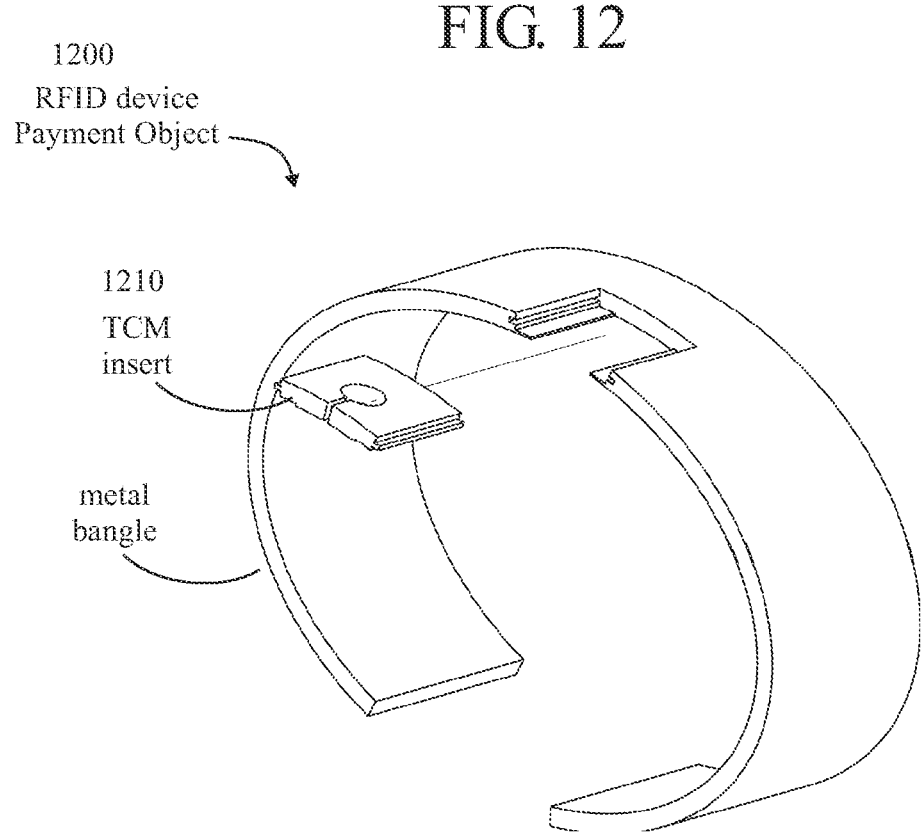

FIG. 12 is a perspective view of a bangle/bracelet with a transponder chip module "insert".

Figure 13A:
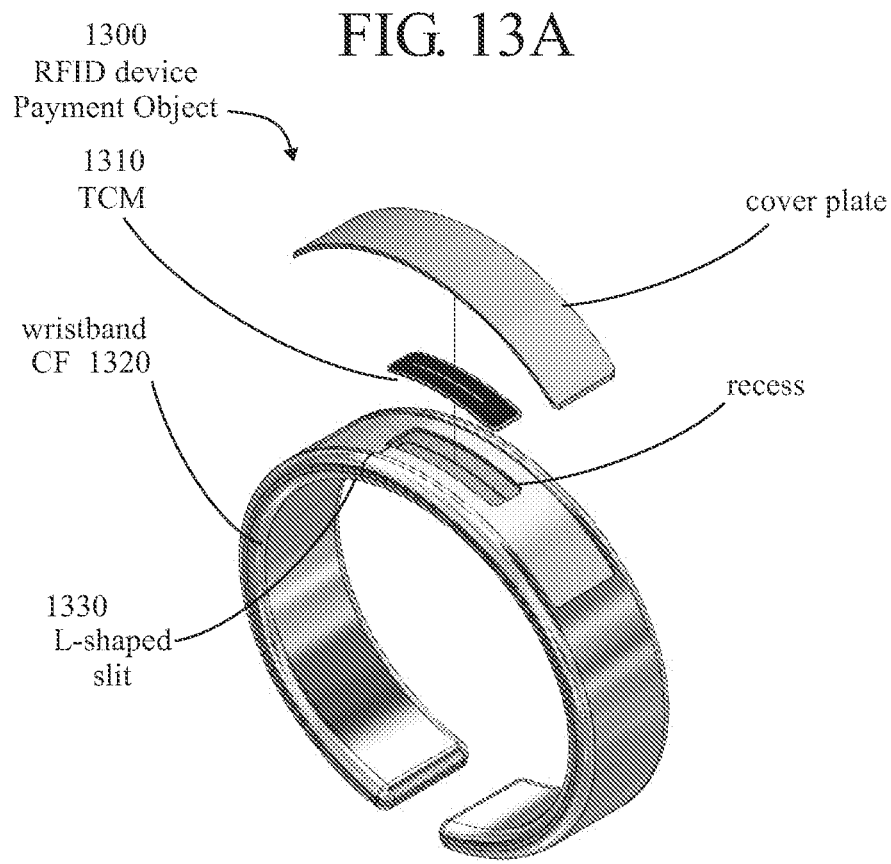
Figure 13B:
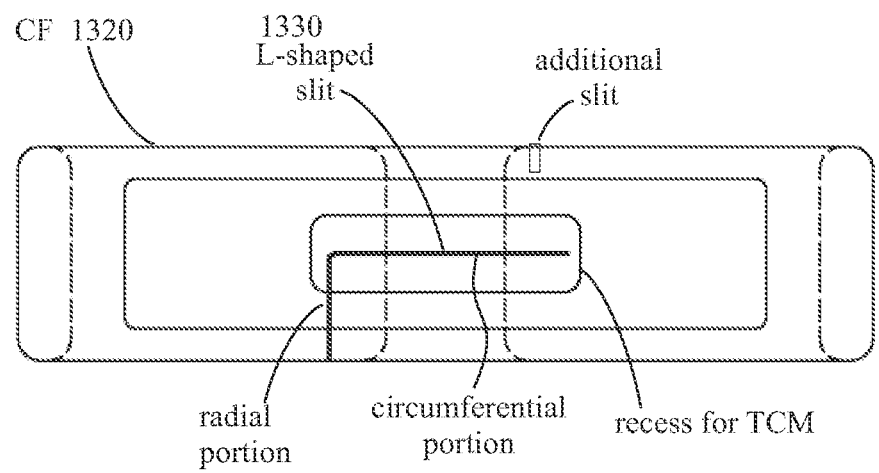

FIG. 13A (perspective view) and 13B (top plan view) shows a payment object in the form of a bracelet having a wristband with an L-shaped slit to function as a coupling frame.

Figure 14A:
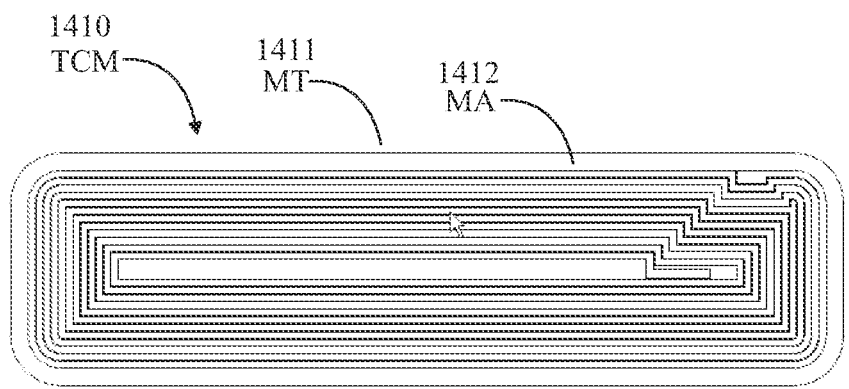
Figure 14B:
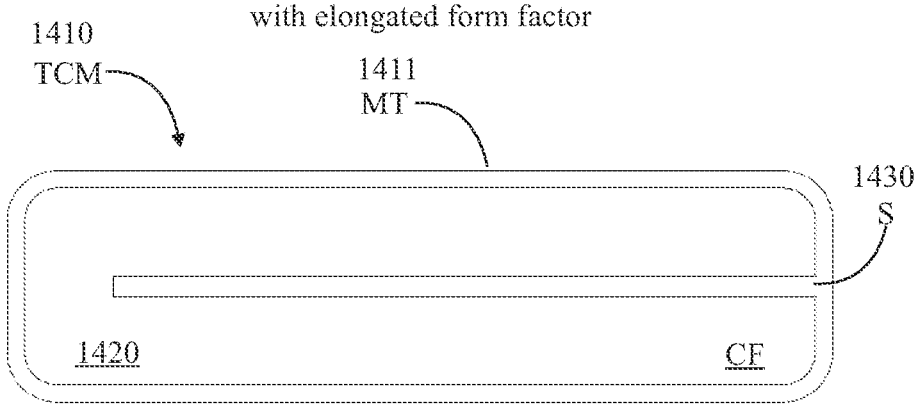

FIG. 14A is an illustration (top plan view) of a transponder chip module (TCM) having a module antenna (MA) and a coupling frame (CF), and FIG. 14B is an illustration (bottom plan view) of the transponder chip module.

Figure 15:
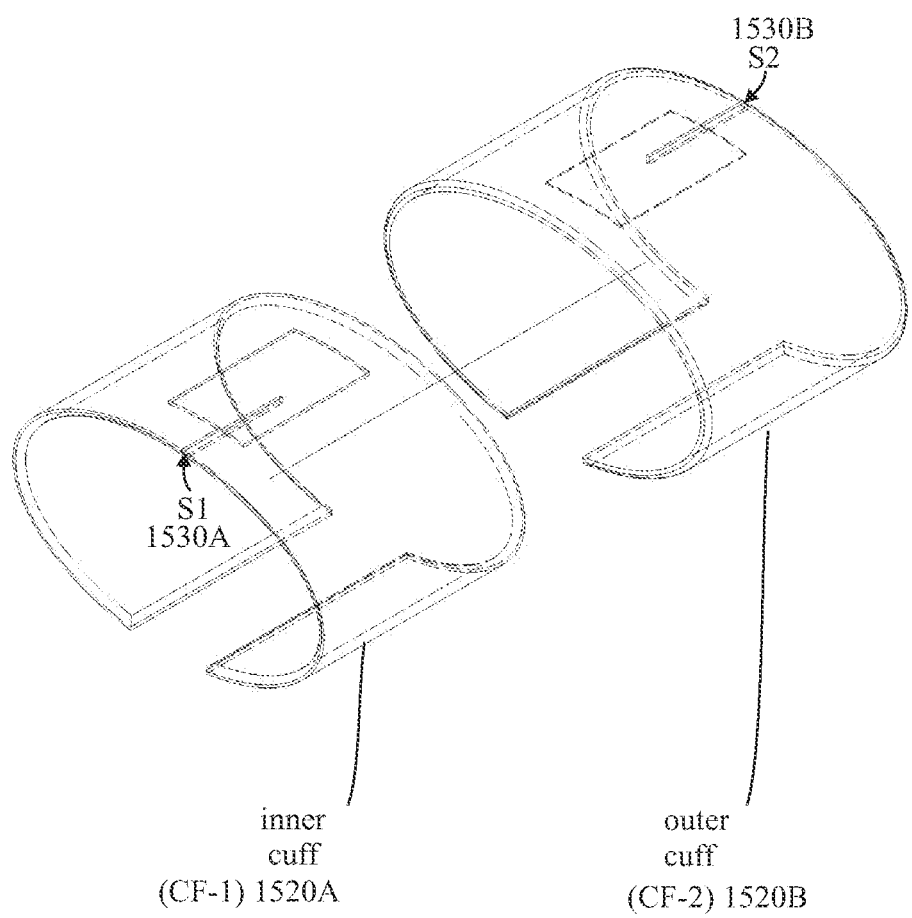

FIG. 15 is an illustration of a bracelet made from two laminated or welded sheet metal layers, each bearing an electrical discontinuity in the form of a slit to function as a coupling frame (CF) and a recess to accommodate a transponder chip module.

Figure 16:
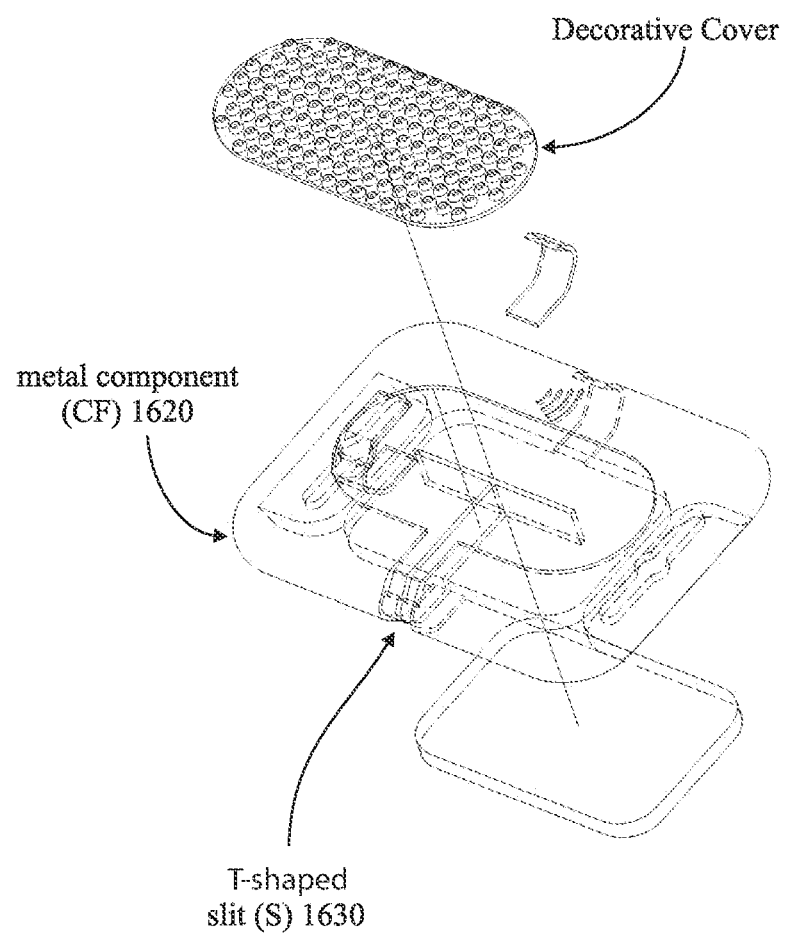

FIG. 16 is an illustration of a payment object in the form of a metal charm that is designed to operate as a coupling frame in conjunction with a transponder chip module.

Figure 17:
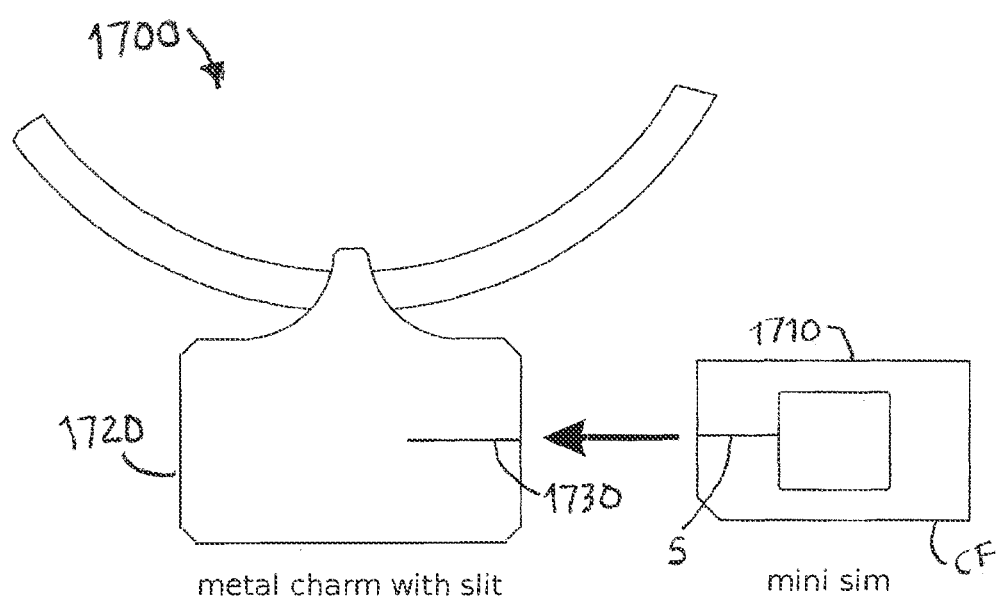

FIG. 17 shows a payment object in the form of a metal charm (of a charm bracelet) having a slit to function as a coupling frame, and a mini (or micro) SIM (subscriber identity module) card having a chip and a card body with a slit, for insertion into the metal charm. The SIM may have terminals for connection to the metal charm.

Figure 18A:
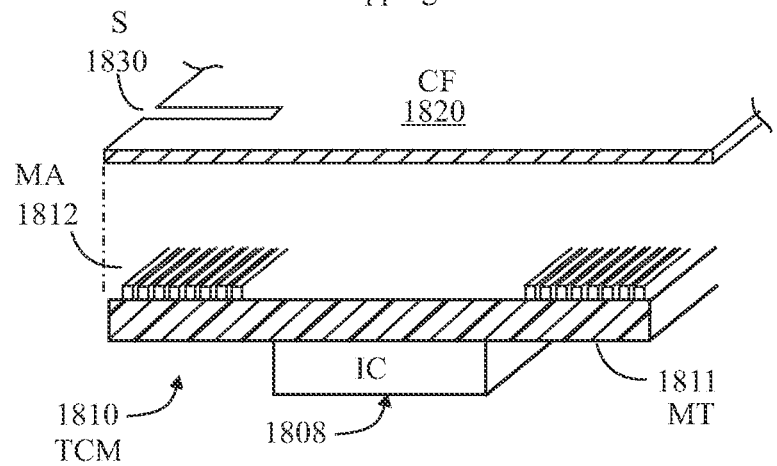

FIG. 18A is an exploded, partial perspective view of a coupling frame (CF) and transponder chip module (TCM).

Figure 18B:
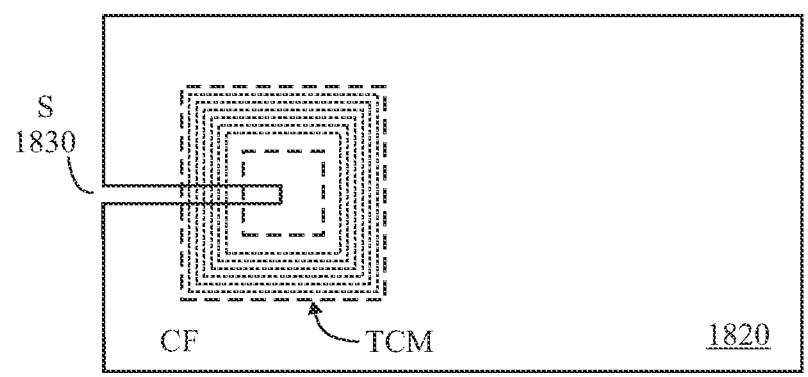

FIG. 18B is a plan view of a coupling frame (CF) and transponder chip module (TCM).

Figure 18C:
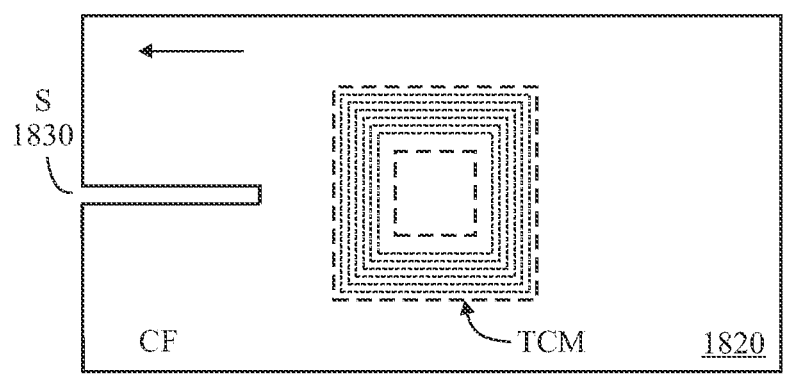

FIG. 18C is a plan view of a coupling frame (CF) and transponder chip module (TCM).

Figure 18D:
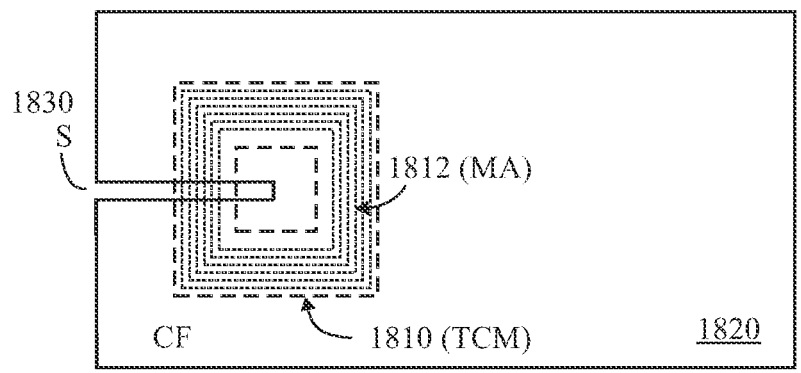

FIGS. 18D, E are plan views of a coupling frame (CF) and transponder chip module (TCM).

Figure 19:
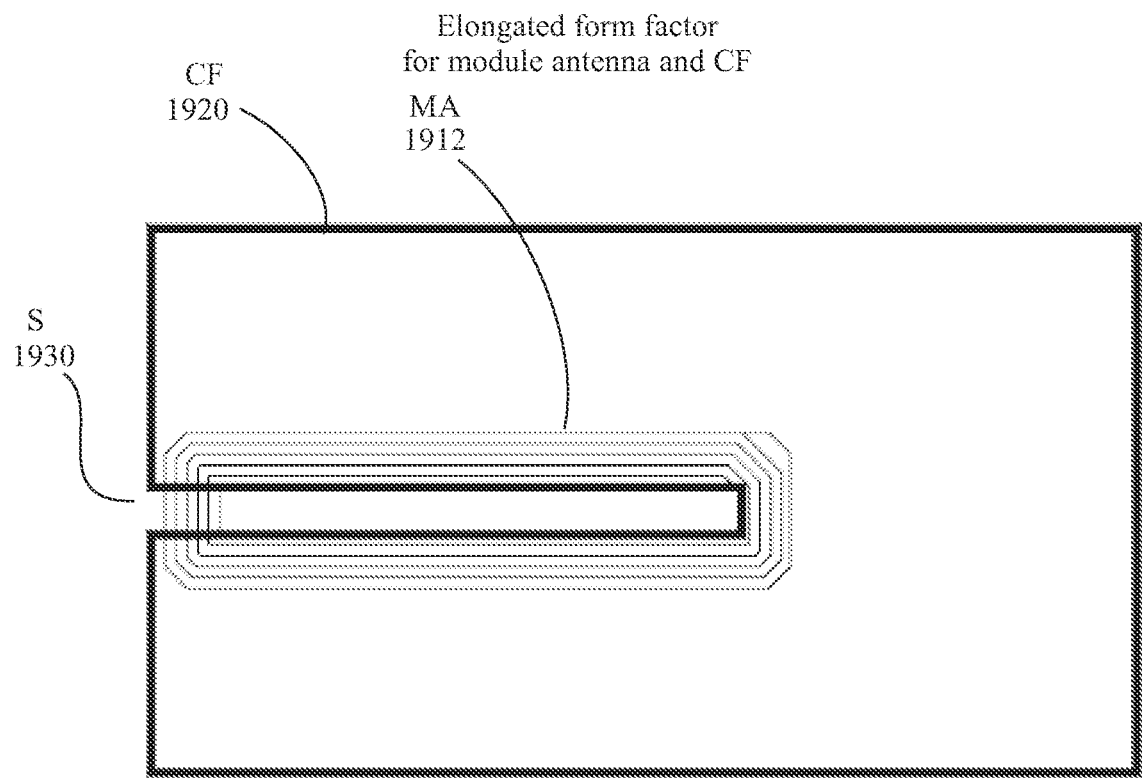

FIG. 19 is a diagram (plan view) of a coupling frame (CF) and module antenna (MA) of a transponder chip module (TCM) having an elongated form factor.

Figure 20:
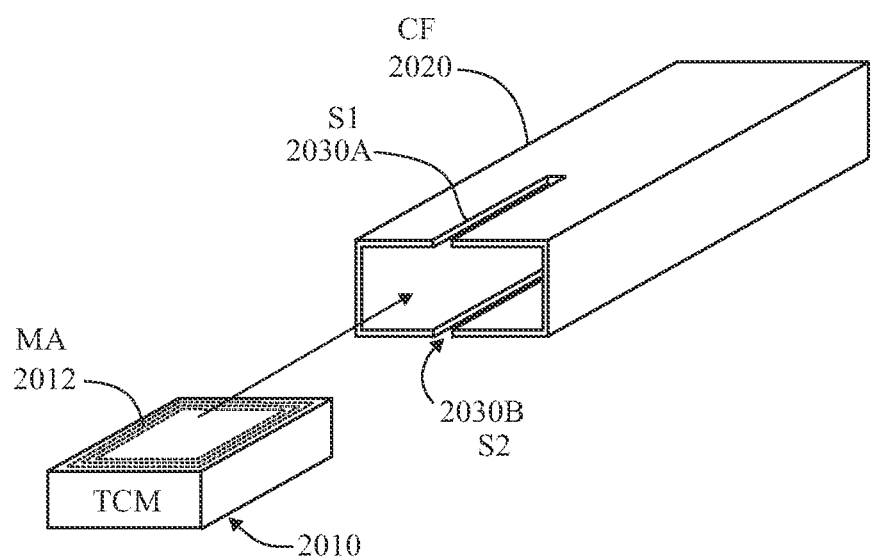

FIG. 20 is a perspective view of a coupling frame (CF) and transponder chip module (TCM).

Figure 21A:
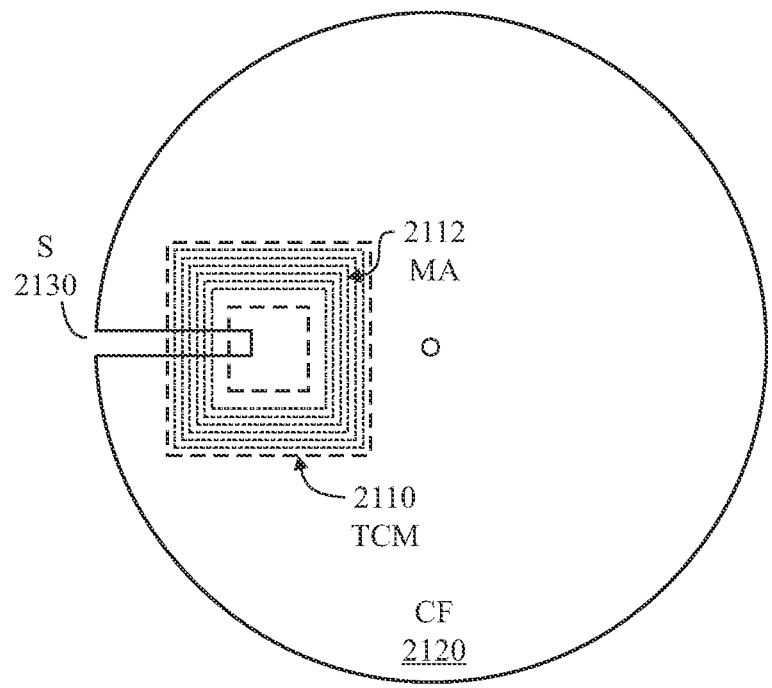

FIG. 21A is a plan view of a coupling frame (CF) and transponder chip module (TCM).

Figure 21B:
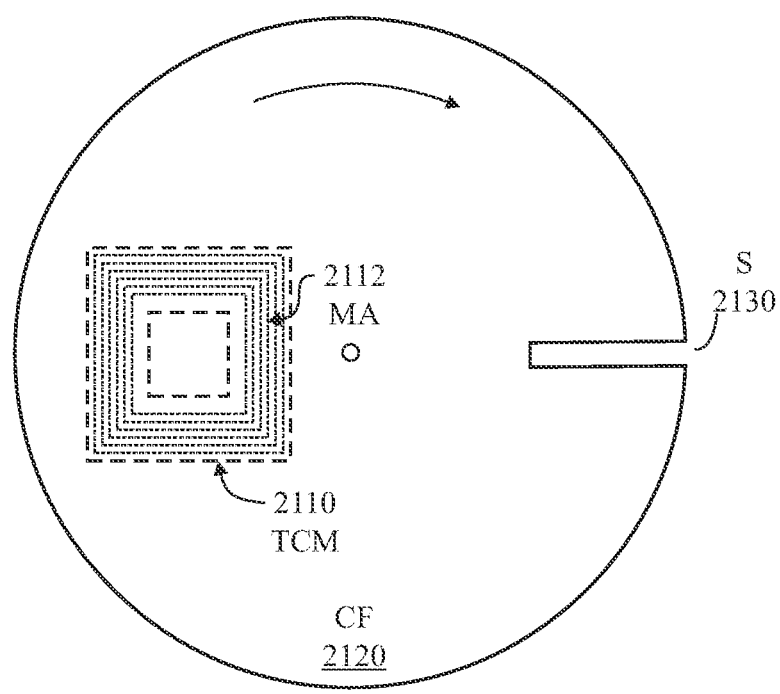

FIG. 21B is a plan view of a coupling frame (CF) and transponder chip module (TCM).

Figure 22:
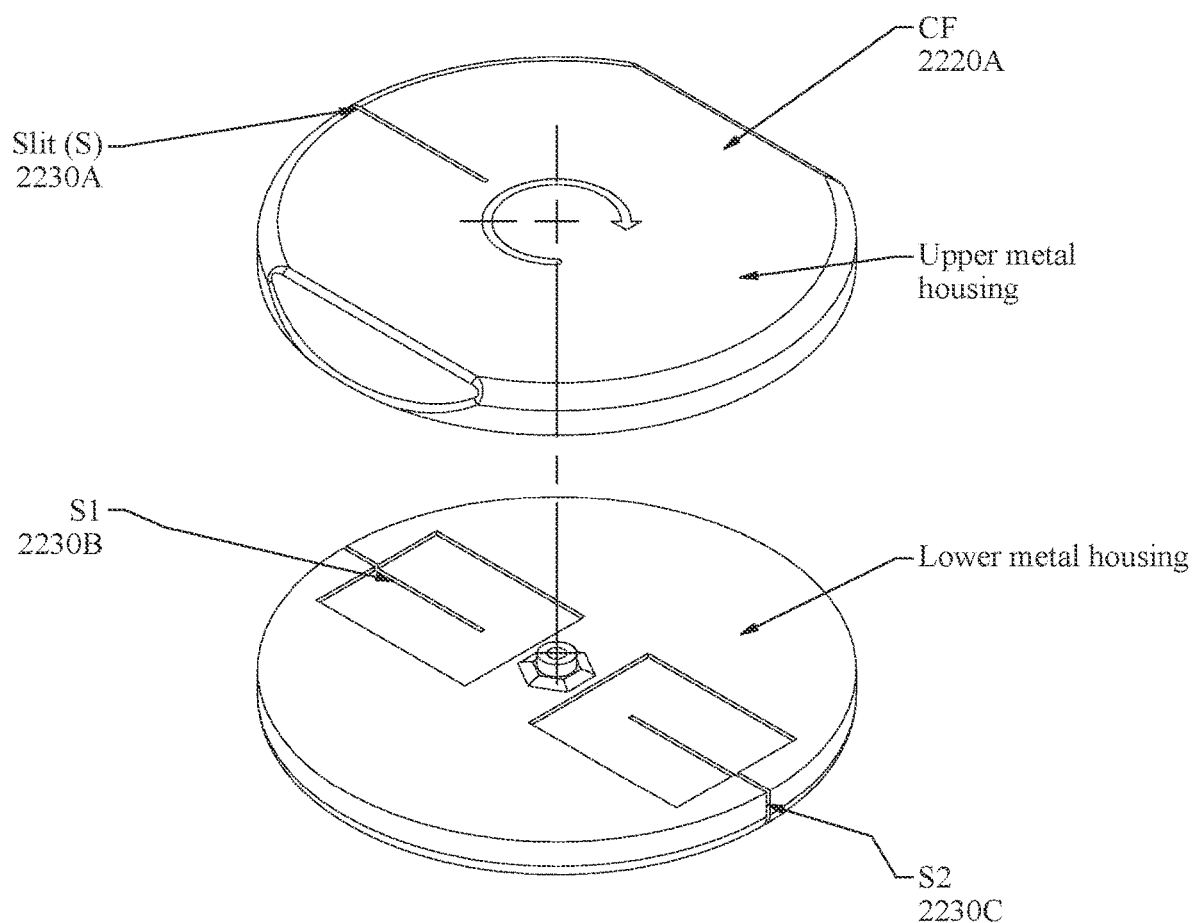

FIG. 22 is a perspective (exploded) view of a payment object comprising a metal rotational housing having components with slits to function as coupling frames, at least one of which is moveable for payment selection (enabling one of two transponder chip modules, not shown).

Figure 23:
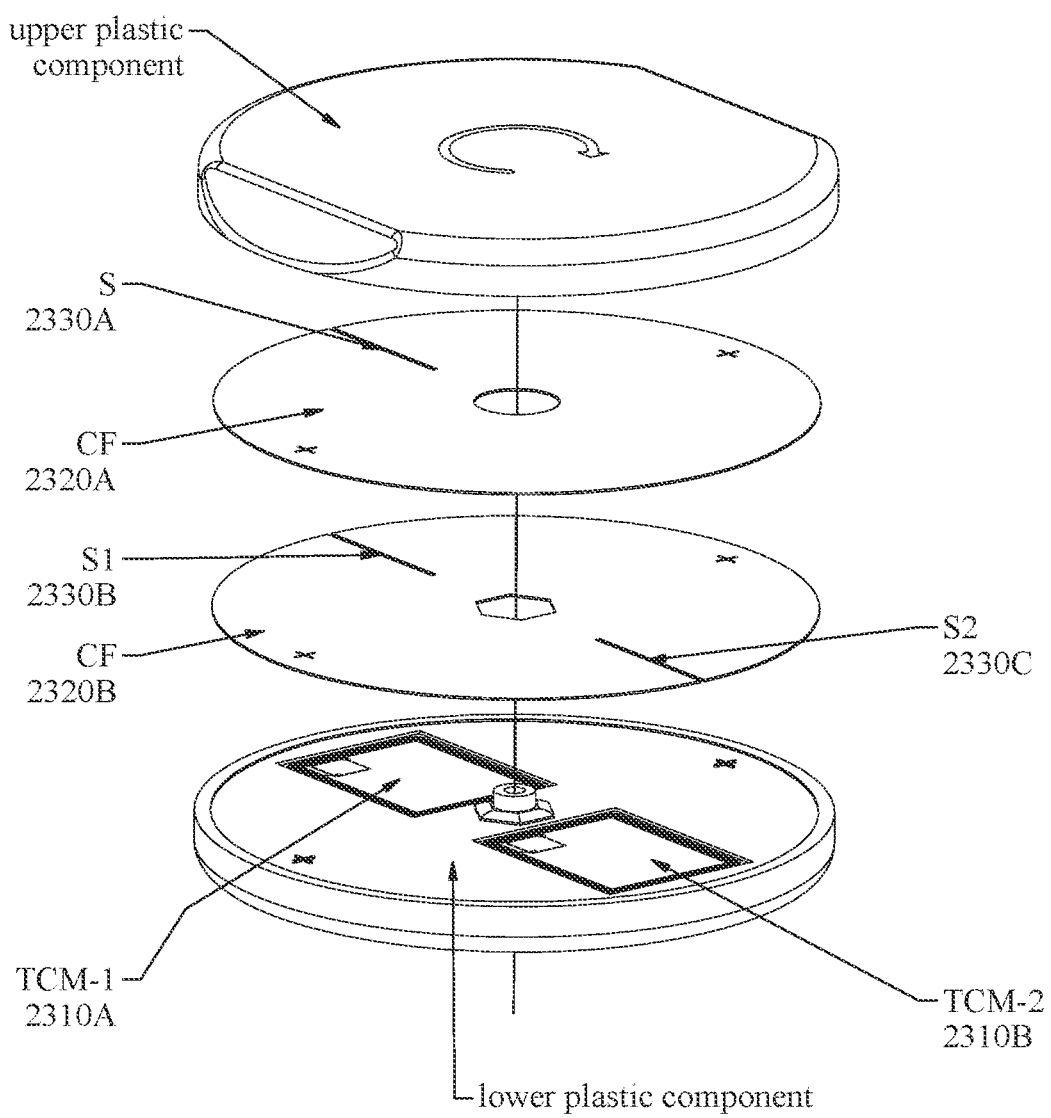

FIG. 23 is a perspective view (exploded) of a payment object comprising a plastic rotational housing with slitted metal plates functioning as coupling frames for payment selection.

Figure 24:
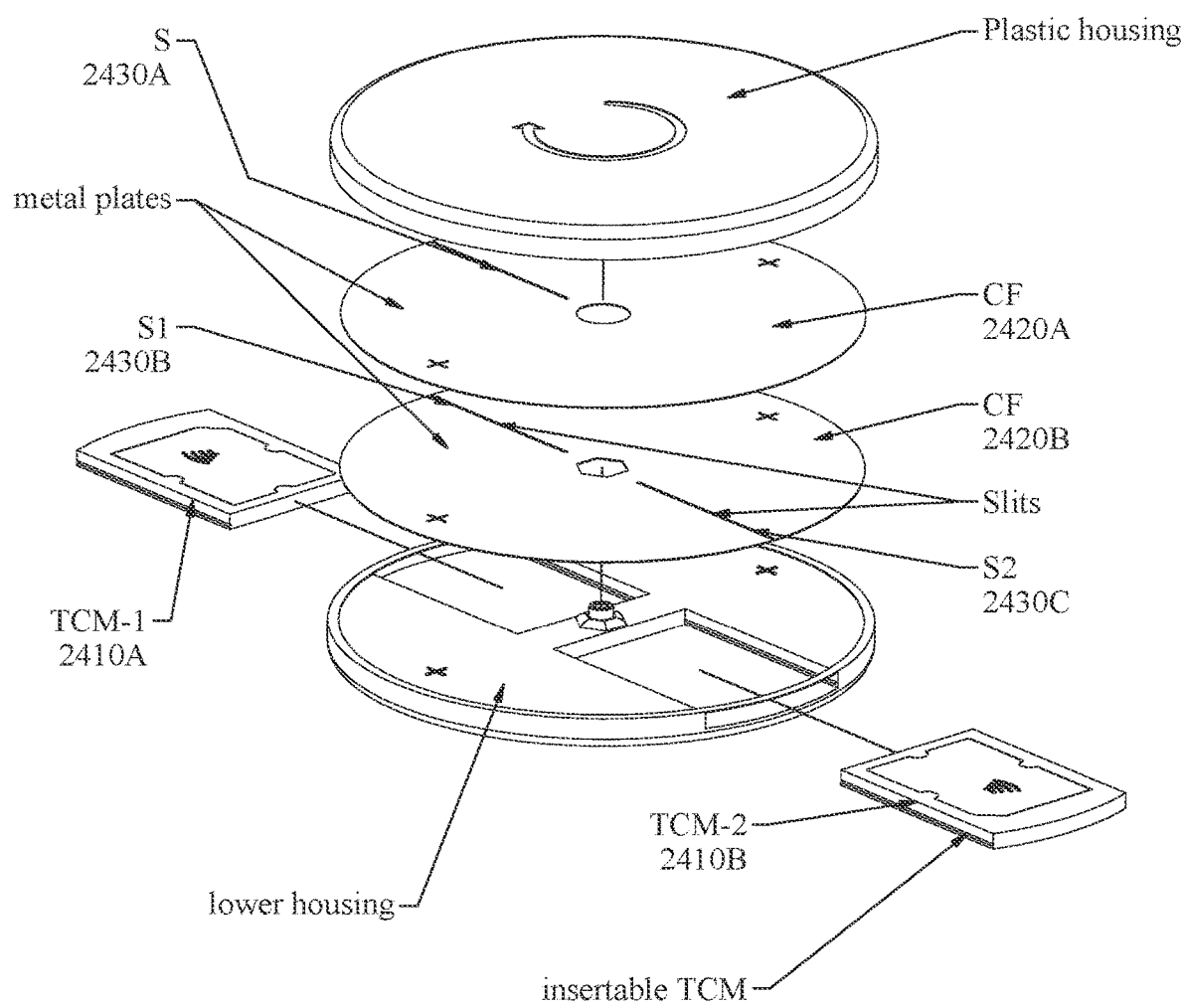

FIG. 24 is a perspective view (exploded) of a payment object comprising a plastic rotational housing with slitted metal plates functioning as coupling frames for payment selection, and adapted to receive insertable transponder chip modules having SIM form factor.

Figure 25A:
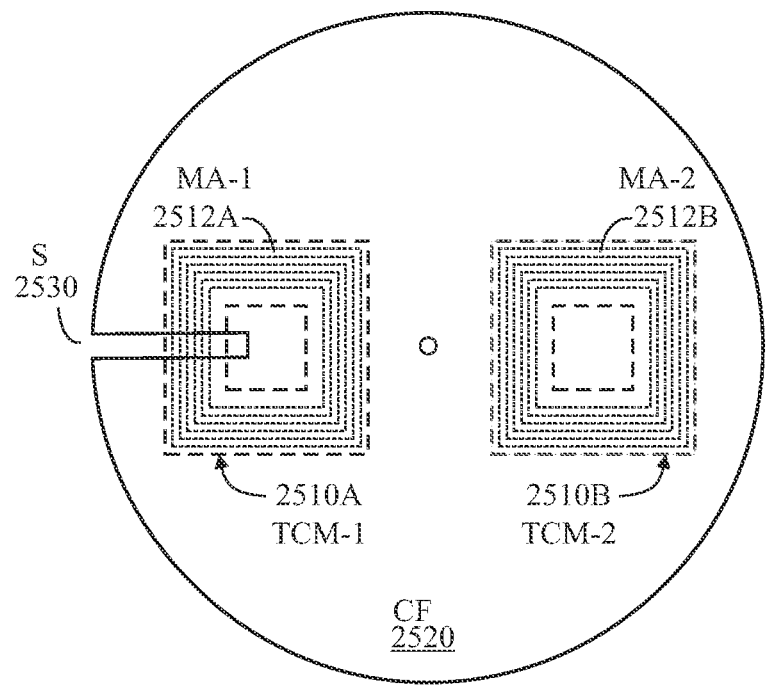

FIG. 25A, B are diagrams (plan view) of a coupling frame (CF) and two transponder chip modules (TCM), with payment selection (enabling one of two transponder chip modules).

Figure 25B:
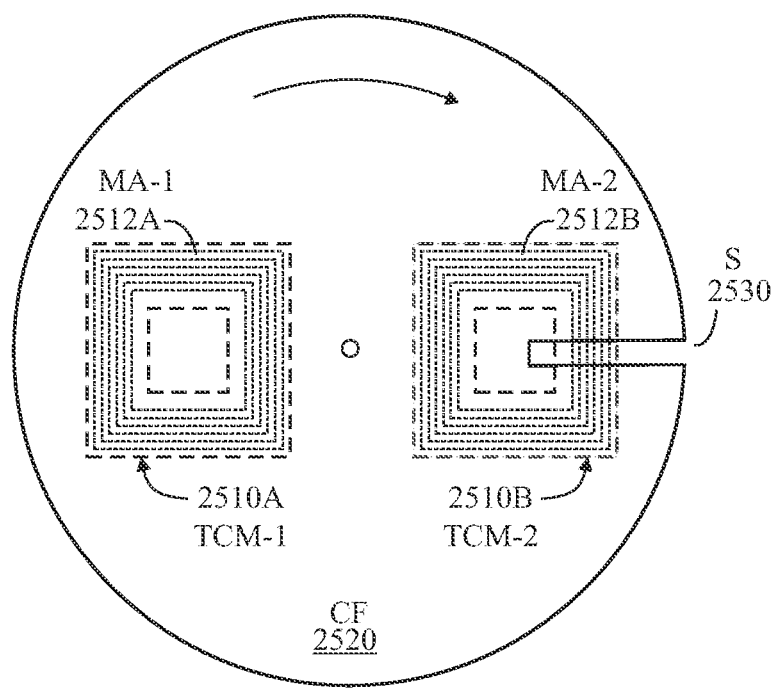
Figure 25C:
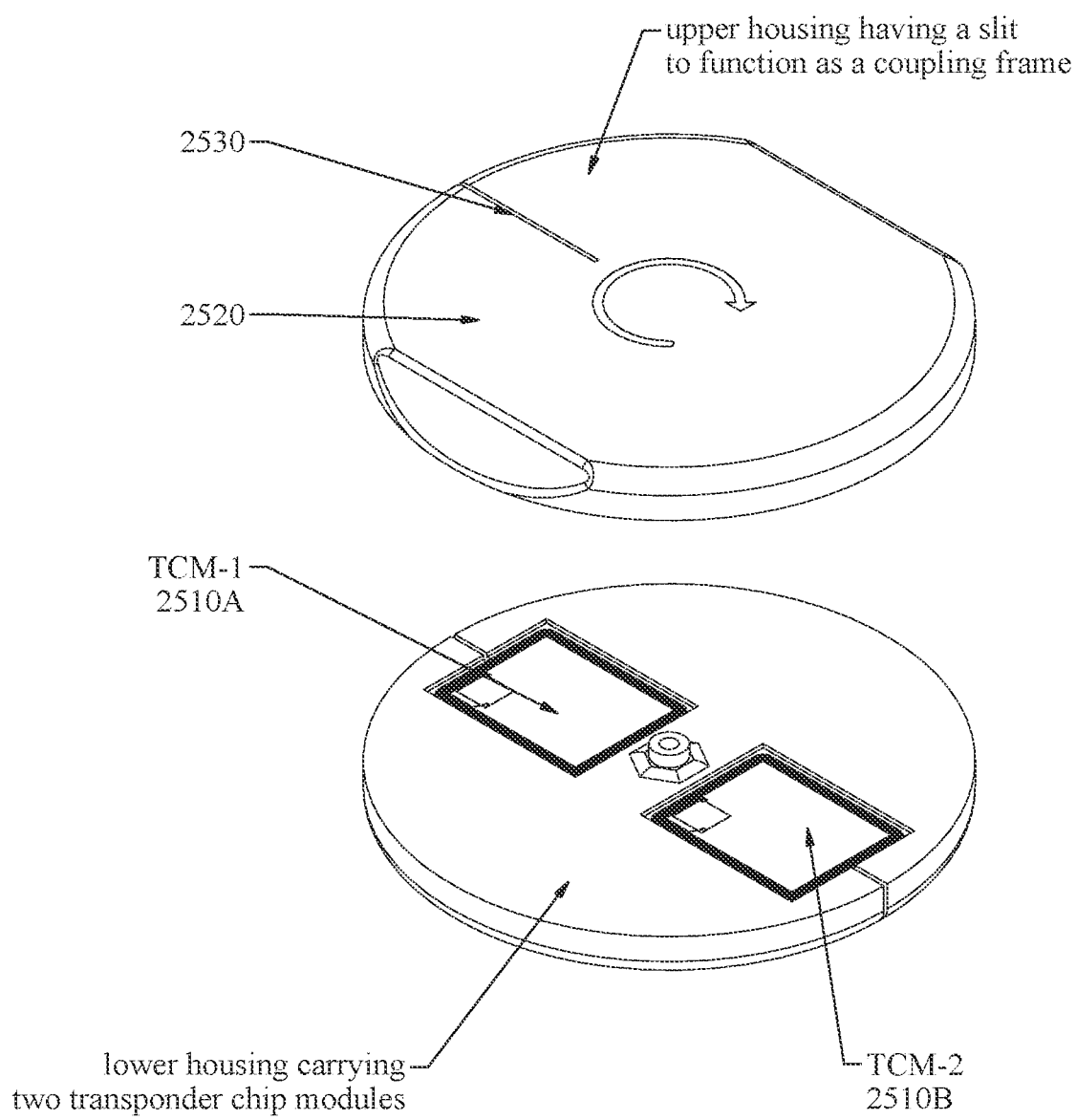

FIG. 25C is a perspective view (exploded) of a payment object with payment selection, comparable to FIG. 25A,B.

Figure 26A:
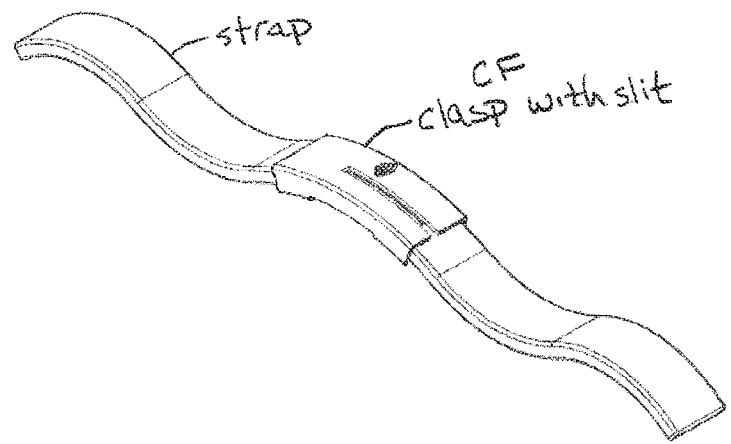
Figure 26B:
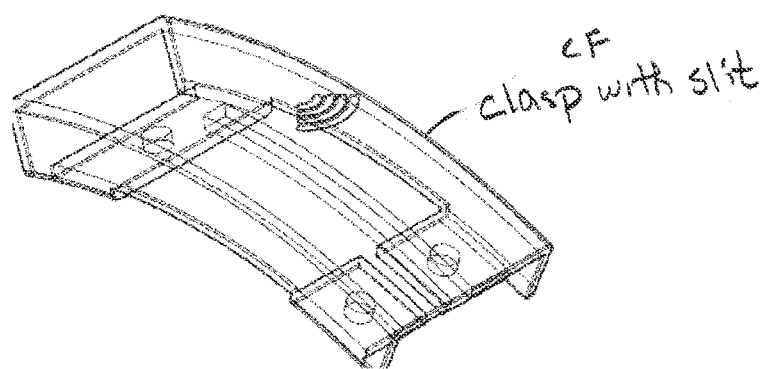

FIGS. 26A, B are perspective views of a payment object comprising a wristband strap and clasp (or buckle) incorporating a coupling frame and a transponder chip module.

Figure 27:
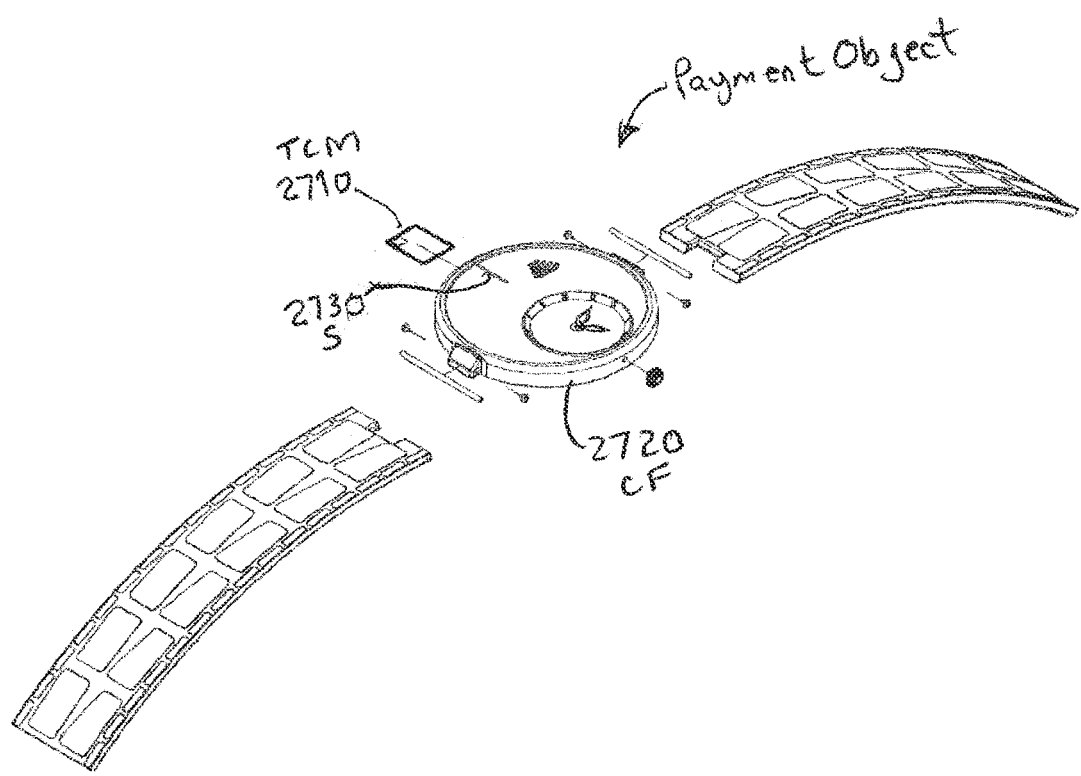

FIG. 27 is a perspective view (exploded) of a payment object comprising a wristwatch.

Figure 28:
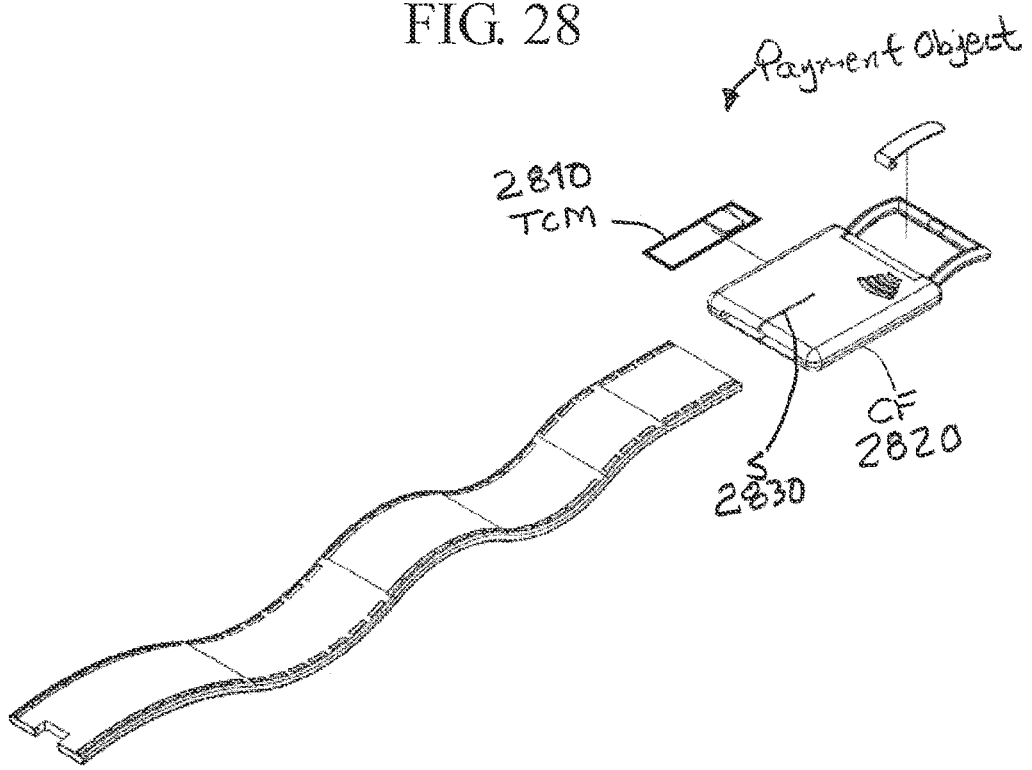

FIG. 28 is a perspective view (exploded) of a payment object comprising a buckle.

Figure 29:
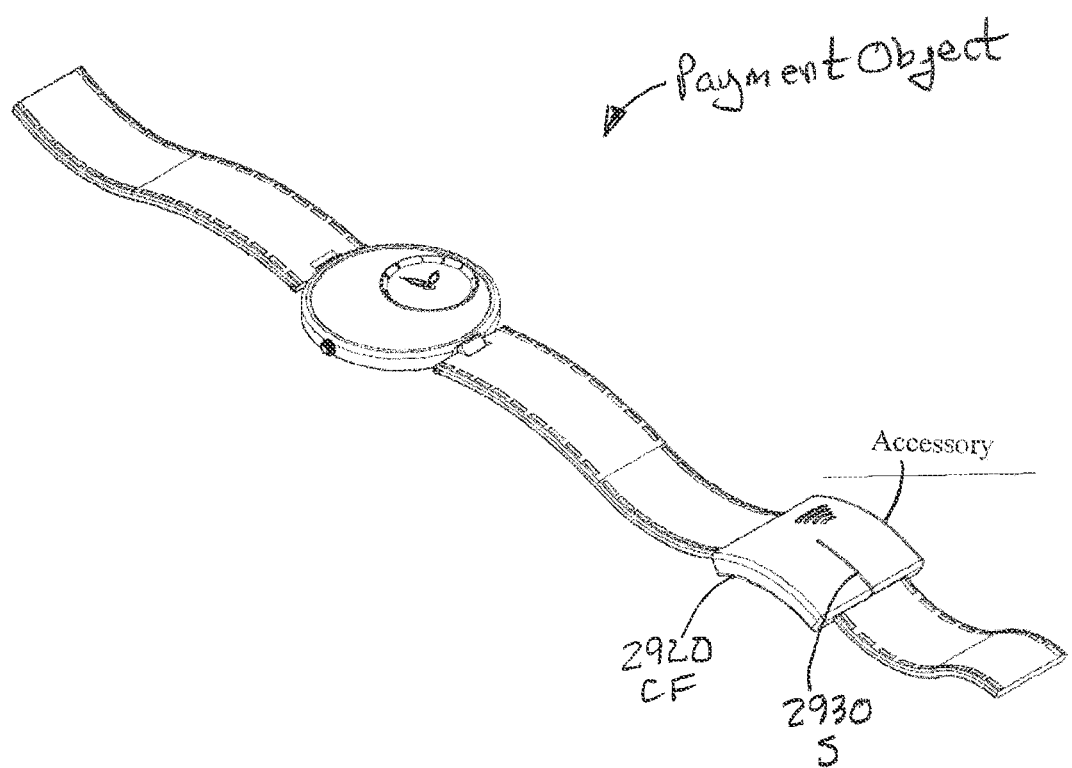

FIG. 29 is a perspective view (exploded) of a payment object comprising a payment accessory that can fit over a typical watch or other armband strap.

Figure 30:
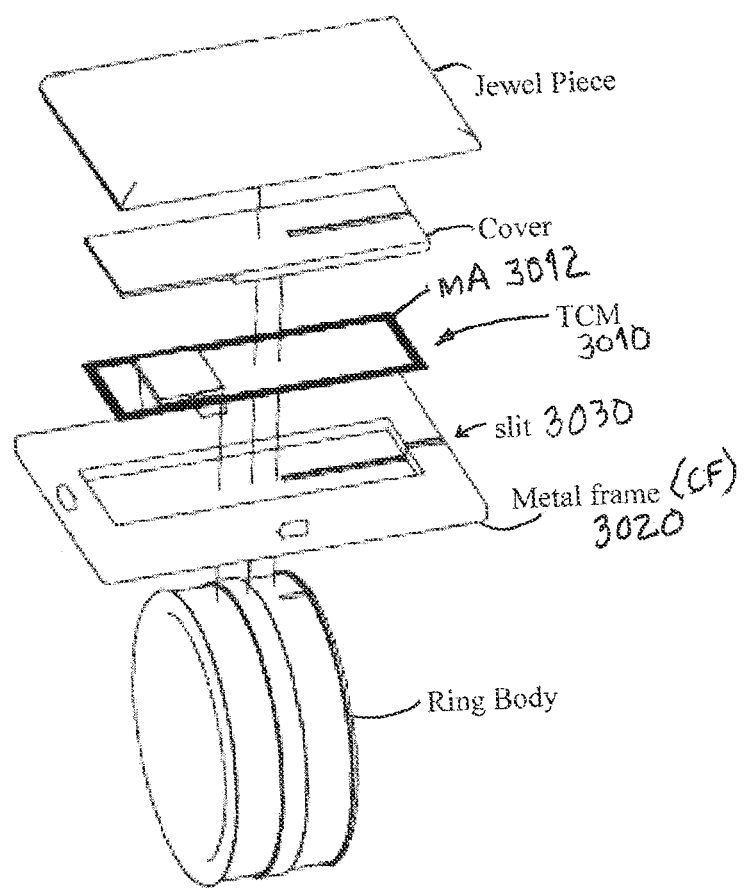

FIG. 30 is a perspective view (exploded) of payment object comprising a ring accessory.

Figure 31:
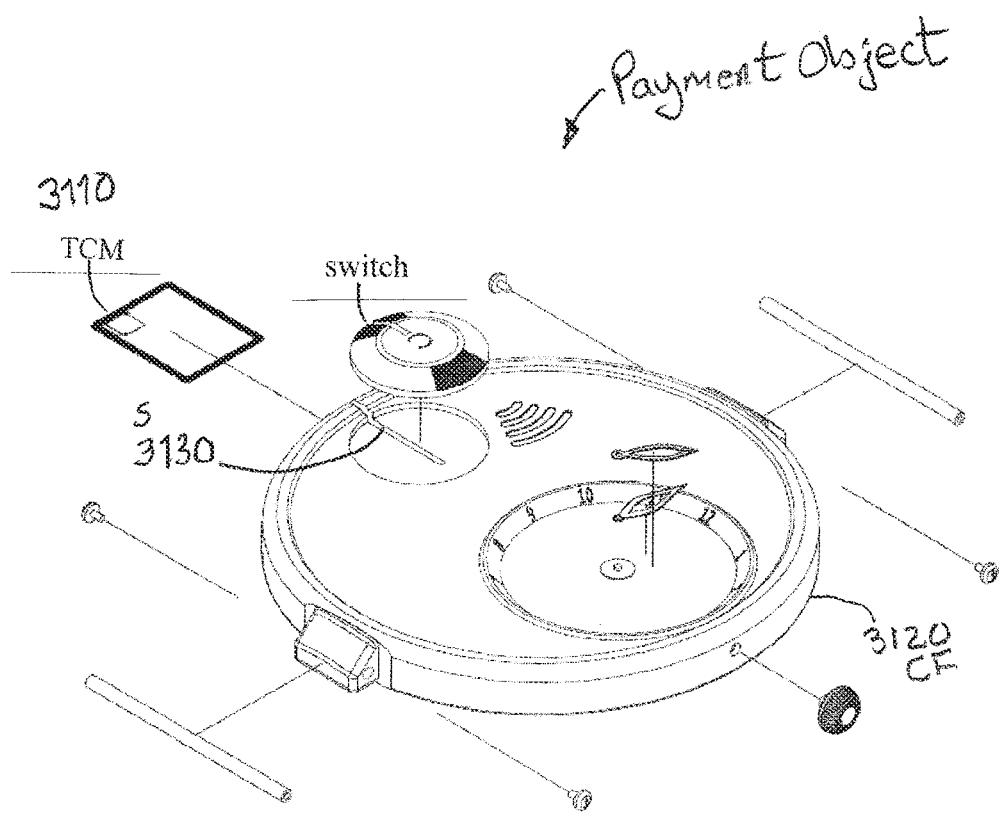

FIG. 31 is a perspective view (exploded) of a payment object comprising a watch with switchable payment function.

Figure 32:
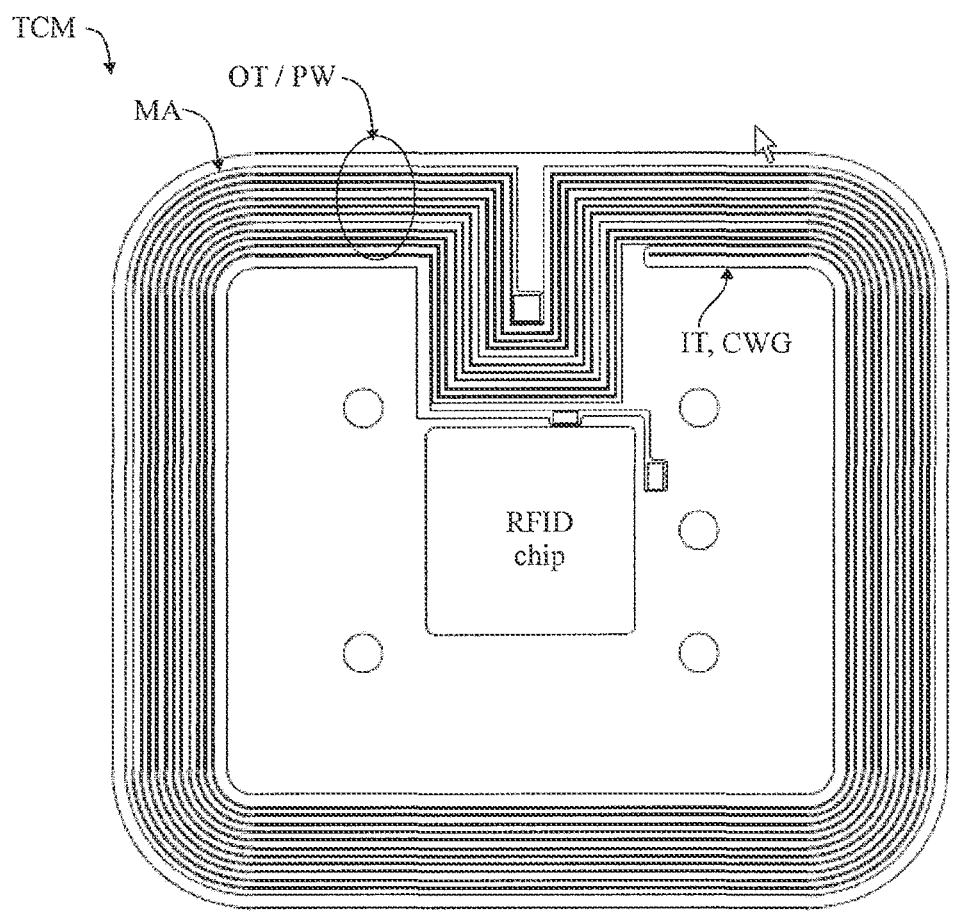

FIG. 32 is a plan view of a transponder chip module (TCM) having a U-shaped module antenna (MA).

DETAILED DESCRIPTION

Various embodiments (or examples) may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment is included in at least one embodiment of the present invention. Some embodiments may not be explicitly designated as such ("an embodiment").

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity. Elements referred to in the singular (e.g., "a widget") may be interpreted to include the possibility of plural instances of the element (e.g., "at least one widget"), unless explicitly otherwise stated (e.g., "one and only one widget").

In the following descriptions, some specific details may be set forth in order to provide an understanding of the invention(s) disclosed herein. It should be apparent to those skilled in the art that these invention(s) may be practiced without these specific details. Any dimensions and materials or processes set forth herein should be considered to be approximate and exemplary, unless otherwise indicated. Headings (typically underlined) may be provided as an aid to the reader, and should not be construed as limiting.

Some processes may be presented and described in a series (sequence) of steps. It should be understood that the sequence of steps is exemplary, and that the steps may be performed in a different order than presented, some steps which are described may be omitted, and some additional steps may be omitted from the sequence and may be described elsewhere.

Reference may be made to disclosures of prior patents, publications and applications. Some text and drawings from those sources may be presented herein, but may be modified, edited or commented to blend more smoothly with the disclosure of the present application. Citation or identification of any reference should not be construed as an admission that such reference is available as prior art to the disclosure.

FIG. 1 is a diagram (cross-sectional view) of a conventional dual-interface smart card (SC) and readers, as exemplary of an RFID device. This RFID device is "dual interface" since it can interact either with external contact readers (e.g., ISO 7816) or with contactless readers (e.g., ISO 14443, 15693).

FIG. 1 illustrates a smart card SC (100) in cross-section, along with a contact reader (e.g., ISO 7816) and a contactless reader (e.g., ISO 14443). An antenna module (AM, or transponder chip module TCM) 102 may comprise a module tape (MT) 110, an RFID chip (CM or IC) 112 disposed on one side (face-down) of the module tape MT along with a module antenna (MA) 114 for interfacing with the contactless reader. The antenna module (AM) may comprise contact pads (CP) 116 disposed on the other (face-up) side of the module tape (MT) for interfacing with the contact reader. The card body (CB) 120 comprises a substrate which may have a recess (R) 122 extending into one side thereof for receiving the antenna module (AM). (The recess R may be stepped—such as wider at the surface of the card body (CB)—to accommodate the profile of the antenna module AM.) The booster antenna (BA) 130 may comprise turns (or traces) of wire (or other conductor) embedded in (or disposed on) the card body CB, and may comprise a number of components such as (i) a card antenna (CA) component 132 and (ii) a coupler coil (CC) component 134. It may be noted that, as a result of the recess R being stepped, a portion of the card body (CB) may extend under a portion of the antenna module (AM), more particularly under the module antenna (MA).

In the main, hereinafter, RFID devices having only a contactless interface (and not having a contact interface) may be described. In the main, hereinafter, RFID devices having a coupling frame rather than a booster antenna may be described.

Some Definitions

As used herein, a transponder chip module TCM, which may be referred to simply as a "transponder", is typically a component of an RFID device such as a smartcard, or a payment object and may comprise (i) a support substrate or module tape MT, (ii) an RFID chip (IC, CM) and (iii) a module antenna (MA), connected with the RFID chip. The transponder chip module may be referred to in some descriptions simply as the "module" or as the "transponder". It may also sometimes be referred to as an antenna module (AM) or antenna chip module.

A transponder chip module may be capable of communicating at least contactlessly (e.g., ISO 14443, 15693) with another RFID device such as an external contactless reader (such as at a point of sale terminal). The RFID chip in the transponder may also support a contact interface (e.g., ISO 7816), resulting in a dual-interface module. Typically, the payment objects disclosed herein may operate purely in a contactless mode.

A transponder may be a "passive" transponder which does not have its own power source (e.g., battery), but rather which receives (harvests) its operating power from an external reader (interrogator) rather than, for example, from a battery. An "active transponder" may have its own internal power source, such as a battery. A battery-assisted passive device may have a small battery on board and is activated when in the presence of an RFID reader.

The module antenna (MA) may be planar antenna structure comprising a single long conductive track having two ends connected with corresponding two terminals of the RFID chip. The module antenna may be laid out in a spiral pattern comprising several (such as 10-15) "traces" (sometimes referred to as "tracks"), separated by spaces (sometimes referred to as "gaps"). The module antenna may be formed by etching (either chemical etching or laser etching) of a conductive layer on the module tape (or a conductive foil applied to the module tape). The track (or trace) width may be approximately 100 μm, and may vary from end-to-end. The gap width may be approximately 25 μm and may vary along the length of the module antenna. The overall length of the module antenna may be approximately 400 mm. The traces of the module antenna may sometimes be referred to as windings since the module antenna MA (or antenna structure AS) is analogous to a wire-wound antenna. The techniques disclosed herein may also be applicable to module antennas which are wire-wound or formed by embedding wire, having a number of turns and two ends.

The module antenna may be disposed as a single long conductive track which may be in the form of a rectangular spiral disposed in a generally rectangular path or band around a peripheral annular area of the module tape. An annulus is a plane figure consisting of the area between a pair of concentric circles—i.e., the area inside the outer circle and outside the inner circle). A square annulus is the planar shape contained between two concentric axis-parallel squares, i.e., two squares with a common center whose sides are parallel to the x- and y-axes. The annular area occupied by the module antenna may be rectangular, or other than rectangular, such as square or circular. In the examples described herein, the module antenna typically resides in a generally square rectangular annular area, and the module antenna may be considered to have four "sides".

The module antenna (or simply "antenna", or "planar antenna", or "antenna structure", or "laser-etched antenna structure") may be disposed on the same face-down side of the module tape as the RFID chip. The RFID chip may be disposed in a central area of the module tape which is devoid of antenna traces, and which may be referred to as "no man's land". The RFID chip may be disposed on an opposite side of the module tape from the module antenna. Additional antenna structures such as a second module antenna or capacitive stubs may be connected with the module antenna. See U.S. Pat. No. 8,474,726. In no-man's land, a metal foil or layer (or cladding), on either side of the module tape may be segmented, as disclosed for example in U.S. Ser. No. 14/619,177 filed 11 Feb. 2015 (not published, yet).

The traces on a given side of the module antenna may be modified so that the turns thereof extend inward into the no-mans land, typically to relocate an outer end of the module antenna closer to the RFID chip for connecting (such as by wire bonding) thereto. This may result in one side of the module antenna being U-shaped. See U.S. Ser. No. 14/619,177 filed 11 Feb. 2015 (not published yet). See WO 2014016332 (2014 Jan. 30, Linxens Holding).

Magnetic materials may be used to increase the effective size of an RFID antenna and the concentration of magnetic flux. As used herein, "magnetic particles" may refer to particles that are conductive, having a resistance of hundreds of ohms, in contrast with ferrite particles. The materials may be performed by sintering or high pressure lamination (with or without an additional binder) into a size approximately matching the internal area of the antenna. The magnetic material may comprise ferrites or conductive non-ferrites (having a resistance of hundreds of ohms). The magnetic material may in the form of flakes of the order of a hundred microns in lateral size and a few microns in thickness. The magnetic material, once formed into a suitable shape, may be deposited or placed in the plane of the antenna or adjacent to the antenna. In addition, such magnetic material may be used in conjunction with a coupling frame whereby the magnetic is placed over some or all of the coupling frame in order to redirect magnetic flux lines and improve the performance of the TCM.

Coupling Frames

According to some embodiments of the invention, the booster antenna in an RFID device may be eliminated, or replaced by a "coupling frame" (CF). Generally, the overall function of both a booster antenna and a coupling frame are to enhance (improve) coupling and communication between a transponder chip module (TCM) and an external contactless reader (or with another RFID device).

As used herein, a coupling frame (CF) may generally comprise a conductive, planar surface or element (such as a conductive layer, or a conductive foil) having an outer edge, and discontinuity such as a slit (S) or a non-conductive stripe extending from the outer edge of the conductive surface to an interior position thereof. The coupling frame may be a curved surface, rather than being planar.

Most of the coupling frames described herein may have a "continuous" surface, and may comprise a foil or sheet or layer of metal having a slit (an electrical discontinuity) for overlapping a module antenna and, in some cases having an appropriate opening (MO) for accommodating mounting the transponder chip module. Coupling frames may be printed, and may be made up of a wire grid or array (such as wire embedding wire (copper or silver) and making a physical connection through overlapping wires to create a coupling frame. The coupling frame could also be a metal mesh. Coupling frames made of mesh or wire are exemplary of "discontinuous" surface coupling frames. Reference may be made to FIG. 6A of US 20150136858 which shows a smartcard (SC) having a coupling frame (CF) formed by embedding wire. In either case (continuous surface or discontinuous surface), the coupling frame comprises a "surface" or a "conductive surface", and a slit. The slit may be referred to as a slot or a gap.

When referring to the overall coupling frame as being "continuous", it should be understood that the slit (S) represents a mechanical and electrical discontinuity. A "discontinuous" coupling frame could be made from a mesh, or from embedding wire in a suitable pattern in a substrate, both of which would be arranged to exhibit a slit/discontinuity.

In use, a coupling frame may be disposed closely adjacent to (in close proximity, or juxtaposed with) a transponder chip module (TCM) having a module antenna (MA) so that the slit (S) overlaps (traverses, over or under) at least a portion of the module antenna. For example, the slit (S) may extend from a position external to the module antenna, crossing over (or overlapping) at least some of the traces of the module antenna, such as extending over all of the traces on one side of the module antenna and may further extend into the interior area (no-man's land) of the module antenna.

In use, the coupling frame CF may be positioned so that the slit S overlaps or traverses at least some of the traces of the module antenna MA on at least one side thereof. The slit S may extend at least partially, including completely across only one side of the module antenna, and may extend further across a central area ("no-mans land") of the module antenna (devoid of traces) to the opposite side of the module antenna. The coupling frame and the module antenna may both be substantially planar, positioned very close together, parallel with one another, and separated by an air gap or dielectric layer which may be no greater than 100 µm, 50 µm or 20 µm. Generally, the closer the coupling frame is to the module antenna (smaller separation), the better the communication (such as read/write performance) with the external contactless reader will be. With increasing separation distance, the read/write performance may degrade.

The coupling frame may enhance communication (signal, power) between an external contactless reader and the transponder chip module when the slit is positioned across (to traverse) the traces of the module antenna on at least one side thereof.

Transponder chip modules are conventionally incorporated into RFID devices which are smart cards (including plastic smartcard, metal smartcard, hybrid smartcard). A coupling frame can be incorporated into the smart card. Refer to US 20140361086 and US 20150021403. A coupling frame may be incorporated into the transponder chip module itself. Refer to US 20150136858. As disclosed herein, transponder chip modules may be incorporated into other RFID devices, such as payment objects comprising wearable devices, smart jewelry and payment accessories.

A coupling frame may be incorporated in metal payment devices to enable contactless communication. A coupling frame may be incorporated in any RFID device having multiple transponder chip modules to selectively enable communication with a given one of the transponder chip modules. Multiple coupling frames may be incorporated into a given RFID device. A coupling frame may substitute (eliminate the need) for a booster antenna in an RFID device.

Incorporating Coupling Frames into RFID Devices

According to the invention, generally, a transponder chip module (with or without its own coupling frame) can be incorporated into an RFID device such as a smartcard or a payment object. The device may constitute a passive transponder.

A smartcard may comprise a metal layer which is modified (typically with a slit appropriately located vis-à-vis the module antenna) to function as a coupling frame.

An entire metal card body of a metal smart card may be provided with a slit (S, or other discontinuity) to function as a coupling frame.

a metal layer of a hybrid smartcard (having dielectric layer and metal layer) may be provided with a slit (S, or other discontinuity) to function as a coupling frame.

A payment object may comprise a "wearable" device embodied in a jewelry item, bangle, bracelet or the like having a metal component modified (typically with a slit appropriately located vis-à-vis the module antenna) to function as a coupling frame.

A card body can be made from aluminum and directly coloured by anodizing procedures. Jewelry items may be manufactured to have a rustic appearance that wears (or acquires a patina) during use such that the appearance of the product improves over time.

Metal jewelry items having transponders incorporated therein may operate as payment objects. To insert a transponder into a metal casing or a metal charm, the metal would normally operate like a faraday cage with all electromagnetic transmission, and reception would be impaired. As disclosed herein, by providing a slit or slot (or an insulating strip or stripe) in a metal component of the metal charm so that the component may function as a coupling frame. A transponder device (with or without its own coupling frame integrated therein) may be located, embedded or inserted into the metal charm and can couple with the metal charm which in turn couples with the external contactless reader generating the electromagnetic field.

By incorporating a coupling frame into the device, contactless communication between the RFID chip of the transponder chip module and an external RFID reader or another RFID device may be enhanced or enabled.

The slit (S) in a coupling frame may be linear (straight), and may have a width of approximately 1-2 mm and a length of approximately 8-13 mm, but may have other dimensions and form factors. The slit (S) may be arranged to overlap (traverse) the traces of the module antenna at 90° thereto, or at another angle. The slit (S) may be other than straight.

It should be understood that the coupling frame may be on a different plane than the module antenna. The slit of the coupling frame may overlap or traverse at least some outer turns (or traces) of the module antenna on one side thereof, including overlapping all of the turns of the module antenna on the one side thereof and extending into (above) the inner area (no-mans land) of the module antenna. The slit may be long enough to overlap one or more turns of the module antenna on an opposite side of the module antenna. The slit may be wide enough to overlap one or more inner turns of the module antenna on one or both adjacent side(s) of the module antenna.

A transponder chip module (with or without its own coupling frame) can be incorporated into an RFID device which may be a smartcard or other payment object.

A coupling frame may be movable so as to selectively enable (enhance) or disable (suppress) communication with a transponder chip module incorporated into the RFID device. A coupling frame may be associated with two or more transponder chip modules in a single RFID device, and may be movable to selectively enable one or the other of, or neither one of the transponder chip modules.

Smart Card with Coupling Frame

US 20140361086 discloses a conductive coupling frame (CF) having two ends, forming an open loop, disposed surrounding and closely adjacent a transponder chip module (TCM), and substantially coplanar with an antenna structure (AS, LES) in the transponder chip module (TCM). A metal card body (MCB) having a slit (S) extending from a module opening (MO) to a periphery of the card body to function as a coupling frame (CF). The coupling frame (CF) may be thick enough to be non-transparent to RF at frequencies of interest. A switch may be provided to connect ends of the coupling frame (CF) across the slit (S). The transponder chip module (TCM) may comprise a module antenna (MA) which is a laser-etched antenna structure (LES) and a non-perforated contact pad (CP) arrangement.

FIG. 2A shows an example of a smart card 200 with a coupling frame (CF) 220 incorporated into its card body (CB) 202 which has a stepped recess (R). A transponder chip module (TCM) 210 has a planar antenna (PA) which may be a laser-etched antenna structure (LES) 212. The coupling frame (CF) has an opening (MO) 208 for receiving the transponder chip module (TCM). The coupling frame (CF) may have a slit (not visible) extending from the opening (MO) to an outer edge of the coupling frame (CF). The dashed line indicates, schematically, that the coupling frame may comprise a metal layer in a stackup of a card body. An inner edge of the coupling frame (CF) may overlap (or underlie) at least some outer turns of the module antenna (MA), which may be a planar antenna (PA) which is laser-etched antenna structure (LES) in the transponder chip module (TCM). Viewed from another perspective, an outer portion of the module antenna (MA may overhang an inner portion of the coupling frame (CF). The coupling frame (CF) may enhance communication between the transponder chip module and another RFID device such as a contactless reader. The transponder chip module may be dual-interface, supporting both contactless and contact communication with external readers.

FIG. 2B illustrates a transponder chip module (TCM) 210 disposed in the card body (CB) 202 of a metal smartcard (SC) 200, or metal card (MC), wherein substantially the entire card body (e.g., 760 µm thick) comprises metal, and may be referred to as a metal card body (MCB). The transponder chip module (TCM) may reside in an opening (MO) 208 extending completely through the card body. The opening may be stepped, having a larger area portion and smaller area portion, as shown. This may result in a void 203 behind the transponder chip module (TCM), and the void may be filled with non-conductive filler 204. In a conventional metal smart card (not having a slit to function as a coupling frame), the void behind the transponder chip module may allow electromagnetic radiation from an external reader to interact with the transponder chip module.

A slit (S) 230 extends from an outer edge of the metal card body (MCB) to the opening (MO) and may overlap (underneath, as viewed) an outer portion of the module antenna (MA) 212 which may be a laser-etched antenna structure (LES). Similarly, a slit may be provided through a metal layer of a hybrid smart card. The slit (S) modifies the metal card body (MCB) or layer, allowing it to operate as a coupling frame 220 to enhance contactless communication with the transponder chip module.

FIG. 2B is illustrative of a coupling frame 220 substantially surrounding a transponder chip module and having an opening to accommodate the transponder chip module.

Although a module opening for the transponder chip module may be shown in the illustrations of this and some other embodiments, it should be understood that many of the techniques described herein may be applicable to coupling frames having a slit, without a module opening. Such coupling frames may not be strictly coplanar with the transponder chip module, but they may be disposed closely adjacent and parallel thereto.

Metal payment objects such as metal smart cards may feature a cavity to accommodate the transponder chip module TCM. The cavity may not completely penetrate the payment object, or it may be covered from one face by a continuous metal. The transponder chip module may be shielded from the continuous metal layer by magnetic shielding material. This allows the cavity to be concealed. In addition the slit may be concealed by jewels or crystals.

The magnetic shielding may be in the form of a pre-laminated composite material made of beads or flakes of a magnetic material, e.g. iron-based alloy such as Sendust (a ferrite material) within a polymer matrix. Alternatively a sintered block of magnetic material may be used. Any composition of magnetic shielding material may be used so as to reduce (including prevent) attenuation of electromagnetic signal strength and/or compensate for resonance frequency shifts resulting from the metal cavity cover or cavity body.

As discussed in US 20140361086, a coupling frame CF is typically a planar element having a opening or cavity in its body, and a slit (or other electrical discontinuity) extending from the opening to a periphery (edge) of the coupling frame CF. The slit makes the coupling frame "open loop". Typically, the coupling frame CF is disposed closely adjacent to a transponder chip module TCM so that the slit S of the coupling frame CF extends generally perpendicular to and over (overlaps) at least a portion the module antenna MA of the transponder chip module TCM. Since the coupling frame is generally coplanar with the transponder chip module, a "central" opening MO in the coupling frame may accommodate a portion of the transponder chip module, such as the mold mass thereof, which may extend into the opening.

For example, FIG. 2C thereof (compare FIG. 2A herein) shows a transponder chip module TCM disposed in the card body CB of a smartcard SC wherein the coupling frame CF overlaps (or underlies) the laser-etched antenna structure LES in the transponder chip module TCM. Compare FIG. 2A herein.

For example, FIG. 2D thereof (compare FIG. 2B herein) shows a transponder chip module TCM disposed in the card body CB of metal smartcard SC, or metal card MC, wherein substantially the entire card body CB comprises metal, and may be referred to as a metal card body MCB.

US 20150021403 22 Jan. 2015 discloses a smartcard (SC) may comprise: a metal layer (ML); and an opening (MO) in the metal layer for receiving a transponder chip module (TCM); characterized by: a discontinuity comprising a slit (S) or a non-conductive stripe (NCS), in the metal layer (ML), extending from the opening to a periphery of the metal layer, whereby the metal layer (ML) comprises an open-loop coupling frame (CF) having two ends. The coupling frame may be disposed closely adjacent to the transponder chip module when the transponder chip module is disposed in the opening. A portion of the coupling frame (CF) may overlap a portion of an antenna structure (AS) in the transponder chip module (TCM). The coupling frame may extend over substantially the entire area of the smartcard. The metal layer may comprise a metal card body (MCB) of a metal smartcard. As further disclosed therein:

The slit may extend completely through the metal layer. The slit may extend only partially through the metal layer, and remaining material of the metal layer below the slit may have a thickness below a transparency threshold for the metal layer. The slit may have a width which is smaller than the opening. The slit may be at least partially filled with an electrically non-conducting material selected from the group consisting of polymer and epoxy resin, reinforced epoxy resin. A reinforcing structure (RS) disposed at a location of the slit (S) to reinforce the metal layer (ML).

When properly oriented with respect to the transponder chip module, the coupling frame may enhance communication (including power transfer) between an external contactless reader and the RFID chip (IC) of the transponder chip module. This may be due to the slit or slot in the coupling frame forcing eddy currents in the coupling frame in one direction around the antenna structure (module antenna) of the transponder chip module, thus inducing voltage into the module antenna which provides the power delivery to the chip.

US 20150136858 discloses a capacitive coupling enhanced (CCE) transponder chip module (TCM) comprises an RFID chip (CM, IC), optionally contact pads (CP), a module antenna (MA), and a coupling frame (CF), all on a common substrate or module tape (MT). The coupling frame (CF, 320A) may be in the form of a ring, having an inner edge (IE), an outer edge IE, 324) and a central opening (OP), disposed closely adjacent to and surrounding a module antenna (MA) structure of the transponder chip module (TCM). A slit (S, 326) may extend from the inner edge (IE) to the outer edge (OE) of the coupling frame (CF) so that the coupling frame (CF) is "open loop". An RFID device may comprise a transponder chip module (TCM) having a module antenna (MA), a device substrate (DS), and an antenna structure (AS) disposed on the device substrate (DS) and connected with the module antenna (MA). A portion of a conductive layer (CL) remaining after etching a module antenna (MA) may be segmented to have several smaller isolated conductive structures. Refer, for example, to FIGS. 3A-L, 4A, 4B, 5A, 5B thereof.

The Opening in the Coupling Frame

It is noteworthy that, in some of the figures of prior publications discussed above, such as FIGS. 2C and 2D of US 20140361086 there is typically a sizeable opening (module opening MO, central opening CO) in the body of the coupling frame to accommodate the transponder chip module, and the slit S in the coupling frame extends from the opening to an outer edge of the coupling frame. This was driven by the form factor of smart cards and the desire to keep the coupling frame as close as possible to the module antenna. The coupling frame was typically substantially coplanar with the module antenna, and typically surrounded it.

As disclosed herein, a coupling frame CF may be a planar (or non-planar, 3D) conductive element having an outer periphery (edge) and having a slit S extending from its outer edge to an inner location on the conductive element. In an RFID device, the coupling frame may be disposed (arranged) to overlap the transponder chip module, and may be oriented (arranged) so that the slit S overlaps (traverses over, or under) the turns (traces) of the module antenna on one side thereof. As distinguished from the coupling frames disclosed for example in 20140361086, in the coupling frames disclosed herein the inner end of the slit S need not terminate in a distinct opening sized to accommodate the transponder chip module TCM. Essentially, it is the slit rather than the opening that dictates the electrical characteristics of the coupling frame. Some of the coupling frames disclosed herein may be non-planar, including curved or tubular.

FIG. 2C illustrates a capacitively-coupling enhanced (CCE) transponder chip module 210 comprising a capacitive coupling enhanced (CCE) transponder chip module (TCM) which may be referred to as a transponder chip module with an "integrated coupling frame". Contact pads CP for a contact interface (e.g., ISO 7816) may be disposed on the top (face-up) surface of the module tape. An RFID chip (IC) and a module antenna MA 212 which may be a planar antenna PA are disposed on the bottom (face-down) side of a module tape MT. A coupling frame (CF) 220 having slit (S, not visible in this view) may be disposed on the module tape, such as on the face-up side thereof so the slit of the coupling frame may overlap at least some of the turns of the module antenna (planar antenna). In this example, the coupling frame has a opening (OP) for allowing the contact pads CP to be disposed on the same side of the tape as the coupling frame. If contact pads are not needed (e.g., for a contactless-only smart card), the area otherwise occupied by contact pads could be occupied by more of the coupling frame, resulting for example in an entire top surface of the smart card being covered by a layer of metal (except for the slit).

In this example, the coupling frame (CF) closely adjacent to the module antenna, although not on the exact same plane as the module antenna, and both surrounds and overlaps the module antenna.

FIG. 2D shows a transponder chip module (TCM) 210 having an RFID chip (IC) and a module antenna (MA) 212. Additionally, the transponder chip module has a coupling frame 222 (compare FIG. 2C) which has a slit (S) 230, and which may be referred to as a "secondary" coupling frame (SCF). The tolerances of the secondary coupling frame can be closely controlled during the manufacture of the transponder chip module. The secondary coupling frame may be considered to be an "integrated coupling frame". The transponder chip module may be considered to be a capacitive coupling enhanced (CCE) transponder chip module (TCM) Also shown is that the secondary coupling frame may be electrically connected with an external coupling frame (CF). This concept may be applied to transponder chip module inserts which are inserted into payment objects, as disclosed herein.

The concept discussed, for example, in US 20140361086 of disposing a transponder chip module TCM in a metal component such as a metal card body MCB is extended herein to disposing one or more transponder chip modules (TCMs) in a metal component (such as a housing) of a payment object (such as a wristwatch).

In many of the examples and embodiments presented herein, coupling frames and transponder chip modules may be integrated into payment objects, which may also be referred to as "payment devices", or simply "devices".

Direct Capacitive Coupling

Direct capacitive coupling of a transponder chip module to an external reader antenna may be achieved. Two electrodes, or capacitive plates (surfaces) may be connected to the RFID chip in a transponder chip module, which may then directly couple to reader antenna at the desired RF frequency (e.g. 13.56 MHz). In effect, the electrodes form an electromagnetic dipole when connected across the chip terminals. In this case the RFID chip may have a modified electronic circuitry in order to allow it to operate via capacitive coupling rather than inductive coupling to a reader antenna.

This concept may be applied to transponder chip modules as disclosed herein and implemented so that dipole electrodes may be substituted for the module antenna and interact with the coupling frame so that with the slit overlapping at least one of the dipole electrodes, contactless communication between the transponder chip module and a contactless reader may be enhanced (enabled), as described herein. The slit in the coupling frame may overlap both of the dipole electrodes to enable/enhance contactless communication. The coupling frame may be positioned so that its slit does not overlap the dipole electrodes to disable/suppress communications between the transponder chip module and the contactless reader (or other RFID device).

This concept may be extended to dipole electrodes in a transponder chip module (TCM) that couple with a booster antenna (such as in a conventional contactless smart card) that has been tuned such that the booster antenna/TCM pairing resonates at the desired frequency and allows communication with the external RFID reader. Some patents and publications of interest may include . . .

U.S. Pat. No. 6,018,299 issued 2000 Jan. 25 to Eberhardt (Motorola)

U.S. Pat. No. 6,107,920 issued 2000 Aug. 22 to Eberhardt et al. (Motorola)

U.S. Pat. No. 6,147,605 issued 2000 Nov. 14 to Vega et al. (Motorola)

U.S. Pat. No. 6,265,977 issued 2001 Jul. 24 to Vega et al. (Motorola)

U.S. Pat. No. 6,611,199 issued 2003 Aug. 26 to Geizler et al. (Motorola)

US 20130271265 (2013 Oct. 17; Finn)

Some Exemplary Dimensions

The following dimensions are approximate, and are presented to provide a sense of the relative scale of the various components of the transponder chip module and other elements of an RFID device which may be described herein.

A transponder chip module, including module antenna and RFIC chip—in other words, the module tape for the transponder chip module, may measure approximately 10 mm×10 mm, but may have other dimensions and form factors. For example, a transponder chip module may measure approximately 7 mm×15 mm, or 7 mm×24 mm. The module tape may be an epoxy-glass tape having a thickness of approximately 110 μm. A conductive layer (cladding or foil) on one or both sides of the module tape may have a thickness of approximately 18 μm or 30 μm.

The RFID chip may measure approximately 2.5 mm×2.5 mm, but may have other dimensions and form factors.

An etched module antenna may be disposed in a peripheral, rectangular annular area of the module tape having outer dimensions of approximately 10 mm×10 mm and inner dimensions of approximately 8 mm×8 mm, but may have other dimensions and form factors.

The traces of an etched module antenna may be formed by chemical or laser etching of a conductive layer on the module tape (or a conductive foil applied to the module tape), may have a width of approximately 100 μm, and the traces may be separated by spaces having a width of approximately 25 μm, but may have other dimensions and form factors.

A coupling frame (CF) may be generally rectangular, and measure approximately 20 mm×20 mm (having an area of approximately 400 mm2), but may have other dimensions and form factors. For example, a coupling frame may measure approximately 7.5 mm×17.5 mm (131 mm2) for an antenna measuring approximately 15 mm×7 mm (105 mm2). The coupling frame is generally larger than the antenna, such as twice as large or four times larger than the module antenna. The slit in the coupling frame may have a width of between approximately 1.4 mm and 2 mm, and may cover substantially all of the no-man's land at the interior of the module antenna. The slit, having traversed one side of the module antenna, may be wider than the no-man's land to overlap some inner turns of the antenna on adjacent sides of the module antenna. The slit may have an L-shape, a T-shape or other shape.

Some Examples of Coupling Frames

FIG. 3A illustrates the front side of a smartcard (SC) 300 which may be a metal card having a metal layer (ML), which may constitute substantially the entire thickness of the card body (CB) 302. The card body (CB) may have a module opening (MO) 308 wherein a transponder chip module (TCM) 310 may be disposed, and a slit (S) 330 extending from the module opening (MO) to the outer perimeter of the metal layer (ML) so that the metal card body (MCB) 302 may function as a coupling frame (CF) 320. The metal layer (ML) (or card body CB, or metal card body MCB) may comprise titanium, and is provided with a slit, slot or gap in the metal to create an open loop coupling frame closely adjacent to and substantially fully surrounding the transponder chip module (TCM).

The slit (S) may overlap at least a portion of the module antenna (MA, not shown) of the transponder chip module. In some examples and embodiments of coupling frames incorporated into RFID devices disclosed herein, there may not need to be an opening (MO) in the coupling frame (CF) for the transponder chip module (TCM).

This concept of modifying a metal element to have a slit (S) to function as a coupling frame (CF) may be applied to other products which may have an antenna module (AM) or transponder chip module (TCM) integrated therewith, such as watches, wearable devices, and the like.

The slit (S) may extend completely (fully) through the metal layer (ML) forming the coupling frame (CF). The slit (S) may extend only partially through the metal layer, and remaining material of the metal layer below the slit (S) may have a thickness below a transparency threshold or skin depth for the metal layer. The slit (S) may have a width which is smaller than the opening. The slit (S) may be at least partially filled with an electrically non-conducting material selected from the group consisting of polymer and epoxy resin, reinforced epoxy resin. A reinforcing structure (RS) may be disposed at a location of the slit (S) to reinforce the metal layer (ML).

An activation distance for a transponder chip module (TCM) disposed in (or under, or above) the opening (MO) of the coupling frame may be at least 20 mm; at least 25 mm; at least 30 mm; at least 35 mm; up to 40 mm; and more than 40 mm.

FIG. 3B illustrates the back (reverse) side of the smartcard 300 shown in FIG. 3A. A recessed area 302 may be provided on the reverse side of the card body (CB) to accommodate a magnetic stripe, and may measure approximately 9 mm×84 mm. Another recessed area 304 may be provided on the reverse side of the card body (CB) to accommodate a signature panel, and may measure approximately 9 mm×56 mm. The module opening (MO) is shown in dashed lines, and may measure approximately 11 mm×13 mm (for an 8 contact module).

An additional recessed area 306 may be provided on the reverse side of the card body (CB) to accommodate a switch (SW) 324, such as a slide switch, and may measure 5 mm×20 mm. The switch (SW) may be used to selectively connect/disconnect the ends of the open loop coupling frame (CF) to one another, so that when the ends are connected, the coupling frame (CF) 320 is a closed loop and does not provide the advantages of an open loop coupling frame (CF) as described above. This allows a user to "switch off" the coupling frame feature and its attendant increase in activation distance, which provides more security (an anti-phishing feature) for the user's card. Shorting out the slit (S) may substantially suppress (including disable) communication between the transponder chip module and another RFID device such as a contactless reader. The switch may comprise any conductive medium (such as a tab or a membrane) capable of selectively short-circuiting the slit. As disclosed herein, a second coupling frame in intimate contact with a first coupling frame can act as a switch, when moved so that it short circuits the slit in the first coupling frame.

The switch feature can be integrated into a solid metal card body construction or a plastic card/metal foil card body construction. The switch may comprise a slide switch, a press button switch or the like which can be used to short-circuit the coupling frame (CF) and dampen the function of the transponder chip module (TCM), thereby providing protection against phishing (unauthorized reading of the smartcard). The switch (SW) can also have the function of reinforcing the structure of the card body (CB) around the position of slot or slit, protecting it from damage resulting from bending.

A switch SW can be incorporated in other RFID devices disclosed herein to short out the slit, slot or gap in the coupling frame. The switch may comprise a slide switch, a press button switch or the like which can be used to short-circuit the coupling frame and dampen the function of the transponder chip module, thereby providing protection against phishing (unauthorized reading of the smartcard). The switch can also have the function of reinforcing the structure of a card body around the position of the slit, protecting it from damage resulting from bending.

LEDs

US 20140361086 and US 20150021403 show (refer to FIG. 7A therein) incorporating an LED into a smart card (SC), and connecting it to the ends of the coupling frame (CF). The LED is shown as being connected across the slit (S), and may illuminate when the smartcard (SC) is being interrogated by an external reader.

A coupling frame may feature connection to LED in combination with a switch or second coupling frame. The LED will light or blink when the switch is open (open slit) and the device is placed in proximity with an RF reader field at the operating frequency (e.g. 13.56 MHz). When the coupling frame slit is shorted out, the LED will not light giving a visual indication to the user that the device has been disabled and that no data communication can occur with the transponder chip module.

The Slit, or Discontinuity

The operation of a coupling frame (CF) benefits from the presence of an electrical discontinuity, herein described as a slit (S), extending into the surface of and across the coupling frame from an outer edge thereof, so that the coupling frame is not a closed loop. The discontinuity in the coupling frame (CF) may be implemented by creating an electrically insulating region in the metal layer, nanomaterial or other conductor of the coupling frame (CF). The discontinuity may be formed by a series of perforations. The discontinuity may also be formed by selective chemical (or other) modification of the metal, nanomaterial or other conductor, resulting in a non-conductive stripe rather than a slit through the surface of the coupling frame. The chemical modification may form an electrically insulating region on the coupling frame (CF) which serves as the discontinuity. For example, the discontinuity may be formed by selective oxidation of the coupling frame (CF) by deposition (for example by screen printing, inkjet) of a corrosive chemical (for example acid). For example, a coupling frame formed from a thin foil of aluminum may have a non-conductive stripe (NCS) formed therein, such as by anodising. See, for example US 20100078329 (Mirsky et al.).

As used herein, "slit" includes any kind of electrical discontinuity or non-conductive path extending from an outer edge of the conductive coupling frame to an inner position thereof, rendering it "open loop". The slit may extend over at least some of the turns of the module antenna (MA) of the transponder chip module (TCM), including all of the turns on one side of the module antenna (MA), and beyond that into the no-man's land in an interior area of the module antenna (MA), and may extend further over some turns of the antenna on other sides of the antenna. The slit may extend to an opening (MO) in the coupling frame (CF) for receiving a transponder chip module (TCM) or the mold mass (MM) thereof.

A discontinuity which is a slit (S) may compromise the mechanical integrity of the otherwise continuous coupling frame, which may necessitate the presence of a backing member (such as a module tape, or inlay substrate). A slit (S) can be filled with a material to restore some of the mechanical integrity to the metal layer of the coupling frame, and may also add to the aesthetic appearance of the coupling frame (if it is visible in the final product). The material may be electroluminescent, so that it changes appearance when the coupling frame (and overall device) is in proximity with an external reader. A patch may extend across the slit of the coupling frame. A discontinuity wherein a narrow region or "stripe" of the metal layer of the otherwise electrically conductive coupling frame is converted (chemically, or otherwise) to a material (such as an oxide of the metal) that is electrically non-conductive may serve the same purpose as the slit, but without compromising the mechanical integrity of the coupling frame. This may be important in situations where the coupling frame comprises a mechanical element of an overall device, such as the housing of a wristwatch.

Other solutions which address restoring mechanical integrity to a coupling frame with a slit are presented herein, and may comprise stacking two or more coupling frames (CF-1, CF-2 . . . CF-n), one atop the other, with one or more insulating layers (such as adhesive, or simply an oxidation layer) therebetween, and with their respective slits (S1, S2 . . . Sn) being oriented differently than one another, such as 90° or 180° apart from one another, so that the slits are not aligned on top of one another. (If the stacked coupling frames were not insulated from each other, they could short out each other's slits, compromising the function of the coupling frames.) Such a laminated construction of an overall coupling frame having multiple (two or more) coupling frame layers may exhibit superior mechanical integrity, and may also contribute to an aesthetic appearance of the overall device. Different materials may be used for the different layers, which may also provide additional benefits.

FIG. 3C illustrates a design of a hybrid metal credit card (or smart card) 300. The card body (CB) 302 is largely composed of metal (and may be referred to as a metal card body MCB), this may be a precious or high density metal such as silver, titanium, tungsten or a high strength metal such as stainless steel, and may comprise a non-precious metal plated with a precious metal. The card body (CB) features a slit (S, dashed lines) 330 extending from an edge of the card body (CB) through the position of the transponder chip module (TCM) 310 so that the slit overlaps the module antenna thereof and the card body (CB) functions as a coupling frame (CF) 320. The metal card body (CB, MCB) may have one or more recesses 342, 344 in the front and/or rear face of the card. These recesses may be filled with implanted or laminated non-conductive filler materials such as ceramic, plastic, glass, wood etc. The filled recesses may be, for example, 50% of the depth of the card thickness. These filled recesses serve as decorative elements on the card. In particular at the module position they serve to conceal the slit (S) in the card and allow a neat implanting of the module into the card body. In addition, the use of a recess filled with non-conductive material surrounding the transponder chip module may mitigate the effects of electrostatic discharge (ESD) when inserting the card into payment terminals or ATM machines, as the fill material for the recess may have a high dielectric constant and hence protect the transponder chip module from static discharges.

FIG. 3D illustrates a design of a hybrid ceramic and metal smart card (SC) 300. The card body (CB) 302 may be made of solid metal and feature a slit (S) 330 at the position of the transponder chip module (TCM) 310. The card body with slit may function as a coupling frame (CF) 320, with the slit overlapping the module antenna of the transponder chip module. The metal card body may feature a recess that may cover most of the size of the card and extend around the slit position to the periphery of the card. This recess may be filled by gluing or laminating a moulded or cut ceramic insert 304. This allows the card to retain the mechanical strength of the metal (e.g. stainless steel, titanium, tungsten) and have the aesthetic appearance and appeal of a polished ceramic finish.

"Capacitive Touch"

A person holding an RFID device having a coupling frame (CF) with a transponder chip module (TCM), such as a contactless or dual interface metal card operating on the principle of capacitive coupling, may act as a capacitive element when close to the reader antenna (e.g., in a point of sale terminal). As the person is grounded, the person has a resistance to ground and acts as a capacitive element in the overall circuit, and their body can act as an "antenna", augmenting the read/write distance from the contactless or DIF metal card with the POS.

Coupling Frames with Overlapping Ends

FIG. 4 is a diagram of a coupling frame CF having an opening MO for a transponder chip module TCM (not shown). Some of the coupling frames described hereinabove have a slit S extending from the opening MO to an outer edge of the coupling frame, between two opposing ends of the coupling frame. Reference may be made to FIGS. 3A, 3A-1, 3A-2 of US 20150136858.

The coupling frame (CF) 420 of FIG. 4 is "open loop", and has two opposing ends (end-1, end-2) which, although originally in manufacture may have been separated by a slit, in the final product are overlapping so that there is no discernable slit. However, electrically, there is still a discontinuity between the two ends, which may be considered to be a slit (or an overlapping slit). The coupling frame could be manufactured from a curved surface so that when it is flattened out, the ends slightly overlap each other. The overlapping portions of the ends may be thinner than the remainder of the coupling frame so that the coupling frame is not thicker in the area of the overlap. The overlapping ends may be electrically isolated from one another by an electrically insulating material, or dielectric. The ends around the slit S of a coupling frame CF may also be connected with one another, such as with a wire.

Metal Card with Reinforcing Insert

The techniques disclosed herein may be applied to any smart card (metal or plastic), as well as to other payment objects which are not in the form of smart cards, and may be particularly relevant in the case of a solid metal card (MCB) which functions as a coupling frame (CF).

A slit through a metal card body (so that it may function as a coupling frame) of a metal card may compromise (substantially weaken) the mechanical integrity of the card, allowing for undesirable flexing at the slit. A reinforcing insert may be disposed across the slit, and may comprise an electrically insulating material that conceals the slit (between the opposed ends of the coupling frame) and cavity (for the transponder chip module). The reinforcing insert may function to mechanically stabilize the metal card, reducing flexing. The reinforcing insert can bear a logo or printed image. The reinforcing insert may be reinforced with segments of electrically isolated metal, glass fiber or carbon fiber, for example, to add rigidity and strength.

The introduction of a slit and cavity near the transponder chip module area inherently weakens the structure of the metal card allowing flexing and bending. The reinforcing insert may be designed in such a way as to reinforce the card. The reinforcing insert may feature tapered edges that match tapered edges on the milled recess of the card body. This allows a mechanical grip between the insert and the card body which increases the rigidity of the metal card across the region bearing the slit and cavity. In addition an adhesive may be used to bond the reinforcing insert to the card body. As an alternative to tapered edges, slotted edges in for example a T-shape may be used.

FIGS. 5A,B are two views (front and back) of a metal card body (MCB) 502 having a cavity (MO) 508 which is an opening for the transponder chip module (not shown) and a slit (S) 530 extending from the cavity to an outer edge of the metal card body. A reinforcing insert 540 is shown inserted into the card body at the position of the slit S.

Reference may be made to FIG. 8 of US 20150021403 which shows a metal smart card (SC) 800 comprising a full metal card body (CB) 802 with an opening (MO) 808 for a transponder chip module (TCM, not shown) and a slit (S) 830 extending from the opening (MO) to a periphery of the card body (CB) to allow the flux lines to propagate around the area of the transponder chip module (TCM). The full metal card body (CB) may be formed of an electrically conductive material, such as titanium, may have a thickness of 760 μm, and may act a coupling frame (CF) for capacitive coupling with a contactless reader or point of sale terminal. The card body (CB) may comprise conductive nanoparticles.

To reinforce the card body (CB) (or metal layer (ML)) having a slit (S), a reinforcing insert (or structure or plate), of a non-conductive material such as plastic or reinforced plastic, may be disposed at (including around and covering) the location (area) of the slit (S) in a recess (R, not shown) on the underside of the card body (CB), and may extend beyond the slit. For example, the slit (S) may be 50 μm wide, the reinforcing structure may be up to or more than 8000 μm wide (approximately the size of a side of the TCM). The reinforcing structure (RS) may have a logo or design. The thickness of the reinforcing structure (and corresponding depth of the recess R on the underside of the card body CB) may be 350 μm. The opening (MO) may extend completely through the card body (CB) and the transponder chip module (TCM) may extend through the opening (MO) to the underside of the card body (CB) to allow the propagation of the electromagnetic flux lines.

Cavity with Struts

Normally, the cavity or opening in a metal card body MCB extends completely through the card body, so that an antenna module AM or a transponder chip module TCM inserted into the cavity/opening can interact contactlessly (via RF) with an external reader. Having an insert to reinforce the card body at the position of the slit S is discussed above. A metal card body may have a thickness of approximately 800 μm (0.8 mm).

A metal card body (MCB) which has been modified to perform as a coupling frame (CF) may have a slit (S) that extends not only to an area (recess R or cavity MO) for the transponder chip module (TCM), but which extends further across the area for the transponder chip module.

A partial milled or etched cavity may be used to accommodate the transponder chip module TCM, as per a normal (plastic) smartcard. The slit S would extend through the entire card body MCB, providing the discontinuity in the coupling frame CF. The use of a slit S through the card body rather than a fully penetrating cavity (module opening) at the transponder chip module TCM in metal card may increase the mechanical strength/integrity of the metal card.

FIG. 5C shows a metal card body (MCB) 502 having a cavity (MO) 508, but rather than the cavity being entirely open at the bottom of the card body, portions of the metal card body which may be referred to as struts 504 may be left in place, spanning the cavity, to reinforce the card body. The struts 504 may be disposed perpendicular to the slit S.

In the figures that follow, abbreviations (e.g., CF, S, etc.) which have been established for RFID devices and components thereof may be used without accompanying reference numbers to identify various elements in the figures.

Stacked and Overlapping Coupling Frames

FIG. 6 shows having two coupling frames (CF-1) 620A and (CF-2) 620B disposed such that their slits (S1) 630A and (S2) 630B are oriented in different directions from one another. Here they are shown oriented 180° apart from one another. The two coupling frames may be stacked, one atop the other, but with an insulating layer or film (not shown) disposed therebetween, such as an adhesive. (The insulating layer prevents the slit in a given one of the coupling frames from being shorted out by the other coupling frame.) The module openings (MO) of the two coupling frames may be aligned with one another to accept the antenna module (AM). When overlapped, the slits do not line up with one another. Coupling frames stacked in this manner and incorporated into an RFID device may not need a module opening.

If two coupling frames were stacked, one atop the other, with their slits aligned, the one coupling frame would not short out the slit in the other coupling frame, and it may not be necessary to have an insulating layer disposed therebetween. The coupling frame shown here has a module opening MO, but the techniques disclosed herein are not limited to coupling frames having module openings, they may simply have a slit.

This concept of having two coupling frames stacked one atop another may be applied to wearable devices. For example, a slit in a watch back may enable the watch back to function as a coupling frame, and a slit in the watch housing may enable the watch housing to also function as a coupling frame. The slits may be aligned with one another.

Two or more coupling frames may be connected together. They may be co-planar with one another (such as in FIGS. 11B,C), or stacked on top of each other (such as in FIGS. 6, 9). If desired, an electrical connection between coupling frames may be made in any suitable manner. (In some cases, such as stacked coupling frames, the coupling frames may be separated by a dielectric material). Electrically connecting or otherwise combining multiple coupling frames may be used to tune the resonant frequency of the combined transponder chip module/coupling frame "system" by up to the order of a few megahertz and improve the overall communication performance of the device.

Magnetic materials may be used in conjunction with coupling frames. The magnetic material may be laminated over the entire coupling frame, or localized near the transponder chip module TCM (or antenna module AM), such as in an area proximal with the module antenna MA.

Magnetic or conductive flakes may be used to form a coupling frame. The flakes may have a cross-dimension (such as diameter) of approximately 20-500 μm, and a thickness of a few microns. The flakes may be bound inside a polymer resin, and laminated to a suitable carrier substrate which may be an existing coupling frame or a module tape MT substrate for the antenna module AM. Sintering may be performed. The flakes may comprise a conductive, yet highly resistive material.

FIGS. 7A,B,C show that a first coupling frame (CF-1) 720A may be overlapped with a second coupling frame (CF-2) 720B and still function with a transponder chip module TCM. The coupling frames may be in contact (physically) and separated by a dielectric. The slits (S1) 730A and (S2) 730B of the coupling frames may be disposed in different directions, as shown. The coupling frames 720A and 720B may have an insulating layer (such as adhesive) between them. The module openings MO of the coupling frames should be overlapping with each other. The use of more than one coupling frame allows the slits to be concealed by having the slits at different positions on each coupling frame, when viewed in plan view there is no continuous slit penetrating the stack of coupling frames. If the two coupling frames were not separated by dielectric, each coupling frame could short out the slit in the other coupling frame, rendering both coupling frames ineffective for improving communication between the transponder chip module and an external reader.

FIG. 8A shows a first coupling frame (CF-1) 820A with its slit (S1) 830A extending from the module opening (MO) in one direction (to the right, as viewed). FIG. 8B shows a second coupling frame (CF-2) 820B with its slit (S2) (830B) extending from its module opening (MO) in a second direction (to the left, as viewed), which is 180° from (opposite to) the first direction. As indicated by the arrows pointed towards one another, FIG. 8C shows that the coupling frames CF-1 and CF-2 can be interleaved or interlocked with one another, sliding them together with the slit of one coupling frame engaging the slit of the other coupling frame. In this case the slits of the coupling frames are used to interpenetrate each other. This allows the formation of an interlocked structure that can be glued or laminated together to form a continuous mechanically rigid structure. This can have advantages in certain smartcard applications, for example, where the slit of a single coupling frame may lead to weakness in the mechanical stability of the smartcard. This could be particularly relevant to metal cards which would otherwise be made from a single piece of sheet metal bearing a slit and opening (or cavity) to form a coupling frame. The use of interlocking coupling frames can conceal the slit and add rigidity to the final product without the use of non-metal support structures such as PVC laminated layers. In addition, interlocking coupling frames of this type may be potentially in electrical contact with each other as they feature independent slits.

FIG. 8D shows that the resulting interleaved/interlocked coupling frames form a 3D structure (not entirely planar). Although the two coupling frames (CF-1, CF-2) are shown lying relatively flat upon one another, they could be interleaved with a greater angle between one another, such as at 90° with one another (in the manner of orthogonal planes), which may be advantageous for some devices having appropriate form factors, such as pens (long, cylindrical).

Connected Coupling Frames ("Composite Coupling Frame")

Coupling frames rely, generally, on the "slit", which represents an electrical discontinuity. Two or more coupling frames, which may be metal components of payment objects such as bracelets or phones, may be stacked, one atop the other, so that their slits are aligned in the same or in different directions.

One or more coupling frames may be connected together, they may be co-planar or stacked on top of each other and separated by dielectric material. The connection(s) may link any part of the coupling frames. The connection(s) may be made from regions adjacent the slit on one coupling frame to similar regions on the second or subsequent coupling frame. Electrically connecting multiple coupling frames in this manner may be used to tune the resonant frequency of the TCM/CF system by up to the order of a few megahertz and improve the overall communication performance of the device.

FIG. 9 is an exploded perspective view showing a first coupling frame (CF-1) 920A having two opposing end portions A & C separated by a slit (S1) 930A and a second coupling frame (CF-2) 920B having two opposing end portions B & D separated by a slit (S2) 930B. The slits S1 and S2 may be aligned with one another. Alternatively, the slits S1 and S2 may not be aligned with one another. The end portions A and B may be aligned with one another. The end portions C and D may be aligned with one another. The end portions of one coupling frame may be connected with the end portions of another coupling frame, in various combinations. For example, in the case of two connected coupling frames the connection may be represented as shown in FIG. 25. The metal region to each side of the slit on two co-planar or overlapping coupling frames may be denoted by the letters A, B, C and D. Various connection options may be . . .

A connected with D, B connected with C (as illustrated)
A connected with D, B and D not connected
B connected with C, A and D not connected
A connected with B, C connected with D
A connected with B, C and D not connected
C connected with D, A and B not connected The connection may be any form of electrical connection including soldered wire, plated through hole, wire bond, conductive adhesive, crimp, ribbon wire, etc. The use of different connection configurations may yield different resonant frequency values when the "composite" coupling frame (2 or more connected coupling frames) is paired with a suitable TCM. The use of multiple coupling frames can be used to increase communication performance of the device by tuning and/or by increasing the effective size of the coupling frame by electrically linking individual coupling frames that are spatially separated. This may be particularly relevant in the case of payment objects such as payment bracelets.

In FIG. 9, module openings MO-1 and MO-2 are shown at the ends of the slits S-1 and S-2 in the two coupling frames CF-1, CF-2, respectively, for receiving a transponder chip module (not shown). It should be understood that the slits S-1 and S-2 need not terminate in module openings, in many of the embodiments disclosed herein, a opening for the module is not required. The important thing is that the slit(s) are positioned to overlap the module antenna of the transponder chip module. The techniques disclosed herein may be applicable to coupling frames having slits, without module openings, and disposed so that the slit of a coupling frame overlaps at least a portion (such as one side of) a module antenna (such as a rectangular spiral planar etched antenna structure.).

A Card Body Construction

FIG. 9A shows a card body construction for a smart card (SC). Typically, a metal card body would have an opening on the rear (back side) of the card body to allow contactless communication with a transponder chip module inside of the metal card. (The back side opening may also accommodate the size of the mold mass on the transponder chip module.) A dual-interface module would have contact pads on the front side, also blocking contactless communication with the chip module.

In this construction, there is a conventional recess (opening) extending into the front side of the card to accommodate a dual-interface transponder chip module (TCM), with its the contact pads exposed. The card body construction may be layered, as follows:
- a first (top) metal layer, having a thickness of approximately 300 μm, and having an opening for receiving the transponder chip module and a slit 930A extending from the opening to an outer edge of the layer, so that the layer may function as a coupling frame 920A. The slit may extend entirely across no-man's land, and its width may be approximately equal to the width (or transverse height) of no-man's land;
- a layer of adhesive, having a thickness of approximately 20 μm;
- a second (middle) metal layer having a thickness of approximately 100 μm. The second metal layer may have an opening for the mold mass of the transponder chip module and a slit 930B extending from the opening to an outer edge of the layer, so that the layer may function as a coupling frame 930B. The module antenna of the chip module may reside on this layer, so that the slit overlaps the module antenna outside of the opening.
- a layer of adhesive, having a thickness of approximately 20 μm;
- a third (bottom) metal having a thickness of approximately 320 μm. The third metal layer may have a slit 930C extending from an interior position of the layer to the outer edge of the layer so that the layer may function as a coupling frame 920C. This layer does not need an opening for the chip module or mold mass. The slit overlaps (underlies) the module antenna.

Alternatively, this card body construction could be produced having only two layers of metal or even one layer of metal. The layers can be separated electrically by an adhesive or the layers can be welded together to form a homogenous conductive layer.

In an electromagnetic field generated by a point of sale terminal, the surface current around the slit may provide the power delivery to the chip by coupling the energy to the overlapping module antenna of the transponder chip module. The coupling may be a combination of capacitive and inductive coupling, i.e. reactive coupling.

Smart Objects

The transponder chip module (TCM) can be implemented in so-called "smart objects" to add contactless functionality. The case or housing of the smart object may be designed to act as a coupling frame (CF). The transponder chip module (TCM) may be located, for example, inside jewellery or fashion items that are made from or contain metal parts. Some examples of these items may include:

Bracelets: the transponder chip module (TCM) may be located inside a solid metal bracelet. The TCM can, for example, be located inside a discreet pocket within the structure of the bracelet and surrounded by the metal body of the bracelet. A slit and/or cavity within the bracelet may be incorporated to form a discontinuous metal frame around the transponder chip module (TCM) such that the bracelet then performs as a coupling frame, enhancing the communication performance of the TCM.

Cufflinks: the transponder chip module (TCM) may be located on fashion accessories such as cufflinks. A metal cufflink may be designed or modified in such a way as to have a slit or cavity within its structure. The TCM may reside within or on the outer surface of the cufflink with the transponder chip module (TCM) antenna potentially conforming to the shape of the cufflink in order to maximise communication performance.

Cosmetic boxes: the transponder chip module (TCM) may be located in a cosmetic box. Typical metal cosmetic boxes are composed of two halves bearing milled cavities which accommodate the cosmetic product or vanity mirror, the two halves being typically linked by a hinge at some point and sometimes featuring a clasp for closure. Under this invention the bottom or top half of the cosmetic box may be formed into a coupling frame by placing a slit and opening in the bottom or top half of the cosmetic box so that it can function as a coupling frame.

Pendants: the transponder chip module (TCM) may be located inside a locket or pendant. The pendant may feature a cavity and slit within an internal or outer layer thus forming a coupling frame.

Watches: a watch may have payment functionality added to it by incorporating a transponder chip module (TCM) and CF into the watch design. In order for the watch to function correctly as a payment object (or smart object) the design of the watch may be altered to accommodate the transponder chip module (TCM) and prevent electromagnetic shielding from the watch components. The formation of a slit (S) in discrete components of the watch normally manufactured from metal can allow the watch case as a whole to function as a coupling frame. A slit and cavity may be incorporated into the rear case of the watch, thus housing the transponder chip module (TCM) and using the rear case as a CF. In order to prevent electromagnetic shielding by the watch case a slit may be incorporated in the watch case. The watch case may be visualized as a hollow ring of metal for simplicity. To preserve the rigidity of the watch case in use the case may be composed of several laminated layers of metal each bearing a slit in to render each layer as a discontinuous metal loop.

Alternatively, the transponder chip module (TCM) may be integrated into the watch strap. For example in a typical gentleman's watch bracelet, a three-way folding clasp is found. The transponder chip module may be incorporated into one of the three-way clasp elements with magnetic shielding material used to offset attenuation effects from the surrounding metal. The portion of the clasp bearing the transponder chip module may be formed into a coupling frame.

A Watch Case Design

FIGS. 10A,B,C,D,E are diagrams (plan view) of watch case components. These components may be made of metal (or other conductive material).

FIG. 10A shows a conventional watch case, basically a cylinder with two lugs for the watchband on either side (or top and bottom) thereof.

FIG. 10B shows a one portion or layer (Layer-1) of a watch case with a slit (S1) 1030A which enables this portion to function as a coupling frame (CF-1) 1020A. The slit S1 is oriented downward (as viewed).

FIG. 10C shows a one portion or layer (Layer-2) of a watch case with a slit (S2) 1030B which enables this portion to function as a coupling frame (CF-2) 1020B. The slit S2 is oriented upward (as viewed).

Figure 10D:
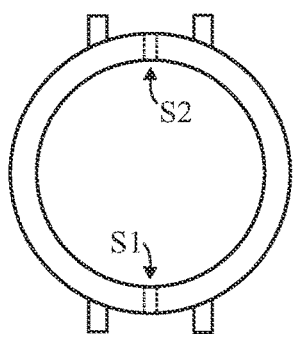

FIG. 10D shows the two portions or layers (Layer-1 and Layer-2) of the watch case, assembled with one another, with the slits S1 and S2 located 180° apart.

IG. 10E shows the rear case (or back) of the watch, which may be formed as a coupling frame (CF-3) 1020C with a slit (S3) 1030C and a module opening (labelled "TCM position").

Some Additional Disclosure

There follows some evolutions and applications for some of the concepts disclosed herein relating to coupling frames having slits, and incorporating multiple coupling frames into a single payment object (or "payment device"). Some concepts that may be disclosed may include, but are not limited to:

payment objects having various form factors
bangle with TCM insert
coupling frame with LED
inserts for the metal cards
electroplating, applicable to all form factors, i.e. the TCM with coupling frame is inserted into the payment object resulting, after electroplating, in a complete plated surface with a slit. The slit can be hidden by diamonds or any non-conductive medium.
incorporating an LED into a smart card or, more generally, a payment object Incorporating an LED into a Smart Card FIG. 11A shows a smart card (SC), which may have a metal card body (CB) formed with an opening (MO) for a transponder chip module (TCM), a slit (S1) 1130A extending from the opening to an edge (left, as viewed) of the metal care body, turning the card body into a coupling frame (CF) 1120A. The opening MO is at the position prescribed by the ISO standard (near the left edge of the card body (CB).

Another opening (LO) is formed on an opposite side of the metal card body and also has a slit (S2) 1130B extending from the opening to the edge (right, as viewed) of the card body/coupling frame (CB/CF). An LED may be disposed in the opening (LO) and connected to the card body/coupling frame (CB/CF) across the slit (S2).

The dashed line around the coupling frame CF (lower right corner only) is intended to indicate that the coupling frame may be disposed in a plastic card body CB. Alternatively, as discussed herein, a metal card body MCB may be modified to perform as a coupling frame.

This arrangement provides a transponder chip module (TCM) with an LED on opposite sides (left-right) of a card body of a smart card, which may be a metal smart card. In this example, a single coupling frame CF may have enough power to illuminate the LED while still providing enough power to activate and operate the RFID chip in the transponder chip module (TCM).

Figure 11B:
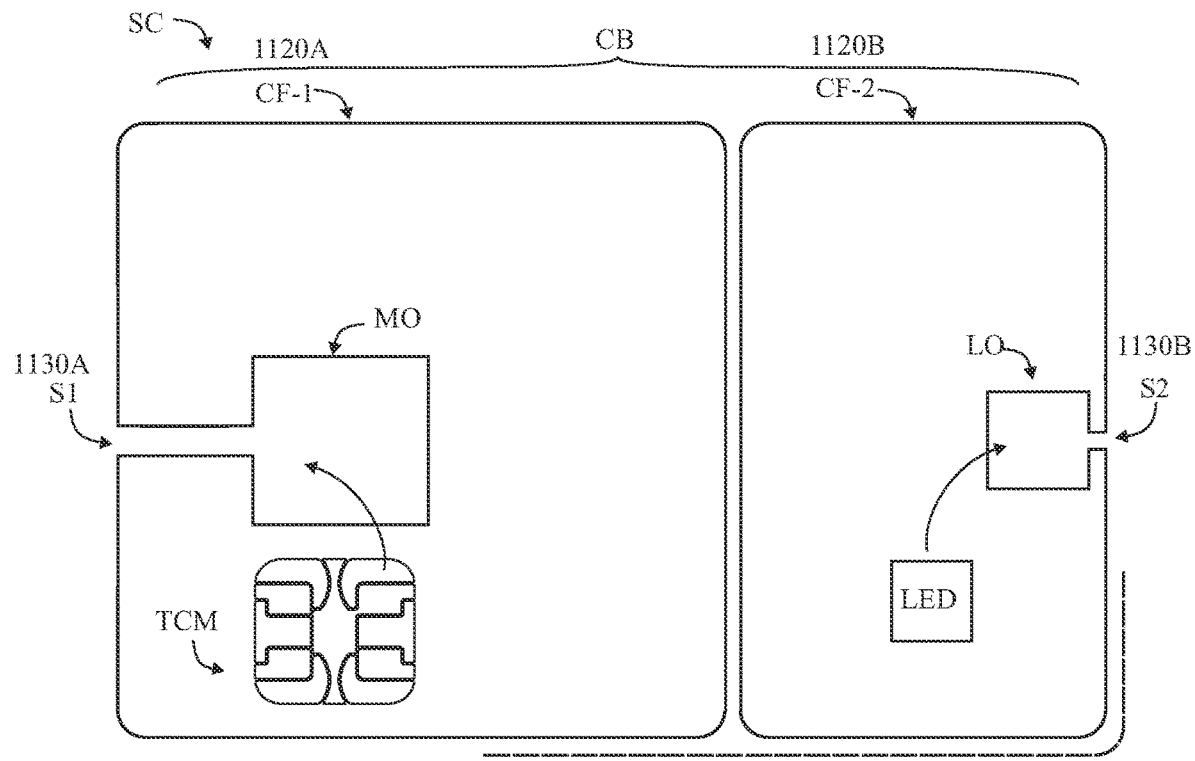

FIG. 11B shows a smart card (SC) having two coupling frames, and a card body (CB) which may be a metal card body (MCB) comprising a first coupling frame (CF-1) 1120A on the left (as viewed) side of the card body and a second coupling frame (CF-2) 1120B on the right (as viewed) of the card body. The two coupling frames (CF-1, CF-2) may be electrically isolated from one another. A first opening (MO) for a transponder chip module (TCM) may be formed in the left coupling frame (CF-1), with a slit (S1) 1130A extending from the opening (MO) to the left (as viewed) edge of the metal card body, turning the card body into a coupling frame CF. The opening MO may be located at the position prescribed by the ISO standard (near the left edge of the card body).

Another opening (LO) is formed on an opposite side of the metal card body, in the second coupling frame (CF-2) 1120B portion thereof, and similarly has a slit (S2) 1130B extending from the opening (LO) to the right edge (as viewed) of the card body/coupling frame. An LED or LED module (an LED with additional components) may be disposed in the opening (LO) and connected to the coupling frame (CF-2) across the slit (S2).

The first coupling frame CF-1 may have a larger surface area than the second coupling frame CF-2, and may be substantially coplanar with the second coupling frame CF-2.

FIG. 11C shows a smart card (SC) having a single coupling frame (CF) for the transponder chip module (TCM), covering approximately (for example) ⅔ of the surface of the card body (CB). The smart card may have a metal card body CB. An opening (MO) for the transponder chip module (TCM) may be formed in a left side (as viewed) of the card body (CB) which is formed with a slit S extending from the opening (MO) to the left (as viewed) edge of the metal card body (CB) so that the card body (CB) may function as a coupling frame (CF), and enhance, rather than block contactless communication with the transponder chip module (TCM). The opening (MO) may be located at the position prescribed by the ISO standard (near the left edge of the card body).

In this example, an LED (or LED module) is disposed on a separate substrate (LS) which may be comparable, for example, in size and location to CF-2 in FIG. 11B, and which comprises an antenna (ANT) for inductive coupling with an external reader. The LED substrate need not be conductive, and may be a plastic/non-conductive material. (The coupling frames disclosed herein are typically conductive.) The LED is connected to the antenna, and may illuminate when in the RF field of a reader. The antenna may be a planar etched antenna, a wire wound antenna, or any other suitable antenna. An opening (not shown) may be provided in the LED substrate so that the LED is visible from an external surface of the smart card (or other payment object).

Regarding incorporating LEDs into RFID devices such as payment objects, it may be noted that FIG. 7A of US 20140361086 shows incorporating an LED into the smart card (SC), and connecting it to the ends of the coupling frame (CF). See also FIGS. 5, 5A, 5B of US 20140284386 showing LEDs connected to booster antennas.

Bangle

FIG. 12 illustrates an RFID device, such as a payment object 1200, comprising a bangle (or bracelet) with a transponder chip module TCM "insert" 1210. The insert could be metal or plastic, the cavity and slit as drawn may be filled with a resin for example. In the case of a plastic insert the surface may be coated so as to allow electroplating after assembly with the bracelet body, this could be an electroless deposited flash of metal for example. A transponder chip module in the form of an insert (TCM insert), comprising a transponder chip module with a coupling frame associated therewith, is shown in position to be inserted into a slot/opening in the bracelet.

The TCM insert may be made from metal, formed as a coupling frame with a slit, and containing a concealed transponder chip module (module antenna and RFID chip). The slit may be concealed by jewels, a logo or badge. The TCM insert can be made from an unfinished base metal as used in the jewellery industry (e.g. copper, steel). This can then be locked/inserted into the bangle or other jewellery item or payment object, these may also be in an unfinished state. The insert may make electrical contact with the bangle thereby increasing the effective area of the coupling frame and increasing the activation/communication distance of the RFID device. The bangle itself may function as a coupling frame. Following assembly of the insert and bangle the entire assembly may be electroplated with precious metal finishes including, for example, titanium, silver, gold, platinum. In this manner the insert becomes an integral part of the bangle.

The bracelet may function as an extension of the coupling frame in the transponder chip module and may permit coupling with an external reader at various orientations at which the bracelet is presented to the reader. Contact pads made of a suitable flexible or rigid metal layer such as copper may be incorporated into the TCM insert and/or the bangle to ensure a good electrical connection therebetween. The contact pads can be exposed regions of the coupling frame (bangle) or pads on the surface of the insert that are connected to the coupling frame. The pads may electrically connect the coupling frame to the payment object (metal) by making contact with the edges of the slot in the object. The concept of inserting a transponder chip module into a slot in a bangle may also be applicable to other payment objects and jewelry items, such as cufflinks, bracelets, lockets, pendants, rings, etc.

Some Additional Disclosure

Some of the inventions disclosed herein may relate to capacitive coupling between an RFID-enabled payment object and an external contactless reader. The payment object may have a transponder chip module TCM incorporated therein which has an RFID chip (IC) and a module antenna MA. Payment objects, which may (for example) be pre-charged with some credits, may include metal jewelry items, bangles, bracelets and the like. The transponder chip module TCM may have various form factors.

The curvature of the wearable device affects the effective overlap of the antenna within the device or the coupling frame with respect to plane defined by the plane the reader antenna. In a conventional smartcard the antenna within the smartcard is typically brought into proximity with the reader in a roughly parallel fashion, i.e. the plane of the smartcard and the plane of the reader antenna are approximately parallel. This configuration maximises the overlap of the smartcard with the reader antenna and thereby maximises the communication performance. In the case of a wearable device with a curved shape the geometric planes running parallel the reader antenna will be tangential to the device. Hence, the effective overlap or "footprint" of the wearable device with respect to the reader antenna will be reduced. This may negatively impact the communication performance of the wearable device. Measures to counter this effect may include changes to the design of the antenna structure within the wearable device, for example using multiple adjacent antennas connected together along the length of the wearable device. Alternatively a conventionally rectangular antenna within the wearable device may be pinched off along its length at several points to increase the number of turns or windings running near the centre of the antenna. This will form zones of the antenna that will have increased effective overlap with the reader antenna.

Coupling between the transponder chip module TCM and the external reader may be facilitated (enhanced) by the presence of a conductive coupling frame CF which has at least a portion substantially surrounding the module antenna MA of the transponder chip module with the slit of the coupling frame overlapping the module antenna. The coupling frame may be the payment object itself, such as a bangle, or a component thereof. The coupling frame may be incorporated, for example, into a watch strap or clasp. On wearables, such as bangles or bracelets, a coupling frame or antenna conforming to a wearer's wrist presents a small "footprint" to a reader which typically has a planar surface. By using a component of the payment object itself as a coupling frame, coupling with a contactless reader may proceed at a number of orientation. Another solution to the "small footprint" problem may be to have a wristband comprising series of "tiled" coupling frames, overlapping or closely abutted with one another.

Multiple Slits And Different Shaped Slits

A payment object such as a bracelet may have a slit and function as a coupling frame for a transponder chip module incorporated into the payment object. In the case of non-standard form factor smartcards, or payment objects such as bracelets, it may be desirable to align the module antenna of the transponder chip module in a particular direction. For example in a metal bracelet, the module antenna may be aligned along the circumference of the bracelet. The slit of the coupling frame may describe an arbitrary path extending from one edge of the payment object, and may be straight, or it may have an L-shape or a T-shape. The slit may linear (straight) or non-linear. More than one slit may be used to operate with a given transponder chip module TCM, and multiple slits may used if the payment object (or device) comprises a laminated structure. In this case the individual slits may be offset from one another across the laminated layers of the device to increase the mechanical strength of the device.

In the case of a jewellery item such as fashion metal bracelet, the slit(s) and transponder chip module may be concealed by a non-metallic over mould, epoxy, jewels, lead crystal or other decorative feature, such as a cover. The transponder chip module may be mounted in the inner or outer face (surface) of a fashion metal bracelet and may be located at any position on the bracelet including adjacent to terminated edges or bracelet links. In addition, the transponder chip module TCM may be located inside a link of a bracelet—this could form a modular insert that may be manufactured independently of the main body of the bracelet.

FIG. 13A (perspective view) and 13B (top plan view) illustrates an RFID device, such as a payment object 1300, in the form of a bracelet (or wristband). A transponder chip module (TCM) 1310 having a module antenna may be inserted into a recess in an outer surface of the wristband. A cover plate may cover the recess, with the transponder chip module inside.

An L-shaped slit (S) 1330 is shown extending generally axially from an outer edge of the wristband, to within the recess for the transponder chip module TCM, then continuing in a circumferential direction across the area/recess for the transponder chip module TCM, so that the wristband may function as a coupling frame 1320. The radial portion of the slit S may be very narrow, and the circumferential portion of the slit S may be wider. An L-shaped slit may extend across (overlap) one side of the module antenna, and in "no-man's land" may extend to an adjacent side of the module antenna. An additional slit (not shown) may be disposed on side edge of the wrist band opposite to the radial portion of the slit, for aesthetic purposes (to provide some symmetry).

The module antenna MA (not shown, see FIG. 14) may be elongated in the circumferential direction, and aligned (such as parallel) with the circumferential portion of the slit.

The cover plate may be primarily ornamental, and may be non-metallic. Alternatively, the cover plate may be metallic, but segments to have several conductive areas which are isolated from one another.

The transponder chip module may be mounted in a recess which is on the inner surface of the wristband, rather than on the outer surface of the wristband (mounted from behind, rather than from in front), and could alternatively be inserted into a recess from a side edge of the wristband.

The two ends of the wristband (bracelet) are shown as being not connected with one another. Alternatively, they may be connected with one another. A wristband may comprise a plurality of links, which may be in electrical contact with one another.

TCM with Overlap Control

The antenna of the TCM may be formed by laser or chemical etching of one or more metal foils on a dielectric substrate such as glass epoxy or polyimide, for example. One or both sides of the TCM antenna substrate may feature a coupling frame with a slit and/or cavity designed to maximise coupling between the coupling frame CF and the module antenna MA. A coupling frame may be used in similar manner from a separate substrate to the antenna. When implanted into a payment object such as a metal bracelet, one or more of the coupling frames thus mentioned may themselves capacitively couple to the payment object provided a suitable slit and/or cavity is located in the payment object. In addition, the coupling frame on the antenna or other substrate may be directly electrically connected across the slit on the payment object. The coupling frame in the TCM may be connected with the coupling frame of the payment object, or there may dielectric material between the two coupling frames.

An advantage of having a coupling frame in the TCM itself is that tolerances may be better controlled, particularly with regard to the spacing between the module antenna and the coupling frame of the TCM. Overlap of the coupling frame in the TCM and the module antenna MA may be precisely controlled. Compare FIG. 2D.

FIG. 14 (A,B) shows a transponder chip module (TCM) 1410 having a module antenna (MA) 1412 which may be disposed on one side (such as the front side) of a module tape (MT) 1411 and which may be elongated along an axis corresponding to the circumference of a bracelet-type payment object. A coupling frame (CF) 1420 may be formed on the opposite side (such as the rear side) of the module tape MT. The slit (S) 1430 in the coupling frame may be aligned (such as parallel) with the circumferential portion of a (L-shaped) slit in the wristband of a bracelet-type payment object (for example).

FIG. 15 is an exploded view of a cuff or bracelet formed from two interlocking and concentric folded metal sheets—an inner cuff portion (or ring) and an outer cuff portion (or ring). The inner cuff has a slit (S1) 1530A and may function as a coupling frame (CF-1) 1520A. The outer cuff has a slit (S2) and may function as a coupling frame (CF-2) 1520B. Each of the inner and outer cuffs performs as an individual coupling frame by having a slit S1 and S2, respectively. If the slits S1 and S2 are aligned with each other, the outer and inner bracelet portions (cuffs) may be in contact with one another. If the slits are not aligned with each other (as illustrated, the slits are on opposite sides of the bracelet), the inner and outer bracelets may be insulated from one another. Each metal sheet is shown with a recess, the transponder chip module may be accommodated in either or both recesses or may be placed on the inner or outer surface of the assembled bracelet. By placing within the bracelet between the two metal layers shown the layer can be laser welded or glued together to yield mechanical strength. Additionally, the slits of each metal layer may be geometrically offset such that they do not overlap or only partially overlap. This feature also increases mechanical strength and aids in concealment of the slit.

In FIG. 15, the cuff or bracelet is modified with a slit (or slits in each of the individual metal layers or rings/portions of the cuff) to act as a coupling frame for a transponder chip module. In these embodiments, it may be noted that there is not a module opening in the coupling frame which corresponds to the size of the module antenna of the transponder chip module. (Contrast figures which show a module opening MO.) The slit(s) in the coupling frame(s), however, should overlap the antenna, regardless of whether there is an opening. In other words, the slit should extend at least from an area outside of the antenna to an area within the antenna. The slit may extend substantially all the way across the antenna (from an area outside the antenna to an area on the opposite side of the antenna).

Charm Bracelets and Charms as Payment Objects

A charm bracelet may be made into a payment object by housing the transponder chip module TCM inside one or more charms that are looped or threaded onto a charm bracelet. A charm may be turned into a payment object by placing a suitably designed transponder chip module TCM inside the charm. In the case of a metal charm, the charm itself may be used a coupling frame by placing a slit, or other electrical discontinuity in the charm. More than one charm may be electrically linked by springs, or via movable connections to a metal charm bracelet, in order to increase the capacitive coupling efficiency with the reader antenna.

The charm bracelet may function as a coupling frame if the bracelet has a slit extending along part or all of its circumference. Alternatively, a solid or tubular bracelet or clasp may feature a slit or other electrical discontinuity, as previously described for bracelets, in order for it to act as a coupling frame.

Some Embodiments

An aspect of this invention is the creation of an RFID-enabled payment objects. The concepts discussed herein may be applicable to various wearables and jewelry, including for example charms, bracelets, pendants, cufflinks, watches, watchband clasps, and also to other metal-based payment objects. A component of the payment object entirely or largely made of metal or bear a metal core or metal plated surface finish. Such use of metal in the design of a payment object would normally prevent the functioning of RF communication with a transponder located in or on the payment object due to induced eddy currents in the metal. The metal in the payment object has a slit, to performs as a coupling frame and enhance, rather than inhibit, contactless communication between the payment object and another RFID device (such as a contactless reader).

FIG. 16 illustrates an RFID device, such as a payment object, comprising a metal charm designed to operate as a coupling frame in conjunction with a transponder chip module. Notice that a metal component of the charm has a T-shaped slit (S) 1630 to function as a coupling frame (CF) 1620. A transponder chip module (TCM) may be disposed in a recess in the metal component (CF) 1620. The T-shaped slit may extend across (overlap) one side of the module antenna, and in "no-man's land" may extend to adjacent sides of the module antenna.

The charm may take any shape and may comprise of several layers of metal that are laminated or welded together. In this case, each metal layer of the charm's structure may feature a slit that enable each layer to perform as a coupling frame. In this fashion the transponder chip module with integrated coupling frame couples to a plurality of coupling frames in the charm. The use of laminated or welded coupling frames is equally applicable to bracelets which may be formed from several layers of sheet metal welded together.

FIG. 17 illustrates an RFID device which may be a payment object 1700, comprising a metal charm with a slit (S) 1730 which may function a coupling frame 1720, and a slot to accept a transponder chip module (TCM) 1710 in mini SIM format. The transponder chip module (TCM) may have its own integrated coupling frame (CF) and slit (S). compare FIGS. 2C, 2D.

A metal jewelry item featuring a slit and functioning as a coupling frame may be 3D printed from a variety of metal alloys or metals. The slit in the jewelry item may remain visible, or it may be concealed by filling it with a fill material. This fill material may be electrically insulating (non-conductive) and may be deposited by 3D printing during printing (e.g.) of the jewelry item. For example, a resin, ceramic or other material may be co-deposited or cured at the same time as each layer of the 3D printed structure is developed. In this manner the material filling the slit may become an integrated element of the jewelry item. This concept may also be extended to metal smart cards featuring a slit and/or cavity for accepting a suitably designed transponder chip module. A 3D printed metal card may have internal structures including cavities, voids, slits and slots that are not possible to manufacture by conventional metal crafting techniques such as wax molding and milling. These internal structures may be used to improve the design of the metal smart card including aspects such mechanical strength and RF communication performance.

The charm may be in the shape of a locket or token featuring a slot that accepts the insertion of a SIM-like transponder chip module having a form factor similar to a SIM, or micro-SIM, or nano-SIM. The charm may have two or more internal pins or other electrical terminals that connect to the body of the transponder chip module insert or to connection pads mounted on the transponder chip module. The connection pads (or terminals) on the transponder chip module may be connected to the antenna or to the integrated coupling frame within transponder chip module. The connection to the charm enables linking of the integrated coupling frame of the transponder chip module with the charm. The integrated coupling frame of the transponder chip module may be linked at two points across the slit to corresponding positions across the slit on the charm. In addition, the slit of the integrated coupling frame of the transponder chip module may not necessarily overlap the slit in the charm (also a coupling frame). A similar principle may be applied to any payment object where a transponder chip module insert is used. Alternatively, the integrated coupling frame of the transponder chip module may be electrically isolated but capacitive couple to a suitably located coupling frame fashioned from the body of the charm (shown below).

Moveable Coupling Frames

FIG. 18A is an exploded view of a coupling frame (CF) 1832 disposed over a transponder chip module (TCM) 1810, oriented so that the slit (S) 1830 overlaps the turns of the module antenna (MA) 1812 on one side.

FIG. 18B is a plan view of the coupling frame (CF) 1820 disposed over the transponder chip module (TCM) 1810, with the coupling frame oriented (aligned) oriented so that the slit (S) 1830 overlaps the turns of the module antenna (MA) 1812 on one side thereof to enhance (allow) communication between the transponder chip module (TCM) 1810 and an external contactless reader (not shown).

FIG. 18C is a plan view of the coupling frame (CF) 1820 disposed over the transponder chip module (TCM) 1810, with the coupling frame oriented (displaced) so that the slit (S) 1830 does NOT overlap the turns of the module antenna (MA) 1812 to attenuate (block, suppress) communication between the transponder chip module (TCM) 1810 and an external contactless reader (not shown).

The coupling frame (CF) 1820 comprises a generally planar, electrically-conductive element having a slit (S) 1830 extending from an outer edge (periphery) thereof to a location within an inner area of the coupling frame, and may be oriented so that the slit overlaps the module antenna (MA) 1812 of a transponder chip module (TCM) 1810.

The transponder chip module TCM has an RFID chip (IC) 1808 disposed on a substrate which is a module tape (MT) 1811. The module antenna (MA) 1812 may also be disposed on the module tape (MT), on the same side as or on the opposite side from the RFID chip (IC) 1808. The module antenna may generally be in the form of a rectangular spiral having a number (such as 10-15) traces separated by spaces disposed in a track extending around a peripheral area (all four sides) of the module tape. The antenna traces would comprise an inner trace, an outer trace, and several traces therebetween. An inner (central) area of the module tape may be free of antenna traces.

FIG. 18B shows the coupling frame (CF) aligned over the transponder chip module (TCM so that the slit (S) extends over (traverses, overlaps) a set of traces of the module antenna (MA) on one of the four sides of the module tape, from beyond an outermost one of the traces, past an innermost one of the traces, to the central area (no-mans land). With the coupling frame (CF) in this position, the communication (and power) link between the external contactless reader and the RFID chip may be enhanced, or enabled.

FIG. 18C shows the coupling frame (CF) aligned over the transponder chip module so that the slit (S) does not extend over (traverse, overlap) any of the traces of the module antenna (MA). With the coupling frame (CF) in this position, the communication (and power) link between the external contactless reader and the RFID chip may be deteriorated, or blocked or disabled.

The arrow in FIG. 18C indicates that the coupling frame (CF) may be displaced (slid, toggled, moved) from the enhanced/enabled position (FIG. 18B) to the suppressed/disabled position (FIG. 18C) by sliding the coupling frame with respect to the transponder chip module (TCM), or vice-versa.

The coupling frame (CF) and transponder chip module (TCM) may each be disposed in a separate component of a payment object. One of the components of the payment object may be modified to function as a coupling frame.

FIGS. 18B and 18C are exemplary of the ability of a user to selectively enhance or suppress (including enable or disable) communication between the transponder chip module and the external reader, such as by sliding the coupling frame (or a component of a payment object carrying or functioning as the coupling frame) with respect to the transponder chip module (or a component of the payment object carrying the transponder chip module).

Visual indications may be provided to the user to indicate whether the payment device is enabled or disabled. For example, with reference to FIGS. 18B and 18C, in the enabled position (18B) the transponder chip module may (TCM) be visible to the user through the slit, and may be colored green (for example). In the disabled position (18C), the transponder chip module (TCM) is not visible through the slit the user may see another color such as red.

Colors, or other visual indicia may be incorporated into a payment object, and revealed at different positions of a moveable coupling frame (for example) to indicate whether the coupling frame is positioned to enable communication with an external reader, or is positioned to disable communication with the external reader.

Figure 18E:
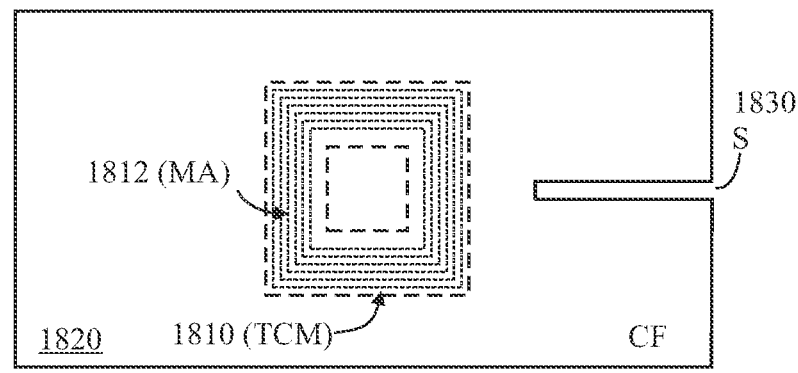

FIGS. 18D,E illustrate another example of displacing the coupling frame (CF) 1820 with respect to the transponder chip module (TCM) 1810 to selectively enable/disable communication between the RFID device (payment object) and an external contactless reader (or other RFID device). In this variation, the coupling frame (or component of a payment object carrying or functioning as the coupling frame) may be in a first position (FIG. 18D) with the slit traversing the traces of the module antenna MA to enable communication, and may be flipped (or toggled) over to a second position (FIG. 18E) so that the slit (S) 1830 of the coupling frame does not traverse the traces of the module antenna, to disable (inhibit) communication. Alternatively, the payment object component comprising the coupling frame may be stationary, and the transponder chip module may be carried by a component that flips over and positions the transponder chip module with its antenna selectively over or not over the slit in the coupling frame to respectively enable or disable communications.

An Elongated Form Factor

FIG. 19 shows a coupling frame (CF) 1920 superposed over a module antenna (MA) 1912 of a transponder chip module (TCM) 1910. The overlap of the slit (S) 1930 of the coupling frame with at least a portion of the module antenna is very clearly illustrated and demonstrated in this figure.

In this example, the module antenna MA may have an elongated form factor (much longer than it is high), having an overall height of approximately 5 mm and an overall length of approximately 20 mm. An overall area covered by the antenna (including no-man's land) may be 5 mm×20 mm=100 mm2. The RFID chip (IC) is omitted from the view, for illustrative clarity. Compare FIG. 14.

The interior area (no-man's land) of the module antenna MA may be elongated—i.e. narrow (5-8 mm) and long (20-25 mm). The slit (S) of the coupling frame (CF) is shown extending over one set of traces (for example, 10-16 traces) of the module antenna (on the left side thereof, as viewed), and into the no-man's land, covering substantially the entire area of the no-man's land. The slit (S) may be wide enough to also cover some inner traces on the top and bottom (as viewed) of the module antenna (MA). In other words, in the central area of the module antenna, the slit may be slightly larger than the non-man's land. The slit in the coupling frame may extend completely over the traces on one side (left, as viewed) of the module antenna, then continue into and across the non-man's land, and may overlap the innermost trace of each of the sets of traces on the other three sides (top, bottom and right, as viewed) of the module antenna. The slit (S) may extend along the center of the module antenna, extending from one edge of the module antenna (bottom) to an inner track on the opposite side (top). The module antenna may have 10 to 16 laser-etched conductive lines.

The coupling frame CF may be larger than the module antenna MA, for example having a length of at least approximately 30 mm and a height of at least approximately 20 mm. An overall area covered by the coupling frame may be 30 mm×20 mm=600 mm2. The coupling frame may be at least twice as large (in overall area) as the module antenna, including at least three times as large, at least five times as large, and at least ten times as large as the module antenna.

s illustrated, the slit S of the coupling frame extends across the first set of antenna traces on the left (as viewed) side of the module antenna, continuing through the central area (no-mans land) of the module antenna which has no traces to the set of traces on the opposite, right (as viewed) side of the module antenna. The end of the slit may overlap one or more of the innermost traces of the set of traces on the right side of the module antenna.

The slit (S) may have a width corresponding to the vertical (as viewed in the figure) interior width of the antenna (the height of non-man's land), or the distance between the innermost trace of the top (as viewed) set of traces and the innermost trace of the bottom (as viewed) set of traces. In other words, the slit may cover at least a substantial portion of the entire central area of the antenna, including at least 50%, at least 60%, at least 90%, and at least 100% (the slit may be larger than the no-man's land) thereof. The slit may extend (to the right) past the central area devoid of traces (no man's land) further across some or all of the traces on the right side of the antenna.

For optimum performance, the slit (S) in the coupling frame may need to overlap or run adjacent to the inner traces of the module antenna (MA). In this case the slit (S) would traverse over one set of traces of the module antenna (MA) and run parallel to two sides of the module antenna (MA). This can be accomplished by widening the slit or by narrowing the height of the void central area of the antenna. FIG. 19 shows the slit running along or adjacent the inner tracks of the module antenna.

FIG. 20 shows a tubular coupling frame (CF) 2020 having a slit (S) extending partially along its length. The slit (S) 2030 extends into the coupling frame from one end (left, as viewed) thereof, and may be considered to comprise an upper slit (S1) 2030A and a lower slit (S2) 2030B. A transponder chip module (TCM) 2010 may be inserted into the coupling frame, as shown, between the slits S1 and S2) and positioned so that the slits traverse/overlap the module antenna (MA) 2012 to enhance/enable communication, or does not traverse the module antenna to suppress/inhibit communication. A tubular coupling frame may be a clasp or buckle of a payment object in the form of a wristband, or the like, and it may be curved (arcuate) rather than straight. (And a carrier for the TCM should be shaped accordingly to be able to be positioned within the curved tubular coupling frame. Although not shown, a slit may be provided on the bottom side of the tubular coupling frame, extending from the same end of the tubular coupling frame as the slit S which is shown, and may be at least as long as that slit. Compare FIGS. 26A,B.

FIGS. 21A,B show an example of a single coupling frame (CF) 2120 disposed over a single transponder chip module (TCM) 2110. These figures clearly show that the coupling frame (CF) may be much larger (in area) than the transponder chip module (TCM). And, in this example, the coupling frame is circular (disc-like). In this variation, the coupling frame (or component of a payment object carrying or functioning as the coupling frame) may be in a first position (FIG. 21A) with the slit (S) 2130 traversing (overlapping) the traces of the module antenna (MA) 2112 to enable communication, and may be rotated to a second position (FIG. 21B) so that the slit (S) does not traverse the traces of the module antenna to disable communication.

FIG. 22 is a perspective view (exploded) of a payment object comprising a rotational upper metal housing with a slit (S) 2230A to function as a coupling frame (CF) 2020A. This illustrates that a metal housing component of a payment object may function as a coupling frame if it is provided with a slit. A lower metal housing has recesses spaced 180° apart from one another for receiving two transponder chip modules (not shown). A slit (S1) 2230B extends from one recess to the outer edge of the lower metal housing. A slit (S2)

2230C extends from the other recess to the outer edge of the lower metal housing. The lower metal housing may also function as a coupling frame (CF) 2220B.

The upper housing may rotate with respect to the lower housing. When the slit (S) in the upper housing is aligned with one of the slits (S1 or S2) in the lower housing, the transponder chip module associated with that slit in the lower housing may be enabled, while the other transponder chip module is disabled, since its slit may be shorted out (assuming that the upper and lower housings are not electrically isolated from one another).

FIG. 23 shows a payment object having plastic components (or housings) that may rotate with respect to one another. An upper plastic component is associated with (carries) a first metal plate with a slit (S) 2330A functioning as a coupling frame (CF) 2320A. A lower plastic component accepts two transponder chip modules (TCM-1) 2310A and (TCM-2) 2310B, and is associated with (carries) a second metal plate having two slits (S1 and S2) 2330B and 2330C corresponding to the transponder chip modules to function as a coupling frame (CF) 2320B. The transponder chip modules may selectively be enabled in the manner discussed with respect to FIG. 22.

FIG. 24 shows a similar arrangement as FIG. 23, but in this embodiment the two transponder chip modules (TCMs) 2410A and 2410B may have the form factor of SIM cards (compare FIG. 17), and may be insertable into the lower plastic housing. A first metal plate with a slit 2430A may function as a coupling frame (CF) 2420A. A second metal plate with two slits—a first slit (S1) 2430B and a second slit (S2) 2430C—may function as a coupling frame (CF) 2420B. One or both of the coupling frames may be rotated for payment selection (selectively enabling one or the other of the two transponder chip modules).

FIGS. 25A,B show an example of a single coupling frame (CF) 2520 having a slit (S) 2530 disposed over two transponder chip modules (TCM-1 and TCM-2) 2510A and 2510B. In this example, the coupling frame (CF) is circular (disc-like), similar to what was shown in FIGS. 21-24. In this example, the transponder chip modules TCM-1 and TCM-2 may be disposed in a circular (disc-like) carrier (component of a payment object) 180° apart from one another. The concept disclosed herein may be extended to more than two transponder chip module disposed at different positions within a component of the payment object.

In this variation, the coupling frame (or component of a payment object carrying or functioning as the coupling frame) may be in a first position (FIG. 25A) with the slit (S) 2530 of the coupling frame (CF) 2520 traversing a portion of the module antenna (MA-1) 2512A of the first transponder chip module TCM-1 to enable communication between the first transponder chip module (TCM-1) 2510A and an external reader, and in this position the slit (S) 2530 does not traverse the traces of the module antenna (MA-2) 2512B of the second transponder chip module (TCM-2) 2510B so as to inhibit (disable) communication between the second transponder chip module TCM-2 and the external reader.

The coupling frame CF may be rotated to a second position (FIG. 25B) so that the slit S of the coupling frame CF traverses a portion of the module antenna MA-2 of the second transponder chip module TCM-2 to enable communication between the second transponder chip module TCM-2 and an external reader, and in this position the slit S does not traverse the module antenna MA-1 of the first transponder chip module TCM-1 so as to inhibit (disable, suppress) communication between the first transponder chip module TCM-1 and the external reader.

FIG. 25C shows a payment object having two transponder chip modules 2510A and 2510B disposed in recesses or cavities in a lower component (or housing) of a payment object, and an upper component (or housing) of the payment object formed as a coupling frame. The two housings are round (disc-like) and the upper housing is able to rotate with respect to the lower housing, about a common axis. The upper housing has a slit (S) 2530 to function as a coupling frame (CF) 2520). The lower housing may also have slits, as shown, to that the lower housing (if made of metal) can also function as a coupling frame. The upper housing may be rotated to selectively enable communication with one or the other (or neither) of the transponder chip modules in the lower housing. Compare FIGS. 25A,B. If the cavities for the transponder chip modules extend to the edge of the lower housing, it would be possible to insert transponder chip modules in the manner of inserting SIM cards into a smartphone or tablet. Compare FIGS. 17 and 24.

Movable Coupling Frames (and Switching)

FIG. 3B illustrates a payment object which is a smart card having a single coupling frame (CF) and means (a switch) for shorting out the coupling frame. FIG. 21 illustrates that a coupling frame (CF) may be moved (such as rotated) to position the slit (S) either overlapping or not overlapping the module antenna (MA) to selectively enable/disable contactless communication with the transponder chip module. FIGS. 25A,B illustrate that one coupling frame may be associated with two (or more) transponder chip modules and may be moved (such as rotated) to selectively enable one or the other of the two transponder chip modules, or disable both of them.

In some of the descriptions that follow, such as FIGS. 22-24, two coupling frames (CF-1, CF-2) may be associated with a two transponder chip modules (TCM-1, TCM-2). Each transponder chip module may have its own module antenna (MA-1, MA-2). Each transponder chip module may have its own an RFID chip with payment function such as for transit or credit card payment. Each transponder chip module may be associated with a respective slit (S1, S2) of a coupling frame. Alternatively, each transponder chip module may have its own coupling frame. The transponder chip modules themselves may be housed in a component of a payment object. The two coupling frames may be metallic components, such as housings, of a payment object, or may be plastic (non-metallic, non-conductive) housings carrying conductive metal plates with slits to function as coupling frames.

An exemplary payment object (device) may comprise an upper housing for the coupling frame and a lower housing for the transponders. The transponders within the lower housing of the device may be seated in a metal frame, with a slit aligned to each coupling frame. The transponders and frame could be encased in a non-metal covering to conceal the slits and give a robust housing to the device. The upper housing could be solid metal, or could have a concealed coupling frame that rotates over the transponders and enables one at a time. The performance of a given transponder may be maximized (enabled) selectively, only when the coupling frame is in close proximity to a given transponder with the slit properly oriented with respect to (overlapping) the module antenna.

The two coupling frames (CF-1, CF-2) may disposed or stacked one atop the other, in electrical contact with one another, and one or the other of the coupling frames may be moved (such as rotated, slid, or toggled) to selectively enable one or the other of the two transponder chip modules, or disable both of them. When the slits (S1, S2) of the two coupling frames are aligned with each other, a given one of the transponder chip modules may be enabled. In other orientations, the slits are misaligned and the body of one coupling frame extends over and shorts out the slit of the other coupling frame (and vice-versa), thereby rendering both coupling frames and transponder chip modules inoperable. In this regard, one of the coupling frames may act as a switch for the other of the coupling frames.

Two or more distinct transponder chip modules with integrated coupling frames can be incorporated into a single payment object. Various mechanisms may be used to short out the coupling frames of all but a desired one of the transponder chip modules so that only the selected one is operative. Two or more transponder chip modules may share a common coupling frame. The format of the payment object may be, for example, a bangle, a bracelet, a cuff, a charm, etc. Various ways of moving (sliding, rotating, etc.) one component of the payment object to selectively enable or disable communication with a single transponder chip module, or with one of a plurality of transponder chip modules in the payment object have been disclosed, and others may be implemented.

Generally, any kind of "switch" capable of shorting out the slit in the coupling frame may be used to selectively enable/disable communication with the transponder chip module. This may include a metal plate or contact, or a second coupling frame. When the slit of a coupling frame is shorted out, it becomes ineffective and may block rather than enhance contactless communication with the RFID chip (and module antenna) of the transponder chip module, and consequently the entire RFID device. This provides a simple "on/off" functionality for a transponder chip module in a payment object that can be selected by the user.

A rotatable housing serving as a coupling frame with a slit could be a piece of jewelry on a strap, a watch or a fitness tracker. The housing may be made of metal or any material which blocks the transmission of an electromagnetic field. The bearer of such a wearable device can insert two or more transponder chip modules with digital payment applications such as transit, debit or credit card functionality. By rotating the housing and positioning the slit in the housing over or overlapping the antenna tracks on a given one of the transponder chip modules, the RFID payment function for the given transponder chip module may be enabled, and the payment function for the other chip module may be disabled. By rotating the slit away from either transponder chip module, the payment function of both transponder chip modules may be disabled.

A similar principle may be applied to a sliding or pivoting, rather than rotating housing or portion of a payment object so that the user can selectively enable one of two or more transponder chip modules disposed in the payment object. Alternatively, rather than rotating a housing serving as a coupling frame, a carrier for the transponder chip modules may be moved (rotated otherwise repositioned) so that one or the other of two (or more) transponder chip modules is located and oriented (juxtaposed) appropriately with the coupling frame (or component modified to function as a coupling frame) so that the given transponder chip module is enabled (and the other(s) are disabled).

The carrier for the transponders and the housing serving as the coupling frame may both be circular (disc-like), and concentric with one another. As shown for example in FIGS. 25A,B. two or more transponders may be disposed in a carrier or lower circular (disc-like) housing, such as TWO transponders arranged at 180° from one another,
THREE transponders arranged at 120° from one another,
FOUR transponders arranged at 90° from one another,
FIVE transponders arranged at 72° from one another,
SIX transponders arranged at 60° from one another, This provides a user with the ability to turn off multiple transponders in a single payment object, and to selectively enable a given one of the transponders (while the others are disabled).

A first metal plate (or disc) may be disposed in the device, and may have two slits disposed 180° apart from one another. The two transponder chip modules and the metal plate may both be disposed at fixed positions within the device. Each of the slits in the metal plate may be oriented (positioned, aligned) so that they overlap one or the other of the two transponder chip modules (i.e., the module antennas thereof), respectively. The first metal plate functions as a coupling frame.

A second metal plate (or disc) with one slit is in electrical contact with and is movable—that is, free to rotate (be angularly repositioned) over the first fixed metal plate so that the slit in the second metal plate can be aligned with one of or neither of the two slits in the first fixed metal plate. The second movable metal plate may be physically linked to the top housing of the payment device and rotate with this housing. The second metal plate functions as a coupling frame.

By rotating the top housing of the device together with the second movable metal plate, the single slit in the movable coupling frame may selectively be aligned with either one of (but not both of) the slits in the fixed coupling frame, thereby enabling one but not the other transponder to operate (be enabled or activated). Rotating the upper housing such that the slit in the movable second coupling frame does not overlap either of the slits in the fixed first coupling frame results in both transponders being disabled (deactivated).

In this manner, the upper housing of the payment object (or device), which carries the second coupling frame, can act as a switch for selectively enabling one or the other of the transponder chip modules contained within the lower housing of a payment device. In this example, the second coupling frame acts as a means for shorting the slit in the first coupling frame. When the slit of the coupling frame carried in the upper housing overlaps (is aligned with) a given slit in the coupling frame carried in the lower housing, one of the TCMs can be selectively activated. When a portion of the coupling frame carried in the upper housing other than the slit thereof overlaps (shorts) a give slit in the coupling frame carried in the lower housing (the slits are not aligned with one another, or are "misaligned"), the transponder chip module associated with that slit may be disabled.

The transponder chip modules (TCMs) may be readily removable and replaceable, and may have a form factor comparable to that of a mini SIM (see FIG. 17) or a micro SIM or a micro SD card. In this manner, different transponder chip modules can be inserted into the payment device, and a given transponder chip module can be inserted into different payment devices.

Some Implementations

The figures that follow illustrate some implementations of some of the techniques described herein, and some variations thereof, in the context of some RFID devices which are payment objects and, more, particularly wearable devices.

FIGS. 26A,B illustrate that a payment object, such as a wristband, such as for a fashion bracelet or a wristwatch, may comprise a flexible strap and a metal clasp or buckle.

The metal clasp or buckle may be in the form of a tubular metal frame, and may be provided with a slit (S) to function as a coupling frame (CF). Compare FIG. 20. A transponder chip module (not shown) comprising an RFID chip and a module antenna may be disposed within the metal clasp, and situated so that the slit of the coupling frame overlaps the antenna of the transponder chip module. In this manner, the clasp may function as an RFID device which is a payment object.

This illustrates the assembly of a fashion bracelet featuring a leather or rubber strap fed through a tubular metal frame that functions as a coupling frame. The metal frame features a slit (S) that allows the tubular frame to function as a coupling frame. The buckle may be a tubular coupling frame capable of housing a transponder chip module, with the slit in the coupling frame overlapping the antenna of the transponder chip module. The buckle may be a tubular coupling frame (CF). Compare FIG. 20. See also FIG. 28.

Some Additional Disclosure Relating to Payment Objects

Some embodiments described herein relate to payment objects which are jewelry items. Some additional payment objects will now be shown, and briefly discussed.

FIG. 27 illustrates a watch with payment function. The watch features a timepiece movement of reduced size relative the watch case. The remainder of the watch case area is composed of a coupling frame that couples with a TCM inserted into or embedded in the watch. The coupling frame resides outside the area of the movement of the watch. The bezel of the watch or part of the watch case may be made of metal and feature a slit, this may rotate with respect to the coupling frame and act as a switch for the contactless communication function.

FIG. 28 illustrates a design which enables a watch or other wristband strap to function as a payment object. This figure shows a metal buckle with a slit (S) 2830 functioning as a coupling frame (CF) 2820 and receiving a transponder chip module (TCM) 2810. The transponder chip module may have an elongated form factor, see FIG. 19. The transponder in this case is housed within the buckle end of the strap. The housing for the transponder is made from metal and features a slit to enable coupling of the housing to the transponder. This implementation enables the user of the device to have the transponder on the lower side (palm side) of their wrist. When making a payment through a typical point of sale (POS) terminal, the user would wave their wrist over the reader to facilitate a transaction, this being an easier process than bringing the primary (top, front, obverse) face of the jewelry piece or watch in proximity with the terminal. As such, the user avoids having to invert their wrist/arm when making a contactless transaction. The buckle may be a tubular coupling frame (CF). Compare FIG. 20. Compare also FIG. 29.

FIG. 29 illustrates a design which is a payment accessory that can fit over a typical watch or other armband strap. The payment accessory is primarily made of metal and features a slit (S) 2930 to function as a coupling frame (CF) 2920. Either a fixed or replaceable transponder chip module (not shown) may be incorporated into the accessory. The payment accessory can be made to fit a variety of strap widths and girths and is not limited to a particular brand or style of strap. This payment accessory may be added to watches, fashion armbands and fitness trackers without the need to redesign or interfere with the original function of the device. The payment accessory may feature a mechanism such as screws or a spring loaded lock to fix the accessory to a given strap. Alternatively the openings in the accessory for through-feeding of the strap may be shaped and/or textured to provide a natural grip for the strap and prevent slipping of the accessory during use.

FIG. 30 illustrates a design which is a ring accessory. A metal frame with a slit (S) 3020 is provided to function as a coupling frame (CF) 3020. The coupling frame (CF) may be provided with a recess to receive a transponder chip module (TCM) 3010. The transponder chip module may be covered by a cover ("cover") which may also have a slit to function as a coupling frame. The slits in the coupling frame 3020 and cover may overlap the module antenna (MA) of the transponder chip module (TCM) 3010. A jewel or other decorative piece may be mounted on top of the cover/coupling frame and transponder chip module to conceal the transponder chip module and slit and to render the ring device aesthetically pleasing.

FIG. 31 illustrates a design which features a watch with switchable payment function. The watch features a timepiece movement of reduced size relative the watch case. The remainder of the watch case area comprises a coupling frame (CF) 3120 having a slit (S) 3130 that couples with a transponder chip module (TCM) 3110 inserted into or embedded in the watch. A rotating or toggle switch 3140 may be incorporated in the watch, and may have a slit which may be electively aligned with the slit 3130 to enhance contactless communication, or not aligned with the slit 3130 to short out the slit 3130 and suppress (including disable) contactless communication with the transponder chip module. Compare FIGS. 22A,B regarding overlapping coupling with slits either aligned or misaligned.

Some Additional Comments

To date the designs have focused on TCMs that couple to a coupling frame. It is also conceivable that a contact module interlocks (connects) with an antenna embedded in the device. The antenna may be connected to terminals of a component of the payment object that interlock with terminals on the inserted transponder chip module. A bezel or switch may enable individual transponders in the case of multiple transponders being housed in one device. This concept may be applied to activity trackers as well.

Counter-Windings

FIG. 32 shows a transponder chip module (TCM) having a module antenna (MA). The traces or windings of the module antenna may be wound or formed in a particular direction, or sense. When viewed in elevation the planar traces or windings may be formed in a clockwise or anti-clockwise (counter-clockwise) direction. Traces or windings wound or formed in a particular direction, or sense, composing the majority of the turns of the antenna may be referred to as principal windings (PWs). One or more antenna windings may be formed in an opposite direction, or sense, to the principal windings (PWs) of the antenna. A winding of this type may be referred to as a counter winding (CWG). For example, there may be 8-12 principal windings and 1-3 counter windings. The counter windings may be connected in series with the principal windings. The counter windings may be located between the principal windings. The track width of the counter windings) may be different than the track width of the principal windings, such as wider than the principal windings. The counter windings may have a different sense (laying direction) than the principal windings. The length and width of the counter windings may be controlled to determine resistance, capacitance effects and RF characteristics of the module antenna. The implementation of one or more counter windings (CWGs) in a transponder chip module (TCM) allows control of the resonance frequency of the module antenna (MA), in particular increasing the resonance frequency.

While the invention(s) has/have been described with respect to a limited number of embodiments, these should not be construed as limitations on the scope of the invention (s), but rather as examples of some of the embodiments. Those skilled in the art may envision other possible variations, modifications, and implementations that are also within the scope of the invention(s), and claims, based on the disclosure(s) set forth herein

The invention claimed is:

1. A metal smartcard configured to receive energy from a contactless reader, the metal smartcard comprising:
    a metal body having a first face and a second face opposite the first face, wherein the metal body includes a slit extending to an outer edge of the metal body;
    at least one recess in at least one of the first face or the second face of the metal body; and
    at least one filling portion located at least partially in the at least one recess, wherein the filling portion comprises a substantially non-conductive material.

2. The metal smartcard of claim 1, wherein:
    the at least one recess comprises a first recess and a second recess;
    the at least one filling portion comprises a first filling portion and a second filling portion;
    the first filling portion is located at least partially in the first recess; and
    the second filling portion is located at least partially in the second recess.

3. The metal smartcard of claim 1, wherein the slit extends along a lower surface of the recess.

4. The metal smartcard of claim 1, wherein the metal card body comprises at least one of stainless steel, titanium, aluminum, tungsten or an aluminum alloy.

5. The metal smartcard of claim 1, wherein the at least one filling portion comprises a ceramic material.

6. The metal smartcard of claim 5, wherein the at least one filling portion comprises a pre-molded insert.

7. The metal smartcard of claim 1, wherein at least a portion of the at least one filling portion is identifiable by a user viewing the metal smartcard.

8. The metal smartcard of claim 1, wherein the at least one filling portion conceals the slit from a user viewing the metal smartcard.

9. The metal smartcard of claim 1, wherein the at least one filling portion is included in a lamination.

10. The metal smartcard of claim 1, wherein the at least one filling portion is included in an implantation.

11. The metal smartcard of claim 1, wherein the at least one filling portion is glued to the metal card body.

12. The metal smartcard of claim 1, further comprising a transponder chip module including a module antenna and a plurality of contact pads on an outer surface of the metal smartcard, wherein the metal card body further includes a module opening, and wherein the module opening accepts the transponder chip module such that at least a portion of the transponder chip module is positioned in the module opening.

13. The metal smartcard of claim 12, wherein at least a portion of the slit overlaps at least a portion of the module antenna.

14. The metal smartcard of claim 12, wherein the at least one filling portion at least partially surrounds the transponder chip module.

15. The metal smartcard of claim 14, wherein the at least one filling portion has a dielectric constant greater than the dielectric constant of air, such that the at least one filling portion is substantially non-conductive.

16. The metal smartcard of claim 1, wherein the at least one recess extends over at least 50% of the surface area of one of the at least one of the faces of the metal card body.

17. A smartcard comprising:
    a metal card body including a front face, a rear face, a through hole extending from the front face to the rear face;
    a transponder chip module, wherein at least a portion of the transponder chip module is positioned within a region of the through hole proximate the front face of the metal card body, and wherein no portion of the transponder chip module is positioned within a lower region of the through hole proximate the rear face of the metal card body; and
    a substantially non-conductive insert, wherein at least a portion of the substantially non-conductive insert is positioned within the lower region of the through hole.

18. The smartcard of claim 17, wherein the substantially non-conductive insert bears printed information visible at an exterior of the smartcard.

19. The smartcard of claim 17, wherein the substantially non-conductive insert is reinforced by an additional insert.

20. The smartcard of claim 19, wherein the metal card body includes a slit, and wherein the reinforcing insert is disposed across the slit.

\* \* \* \* \*